(12) United States Patent
Bertilsson et al.

(10) Patent No.: US 10,650,177 B2
(45) Date of Patent: May 12, 2020

(54) SYSTEM AND METHOD FOR CREATING APPLICATION INTERFACES FOR MULTIPHYSICS MODELING

(71) Applicant: Comsol Ab, Stockhom (SE)

(72) Inventors: Daniel Bertilsson, Vallentuna (SE); Erik Danielsson, Vaellingby (SE); Eduardo Fontes, Vallentuna (SE); Lars Langemyr, Stockholm (SE); Victor Littmarck, Solna (SE); Svante Littmarck, Dedham, MA (US); Nils Malm, Lidongö (SE); Björn Sjödin, Lexington, MA (US); Daniel Smith, Cambridge, MA (US); Tomas Normark, Bromma (SE); Mikael Sterner, Enskededalen (SE); Sara Ehrlund, Eskilstuna (SE); Peter Österlund, Sköndal (SE); David Karlbom, Stockholm (SE)

(73) Assignee: COMSOL AB, Stockholm (SE)

( * ) Notice: Subject to any disclaimer, the term of this patent is extended or adjusted under 35 U.S.C. 154(b) by 127 days.

(21) Appl. No.: 16/026,859

(22) Filed: Jul. 3, 2018

(65) Prior Publication Data
US 2018/0314780 A1 Nov. 1, 2018

Related U.S. Application Data

(63) Continuation-in-part of application No. 14/652,747, filed as application No. PCT/US2013/077246 on Dec.
(Continued)

(51) Int. Cl.
*G06F 30/23* (2020.01)
*G06F 8/20* (2018.01)
*G06F 8/00* (2018.01)

(52) U.S. Cl.
CPC ............... *G06F 30/23* (2020.01); *G06F 8/00* (2013.01); *G06F 8/20* (2013.01)

(58) Field of Classification Search
USPC .................................................. 703/5, 22, 24
See application file for complete search history.

(56) References Cited

U.S. PATENT DOCUMENTS 5,654,903 A    8/1997    Reitman
6,108,670 A    8/2000    Weida
(Continued)

FOREIGN PATENT DOCUMENTS

CN           1537271 A        10/2004
JP             2002-245097      8/2002
(Continued)

OTHER PUBLICATIONS

International Search Report for International Application No. PCT/US2013/054436 dated Jan. 31, 2014, 3 pages.
(Continued)

*Primary Examiner* — Thai Q Phan
(74) *Attorney, Agent, or Firm* — Nixon Peabody LLP

(57) ABSTRACT

A system generates a customized application data structure for modeling physical systems. The system includes a processor, an input device, optionally a display device, and a memory device. The processor is adapted to embed a multiphysics model data structure in the application data structure. The multiphysics model data structure comprises a representation of models of physical systems. Geometry data representing geometry subroutines and call data representing geometry subroutine calls are added to the embedded multiphysics model data structure. Data representing application features are added to the application data structure. Each application feature comprises one or more of (i) first data representing a form feature, or (ii) second data
(Continued)

representing an action feature. A customized application data structure is generated providing a customized modeling of the physical systems using a modeling operation, a geometry of the one or more models of physical systems, an application feature, and a geometry subroutine. The customized application data structure is configured for distribution to end users as an application executed by an application runtime engine.

21 Claims, 66 Drawing Sheets

Related U.S. Application Data 20, 2013, now Pat. No. 10,019,544, which is a continuation-in-part of application No. PCT/US2013/054436, filed on Aug. 9, 2013, which is a continuation of application No. 13/835,091, filed on Mar. 15, 2013, now Pat. No. 9,098,106.

(60) Provisional application No. 62/653,292, filed on Apr. 5, 2018, provisional application No. 61/740,149, filed on Dec. 20, 2012.

(56) References Cited

U.S. PATENT DOCUMENTS

| | | | |
|---|---|---|---|
| 6,236,738 B1 | 5/2001 | Zhu | |
| 6,542,930 B1 | 4/2003 | Auvenshine | |
| 7,076,332 B2 | 7/2006 | Cifra | |
| 7,412,366 B1 | 8/2008 | Englehart | |
| 7,519,518 B2 | 4/2009 | Langemyr | |
| 7,571,129 B2 * | 8/2009 | Ebert | G06Q 10/04 345/440 |
| 7,596,474 B2 | 9/2009 | Langemyr | |
| 7,623,991 B1 | 11/2009 | Langemyr | |
| 7,685,596 B1 | 3/2010 | Webb | |
| 8,219,373 B2 | 7/2012 | Fontes | |
| 8,457,932 B2 | 6/2013 | Langemyr | |
| 8,626,475 B1 | 1/2014 | Fontes | |
| 8,838,974 B2 | 9/2014 | Webb | |
| 8,949,013 B2 | 2/2015 | Yang | |
| 8,954,302 B2 | 2/2015 | Langemyr | |
| 9,098,106 B2 | 8/2015 | Danielsson | |
| 9,146,652 B1 | 9/2015 | Danielsson | |
| 9,323,503 B1 | 4/2016 | Fontes | |
| 9,454,625 B2 * | 9/2016 | Danielsson | G06F 8/00 |
| 10,235,780 B2 * | 3/2019 | Noon | G06F 16/24568 |
| 2003/0105614 A1 | 6/2003 | Langemyr | |
| 2003/0172368 A1 | 9/2003 | Alumbaugh | |
| 2004/0034514 A1 | 2/2004 | Langemyr | |
| 2004/0153992 A1 | 8/2004 | Molina-Moreno | |
| 2006/0075382 A1 | 4/2006 | Shaburov | |
| 2007/0053513 A1 | 3/2007 | Hoflberg | |
| 2007/0219929 A1 | 9/2007 | Steinbach | |
| 2008/0313282 A1 | 12/2008 | Warila | |
| 2009/0044003 A1 | 2/2009 | Berthiaume | |
| 2009/0144042 A1 | 6/2009 | Lorenz | |
| 2011/0054869 A1 | 3/2011 | Li | |
| 2011/0107246 A1 | 5/2011 | Vik | |
| 2012/0036503 A1 | 2/2012 | Reeves | |
| 2012/0179426 A1 | 7/2012 | Fontes | |
| 2013/0007698 A1 | 1/2013 | Warila | |
| 2013/0066823 A1 | 3/2013 | Sweeney | |
| 2014/0019112 A1 | 1/2014 | Canedo | |
| 2014/0047407 A1 | 2/2014 | Danielsson | |
| 2015/0178422 A1 | 6/2015 | McKim | |
| 2015/0293749 A1 | 10/2015 | Danielsson | |

FOREIGN PATENT DOCUMENTS

| | | |
|---|---|---|
| JP | 2007-213258 | 8/2007 |
| WO | WO 2012/020252 A1 | 2/2012 |

OTHER PUBLICATIONS

Written Opinion for International Application No. PCT/US2013/054436 dated Jan. 31, 2014, 7 pages.
International Search Report for International Application No. PCT/US2013/077246 dated Apr. 8, 2014, 3 pages.
Written Opinion for International Application No. PCT/US2013/077246 dated Apr. 8, 2014, 8 pages.
COMSOL Multiphysics Reference Manual, Version COMSOL 5.3a © 1998-2017, (1,550 pgs.).
Introduction to COMSOL Multiphysics, Version COMSOL 5.3a © 1998-2017, (196 pgs.).

* cited by examiner

Fig 31

◢ 🔲 actuator.mphapp *(root)*
    ▷ 🔲 Global Definitions
    ▷ 🔲 Thermal Actuator *(mod 1)*
    ▷ 🔲 Study 1                 3121
    ▷ 🔲 Results
    ◢ 🔲 Application Feature 1 *(Simulation)*
        § Developer Comments
        ▷ 🔲 Section panel 1 *(/ApplicationNo*
        ▷ 🔲 Section panel 2 *(/ApplicationNo*
        ▷ ▷ Action 1 *(Geometry)*
        ▷ ▷ Action 2 *(Run)*
        ▷ [MENU] Menu item 1 *(item1)*
        ▷ [MENU] Menu item 2 *(item2)*
3122

| Name | Expression | Value | Description |
|---|---|---|---|
| Da | 1/3*T | 0.16667 m | Impeller diameter |
| shaft_diameter | 1/10*Da | 0.016667 m | Shaft diameter |
| H | 0.5 [m] | 0.500000 m | Vessel height |
| T | H | 0.500000 m | Vessel diameter |
| C | 1/3*H | 0.16667 m | Clearance |
| blade_length | Da/4 | 0.041667 m | Blade length for Impeller |
| blade_width | Da/5 | 0.033333 m | Width of Impeller |

- ▲ ⊜ Global Definitions
  - Pᵢ Parameters
  - ▷ A Waveguide cross-section — 3738
  - 3739 — ▷ A Straight section
  - ▲ A Left/right bend section — 3740
    - Aᵢ Arguments
    - Pᵢ Parameters
    - ▷ ⬚ Start plane — 3741
    - ⬚ Extrude1
    - ↻ Rotate1
    - ✥ Move1
    - ▷ ⬚ Work Plane 2
    - ⇇ Revolve 1
    - ⬚ Union 1
    - ▷ ⬚ End plane — 3742
    - 3743 — ⬚ EM region
    - ⬚ Input Boundary — 3744
    - 3745 — ⬚ Output Boundary
    - ⬚ Initial output boundary
    - ▷ ⬚ View 7
- ▲ ■ Component 1
  - ▷ ≡ Definitions
  - ▲ A Geometry 1
    - ⬚ Block 1
    - ⬚ EM region
    - ⬚ Input boundaries
    - ▷ ⬚ Initial output boundaries
    - ⬚ Output boundaries
    - ⬚ Subsequence Call 1
    - ⬚ Subsequence Call 2
    - ⬚ Form Union

Figure 37b

| | Subsequence Call | |
|---|---|---|
| | 🔳 Build Selected  ⚏ Build All Objects | |

▼ Subsequence

Subsequence: [Left/right bend section ▼]

▼ Arguments

| Name | Expression | Value | Description |
|---|---|---|---|
| W_g | 0.02 [m] | 0.02 [m] | Waveguide width |
| H_g | 0.01 [m] | 0.01 [m] | Waveguide height |
| t_g | 0.0010 [m] | 0.0010 [m] | |
| R_sg | 0.03 [m] | 0.03 [m] | Center bend radius |
| lr | -1.0 | -1.0 | Left/right bend |

▼ Position and Orientation of Output

— Coordinate system in subsequence —
Work plane in subsequence: [Start plane ▼]  — 3748
— Coordinate system to match —
Take work plane from: [Subsequence Call 1 ▼]  — 3747
Work plane: [End plane ▼]  — 3746
— Displacement —
xw: [0] m
yw: [0] m
zw: [0] m
— Rotation —
Axis type: [zw-axis ▼]
Rotation angle: [0] deg

Figure 37c

SYSTEM AND METHOD FOR CREATING APPLICATION INTERFACES FOR MULTIPHYSICS MODELING

CROSS-REFERENCE TO RELATED APPLICATIONS

This application claims priority to and the benefits of U.S. Provisional Application No. 62/653,292, filed Apr. 5, 2018; and this application is a continuation-in-part of U.S. application Ser. No. 14/652,747, filed Jun. 16, 2015, which is a U.S. national stage of International Application No. PCT/US2013/077246, filed Dec. 20, 2013, which claims priority to and the benefits of earlier International Application No. PCT/US2013/054436, filed Aug. 9, 2013, which claims priority to and the benefits of earlier U.S. patent application Ser. No. 13/835,091, filed Mar. 15, 2013, which claims priority to and the benefits of earlier U.S. Provisional Patent Application No. 61/740,149, filed on Dec. 20, 2012, the disclosures of which are each hereby incorporated by reference herein in their entireties.

FIELD OF THE INVENTION

The present invention relates generally to systems and methods for modeling and simulation, and more particularly, to creating application interfaces for forming and solving problems in a modeling system, including methods for data input and output and methods to make applications that are executed with the assistance of a runtime engine that maintains license use controls for the application.

BACKGROUND

Computer design systems are used to develop product designs and may include graphical user interfaces. Computer design systems can be complemented with packages analyzing a single aspect of a design, such as, structural analysis in conjunction with computer-aided design systems. It would be desirable to have design systems that can operate in more customized environments adapted for a specific use.

SUMMARY OF THE INVENTION

According to one aspect of the present disclosure, a system is adapted to generate a customized application data structure for modeling physical systems. The system comprises one or more processors, one or more user input devices, optionally a display device, and one or more memory devices. The one or more processors are adapted, during use, to: (i) embed a pre-determined or selected multiphysics model data structure in an application data structure, (ii) add geometry data, representing one or more geometry subroutines, to the embedded multiphysics model data structure, (iii) add call data to the embedded multiphysics model data structure, an (iv) add application data representing one or more application features to the application data structure. The multiphysics model data structure comprises a representation of one or more models of physical systems. Each model of a physical system represents physical phenomena and/or physical processes. The multiphysics model data structure comprises data representing at least one modeling operation determining how to model or simulate the one or more models of physical systems. The added geometry data comprises parameter definitions for the one or more models of physical systems. The call data represents one or more geometry subroutine calls for implementing at least one of the one or more geometry subroutines. Each application feature comprises one or more of (a) first data representing at least one form feature, and/or (b) second data representing at least one action feature. A form feature comprises data specifying input data and/or output data and/or presentation format of input and/or output data. An action feature comprises data specifying a sequence of operations to be carried out when executing the application data structure. At least one of the sequence of operations to be carried out comprises the at least one modeling operation. At least one of the sequence of operations to be carried out comprises an operation providing data for generating at least one geometry of at least a part of the one or more models of physical systems. A customized application data structure is generated providing, when executed, a customized modeling of the physical systems using the at least one modeling operation, the at least one geometry of at least a part of the one or more models of physical systems, at least one of the one or more application features, and at least one of the one or more geometry subroutines. The generated customized application data structure is configured as an end-user application executable by an application runtime engine.

According to another aspect of the present disclosure, a system is adapted to generate a customized application data structure for modeling physical systems. The system comprises one or more processors, one or more user input devices, optionally a display device, and one or more memory devices. The one or more processors are adapted, during use, to: (i) embed a pre-determined or selected multiphysics model data structure in an application data structure, wherein the multiphysics model data structure comprises a representation of one or more models of physical systems, each model of a physical system representing physical phenomena and/or physical processes, wherein the multiphysics model data structure comprises data representing at least one modeling operation determining how to model or simulate the one or more models of physical systems; (ii) add application data representing one or more application features to the application data structure, where each application feature comprises one or more of (a) first data representing at least one form feature, and/or (b) second data representing at least one action feature; and (iii) add application data via one or more graphical user interfaces, the added application data allowing an end-user application executed on an application runtime engine to perform at least one of receiving standard input data, outputting standard output data, receiving application input data, generating a web socket, generating a named pipe, and/or generating a custom file scheme. A form feature comprises data specifying input data and/or output data and/or presentation format of input and/or output data. An action feature comprises data specifying a sequence of operations to be carried out, when executing the application data structure. At least one of the sequence of operations to be carried out comprises the at least one modeling operation. A customized application data structure is generated providing, when executed, a customized modeling of the physical systems using the at least one modeling operation and at least one of the one or more application features.

According to further aspects of the present disclosure, one or more non-transitory computer readable media are encoded with instructions, which when executed by one or more processors associated with a design system, a simulation system, or a modeling system, causes at least one of the one or more processors to perform one or more of the acts described for the above systems.

Additional aspects of the present disclosure will be apparent to those of ordinary skill in the art in view of the detailed description of various embodiments, which is made with reference to the drawings, a brief description of which is provided below.

BRIEF DESCRIPTION OF THE DRAWINGS

Features and advantages of the present disclosure will become more apparent from the following detailed description of exemplary embodiments thereof taken in conjunction with the accompanying drawings in which:

FIG. 31 illustrates an exemplary aspect of an application tree for adding a menu input form to an application data structure, according to aspects of the present disclosure.

FIGS. 37A-37C illustrate an exemplary aspect of a model tree and a waveguide geometry created upon execution of a waveguide application including exemplary geometry subroutine aspects, according to aspects of the present disclosure.

Figure 1:
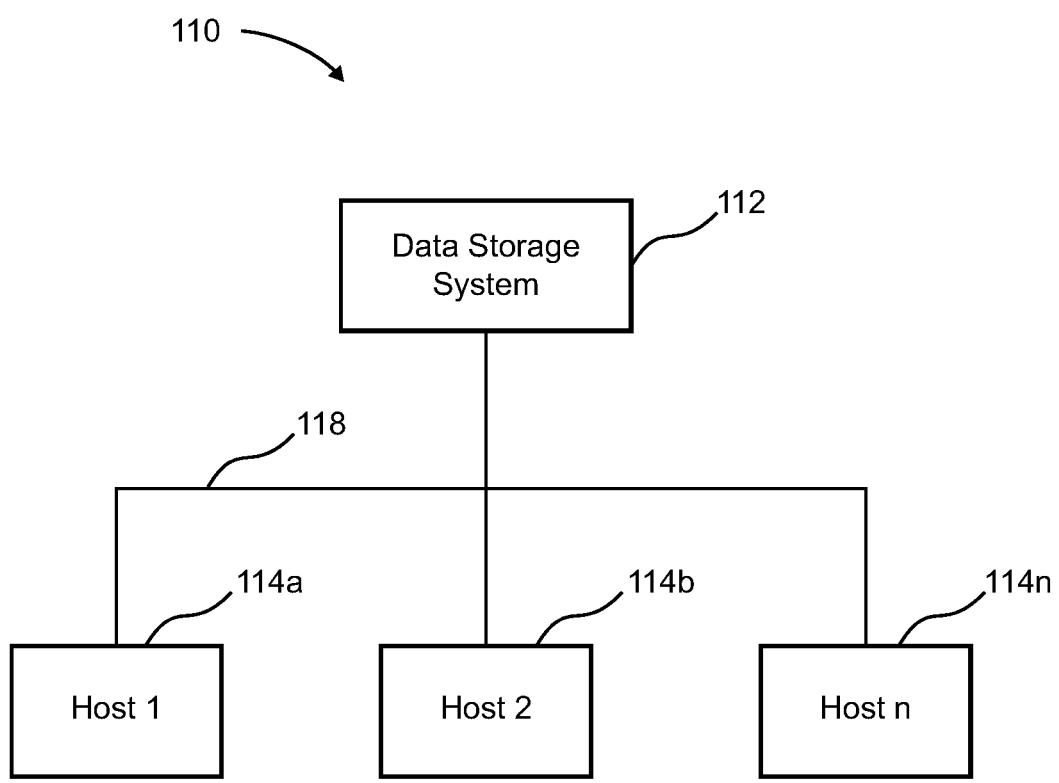
FIG. 1 illustrates an exemplary aspect of a computer system, according to aspects of the present disclosure.

While the present disclosure is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

While this invention is susceptible of embodiment in many different forms, there is shown in the drawings and will herein be described in detail preferred aspects of the invention with the understanding that the present disclosure is to be considered as an exemplification of the principles of the invention and is not intended to limit the broad aspect of the invention to the aspects illustrated. For purposes of the present detailed description, the singular includes the plural and vice versa (unless specifically disclaimed); the word "or" shall be both conjunctive and disjunctive; the word "all" means "any and all"; the word "any" means "any and all"; and the word "including" means "including without limitation."

The present disclosure expands the flexibility and range of capabilities in modeling systems by allowing the generation of customized applications. The adding of geometry subroutines to a multiphysics model in an application data structure for modeling physical systems allows an application to be more customizable and reusable. For example, geometry subroutines can be expanded to accept objects and selections as inputs. As another example, the definition of cross sections for geometry subroutines can be simplified by defining the cross sections in work planes in a multiphysics modeling system. Furthermore, the customization of applications for multiphysics models, such as provided by the present disclosure, allow models to be defined and simulations to be executed for specific physical systems, as described in the non-limiting exemplary aspects of the present disclosure. The customization of applications further allows designs for a physical system being simulated to be optimized and could also be to determine a design output that is used to control the manufacture of the physical system.

In accord with these concepts, an application can be tailored for a very specific use. The application's author may be a scientist or engineer that masters modeling and simulations, and the process or phenomena that these simulations describe. Modeling and simulations are generally used to understand, predict, optimize, and control devices, processes, or phenomena.

The application author may be contracted by an application user (future user) for developing an application describing specific devices, processes, or phenomena. These engineers would (typically) not be able to define a model and run simulations using physics interfaces in multiphysics modeling software. The application user would then use the application to understand, predict, optimize, and control processes or phenomena for different conditions and use. In one scenario, an application user defines a model using an application, runs simulations to optimize the design of the device (or process) simulated by the model, creates a drawing based on this optimization, and builds the device according to the optimized design. In one implementation, a computer controlled manufacturing device is integrated with the aspects of the present concepts disclosed herein and a device could be optimized on one computer, which then sends the resulting output to another computer that controls one or more manufacturing devices or machines. If the purpose of the model is to control a process, an automatic control design could be obtained directly from the application model.

The optimization enabled by the present concepts facilitates the design and/or control of devices or processes by engineers who are not modeling experts.

Exemplary methods and systems for creating or forming an application data structure are described. It is contemplated that the method may be executed as part of an application interface builder module that may be a stand-alone system that interfaces or connects with an engineering analysis system, such as a multiphysics modeling system. It is also contemplated that the application interface builder module may be a one of a plurality of modules or routines that comprise an engineering analysis system. The application interface builder module can include or be connected with a user interface, such as a graphical user interface, that seeks inputs and displays instructions to a user of the application interface builder. The application interface builder module for creating an application data structure is executed on one or more processors associated with various computer systems described elsewhere herein including, among other things, the computer systems and apparatus described for the multiphysics modeling system.

It is contemplated to be desirable for the application interface to be available in, or accessible to, an engineering analysis system, such as a multiphysics modeling system, to generate a model described in a model object (e.g., a model data structure including data fields and methods along with their interactions) in accordance with an object-orient programming language (e.g., C++, C#, Java®).

In some aspects, an application interface for creating or forming an application data structure may be represented as a branch containing nodes describing a multiphysics model's setting, such as describes elsewhere herein for aspects of multiphysics modeling systems using model tree features. The branch and nodes may be included in a graphical user interface and the described settings may include, among other things, domain settings, boundary conditions, and initial conditions.

It is further contemplated that an application interface builder may allow a user to name the application interface. For example, the name of an application interface may be descriptive of the application it defines and it may also be displayed in the user interface (e.g., the model tree) in the engineering analysis system, such as a system implementing multiphysics simulations. The name may be changed by a user of the system or by the multiphysics system itself in the situation where several application interfaces of the same type are added to or available to a multiphysics model.

Systems for computer aided engineering, such as finite elements analysis systems, finite volume systems, and finite difference systems are often equipped with a graphical user interface where a user may set up and run a simulation. Such processes or systems may contain a number of different user interfaces for different types of simulations, such as CFD, heat transfer, electromagnetics, or structural mechanics simulations.

Methods for setting up and solving multiphysics problems and other modeling systems are described herein, for example, in FIGS. 3-15, and are also described in U.S. Pat. No. 8,219,373, issued Jul. 10, 2012; U.S. Pat. No. 7,623,991, issued Nov. 24, 2009; U.S. Pat. No. 7,519,518, issued Apr. 14, 2009; U.S. Pat. No. 7,596,474, issued Sep. 29, 2009; and U.S. Patent Application Publication No. 2012/0179426, published Jul. 12, 2012. Ser. No. 13/184,207, filed Jul. 15, 2011, each of which are hereby incorporated by reference herein in their entireties. These published patent documents describe, for example, method for setting up and executing multiphysics simulations, including several coupled physical phenomena, by receiving inputs in the form of physical properties that may be expressed in terms of physical quantities. In addition, the above-referenced U.S. patents and patent application disclose methods for setting up problems using physical properties, physical quantities, and physical phenomena described using partial differential equations (PDEs). These published patent documents provide for methods and systems for setting up and solve multiphysics problems using predefined application modes that are referred to herein as physics interfaces. Components of the physics interfaces can include parameters, variables, physical properties, physical quantities, boundary and initial conditions, and solvers with settings and menus. These settings and menus may be tailored for the specific physics instead of using the generic mathematical settings. In addition, these published patent disclosures also describe methods for PDE modes, also referred to as PDE interfaces, in the cases where predefined physics interfaces are not available. The use of the generic PDE modes and PDE interfaces for setting up multiphysics problems requires knowledge about the description of physical properties, physical quantities, and physical phenomena in terms of PDEs.

It is contemplated that systems and methods operable to or adapted to generate an application data structure, based on a multiphysics model, would be desirable and provide various computational advantages for engineering design systems, including modeling and simulation systems. The methods and systems for generating the application data structure can be implemented on dedicated graphical user interface(s) in an application builder module configured or adapted for accessing features and feature settings for the multiphysics model. Such a graphical user interface can also give access to methods for generating a data structure representing an application using the existing settings for the multiphysics model. The application data structure can further be interpreted (e.g., executed) via another system or method that makes the application data structure accessible from the graphical user interface in a multiphysics modeling system for generating an application model data structure and a multiphysics model data structure to allowing the execution of simulations.

Throughout this disclosure, various non-limiting exemplary aspects of systems are described herein that include methods, executed on processing unit(s), which are accessible via a graphical user interface. The methods include instructions for generating application data structures, application model data structures, and other type of data structures for modeling physical systems. It is contemplated that the generated data structures can be applied or associated with an engineering analysis system (e.g., multiphysics modeling system), where the data structure(s) may be built and applied by a system user.

In the exemplary aspect of a multiphysics modeling system, a first interpreter module can be provided that receives inputs in the form of physical properties in term of physical quantities, and then, generates a model object (e.g., model data structure). A model object may include the algorithms and data structures for the model and may be further used to represent the model. The model object can further include methods for setting up and executing sequences of operations to create geometry, meshes, and solutions for the model.

Physical computing devices embodying engineering analysis systems may be configured with one or more graphical user interfaces that allow a system user to input and execute simulations and build application data structures. The computer systems may include some of the non-limiting exemplary routines or methods described above and can further include different interfaces for different types of simulations. Different user interfaces may, for example, be provided for fluid flow, heat transfer, electromagnetic, and/or structural mechanics simulations. Simulations and associated interfaces for other engineering or physics phenomena are also contemplated for computer-aided engineering analysis systems.

A system having a dedicated graphical user interface for generating or building an application data structure and an application model data structure are contemplated in some aspects of the present disclosure. For example, a computer system may include a graphical user interface for defining the parameters, forms, features, actions, variables, physical properties, physical quantities, and/or physics interface features for a desired physics phenomena associated with a desired analysis or simulation. The graphical user interface can allow access to routines or methods that then generate the application data structure. The generated data structure may then be interpreted or executed by a routine or method configured to create the application model data structure and to make the application interface accessible from other graphical user interface(s) associated with, for example, an engineering analysis system such as a multiphysics modeling system. It is contemplated that the routines or methods for these operations can be executed locally on, and/or remotely through network connection(s) to, one or more processing unit(s) executing the engineering analysis systems.

Computer systems may be used for performing the different tasks described in the present disclosure. One aspect for using a computer system includes executing one or more computer programs, including engineering analysis systems and methods, stored on computer readable media (e.g., temporary or fixed memory, magnetic storage, optical storage, electronic storage, flash memory, other storage media). A computer program may include instructions which, when executed by a processor, perform one or more tasks. In certain embodiments, a computer system executes machine instructions, as may be generated, for example, in connection with translation of source code to machine executable code, to perform modeling and simulation, and/or problem solving tasks. One technique, which may be used to model and simulate physical phenomena or physical processes, is to represent various physical properties and quantities, of the physical phenomena or physical processes being modeled and simulated, in terms of variables and equations or in other quantifiable forms that may be processed by a computer system. In turn, these equations or other quantifiable forms may be solved by a computer system configured to solve for one or more variables associated with the equation, or the computer may be configured to solve a problem using other received input parameters.

It is contemplated that computer programs for modeling and simulating physical phenomena or physical processes may provide many advantages particularly as the complexity of the physical phenomena or physical processes being modeled and simulated increases. For example, in certain embodiments a user can combine one or more physical phenomena into a multiphysics model, as part of, for example, an engineering analysis. To further illustrate this example, a user may combine phenomena described by chemical kinetics and fluid mechanics, electromagnetic phenomena and heat transfer, structural mechanics and fluid flow, or other physics phenomena. Such multiphysics models may also involve multiple physical processes. For example, a process may be combined that includes an amplifier powering an actuator, where both the amplifier and the actuator are a part of one multiphysics model. Multiphysics modeling can also include solving coupled systems of partial differential equations (PDEs).

It is contemplated that computer systems on which modeling systems operate, such as the modeling systems described herein, can include networked computers or processors. In certain embodiments, processors may be operating directly on the modeling system user's computer, and in other embodiments, a processor may be operating remotely. For example, a user may provide various input parameters at one computer or terminal located at a certain location. Those parameters may be processed locally on the one computer or they may be transferred over a local area network or a wide area network, to another processor, located elsewhere on the network that is configured to process the input parameters. The second processor may be associated with a server connected to the Internet (or other network) or the second processor can be several processors connected to the Internet (or other network), each handling select function(s) for developing and solving a problem on the modeling system. It is further contemplated that the results of the processing by the one or more processors can then be assembled at yet another server or processor. It is also contemplated that the results may be assembled back at the terminal or computer where the user is situated. The terminal or computer where the user is situated can then display the solution of the multiphysics modeling system to the user via a display (e.g., a transient display) or in hard copy form (e.g., via a printer). Alternatively or in addition, the solution may be stored in a memory associated with the terminal or computer, or the solution may be stored on another server that the user may access to obtain the solution from the modeling system.

It is contemplated that in certain embodiments a product or process may be in the development or feasibility stage where it is being designed or analyzed. The product or process being developed or analyzed may need to be assessed for use in complex environment(s) involving several physical properties and quantities. It can be desirable to solve complex multiphysics problems by systematically varying parametric and geometric features in a computer-based design system. Other desirable features may include, for example, having a computer-based system for solving complex multiphysics problems in which the settings for the physical properties and boundary conditions, located in a memory and used to form multiphysics models and/or solve multiphysics problems, can be accessed directly from the design system.

Referring now to FIG. 1, an exemplary aspect of a computer system is illustrated that may be used with the methods described elsewhere herein including modeling systems and systems for generating application data structures. The computer system 110 includes a data storage system 112 connected to host systems 114a-114n through communication medium 118. In this embodiment of the computer system 110, the "n" hosts 114a-114n may access the data storage system 112, for example, in performing input/output (I/O) operations. The communication medium 118 may be any one of a variety of networks or other type of communication connections as known in the modeling and computer simulation field. For example, the communication medium 118 may be the Internet, an intranet, or other network connection by which the host systems 114a-114n may access and communicate with the data storage system 112, and may also communicate with others included in the computer system 110, including without limitation systems based on various forms of network communications (e.g., fiber optic, wireless, Ethernet).

Each of the host systems 114a-114n and the data storage system 112 included in the computer system 110 may be connected to the communication medium 118 by any one of a variety of connections as may be provided and supported in accordance with the type of communication medium 118. The processors included in the host computer systems 114a-114n or a data manager system may be any one of a variety of commercially available single or multi-processor system, such as an Intel-based processor, IBM mainframe, server, or other type of commercially available processor able to support incoming traffic in accordance with each particular embodiment and application.

It should be noted that the particulars of the hardware and systems included in each of the host systems 114a-114n, as well as those components that may be included in the data storage system 112 are described herein in more detail, and may vary with each particular embodiment. Each of the host computers 114a-114n, as well as the data storage system 112, may all be located at the same physical site, or, alternatively, may also be located in different physical locations. Examples of the communication medium that may be used to provide the different types of connections between the host computer systems, the data manager system, and the data storage system of the computer system 110 may use a variety of different communication protocols such as SCSI, ESCON, Fiber Channel, or functional equivalents that are known to those skilled in the computer modeling and simulation field. Some or all of the connections by which the hosts and data storage system 112 may be connected to the communication medium 118 may pass through other communication devices, such as a Connectrix or other switching equipment that may exist, both physical and virtual, such as a phone line, a repeater, a multiplexer or even a satellite.

Each of the host computer systems may perform different types of data operations, such as storing and retrieving data files used in connection with an application executing on one or more of the host computer systems. For example, a computer program may be executing on the host computer 114a and store and retrieve data from the data storage system 112. The data storage system 112 may include any number of a variety of different data storage devices, such as disks, tapes, and the like in accordance with each implementation. As will be described in following paragraphs, methods may reside and be executing on any one of the host computer systems 114a-114n. Data may be stored locally on the host system executing the methods, as well as remotely in the data storage system 112 or on another host computer system. Similarly, depending on the configuration of each computer system 110, method as described herein may be stored and executed on one of the host computer systems and accessed remotely by a user on another computer system using local data. A variety of different system configurations and variations are possible then as will be described in connection with the embodiment of the computer system 110 of FIG. 1 and should not be construed as a limitation of the techniques described elsewhere herein.

Figure 2:
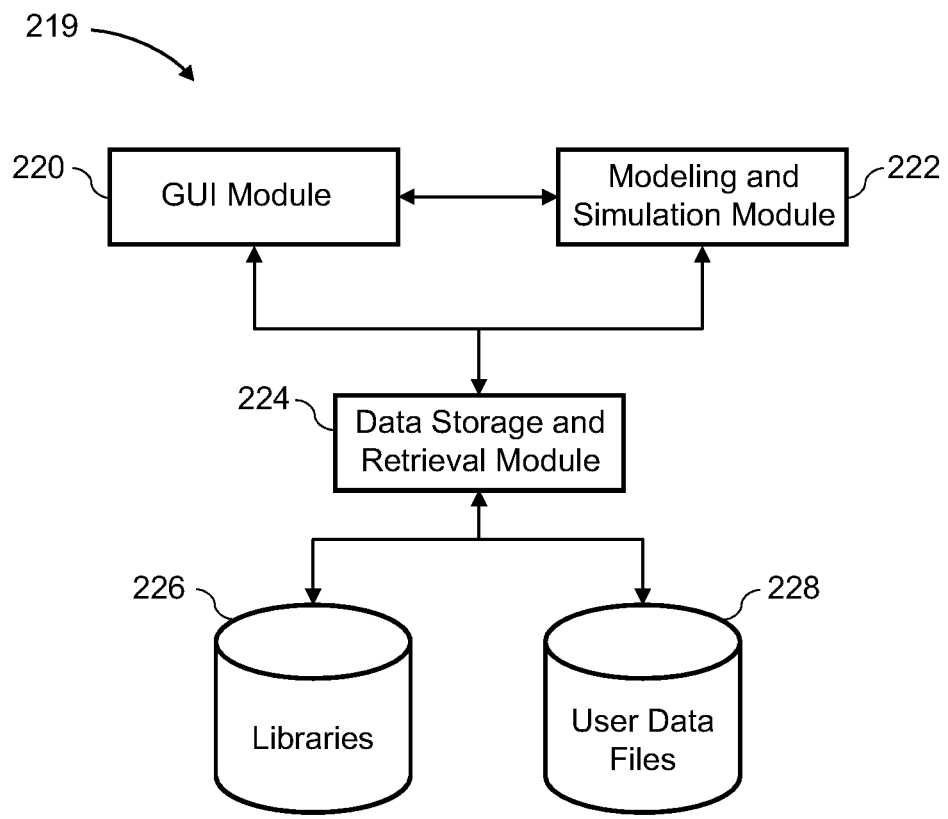
FIG. 2 illustrates an exemplary aspect of systems that may reside and be executed in one of the hosts of FIG. 1, according to aspects of the present disclosure.

Referring now to FIG. 2, an exemplary aspect of a modeling system 219 is illustrated that may reside, for example, on a single computer or in one of a plurality of host computer systems (e.g., host computers 114a-114n). The modeling system may be divided into several components. One exemplary aspect of the system may include a GUI module 220, a Modeling and Simulation module 222, and a Data Storage and Retrieval module 224. The GUI module 220 can provide for interactions with system users. The Modeling and Simulation module 222 can provide an ability to manage and perform a multiphysics simulation. The Data Storage and Retrieval module 224 can provide an ability to load and save the model in a file, and to load and store other types of files which may be used during the simulation or may be used as input or output to the simulation.

The GUI module 220 may communicate with the Modeling and Simulation module 222 by sending and receiving commands. The act of sending and receiving commands may be performed through an application programming interface ("API") or other similar components. In one aspect of the system, the API may be object oriented, and mix data and function calls within the same structure. In another aspect of the system, the API may use a data structure that is separate from function calls.

It is contemplated that in certain aspects of the present disclosure components of the multiphysics modeling system may reside on different host computer systems. For example, the GUI module 220 may reside on a personal computer host and the Modeling and Simulation module 222 may reside on a server computer host. It is further contemplated that the Data Storage and Retrieval module 224 may reside on either the personal computer host or the server computer host, or yet another separate computer host. If the computer hosts are not identical, the API can be configured to use a computer network to communicate between hosts. In one embodiment, an object oriented API may be configured to send data and method calls over the computer network or in another embodiment send data and function calls between the components over a computer network. The API may also be able to handle a Data Storage and Retrieval module 224 which may be located either on the host of the GUI module 220 or the Modeling and Simulation module 222, or on a separate host. In each of those cases, the Data Storage and Retrieval module 224 may be configured to load and store files on each of those hosts.

It is contemplated that in certain aspects, the system 219 may include, or be configured with, operating systems such as Windows 8, Mac OS, iOS, Android, Chrome OS, and the like, or system components other than what is described and represented in the modeling system 219 illustrated in FIG. 2. In the exemplary aspect illustrated in FIG. 2, Libraries 226 and the User Data Files 228 can be stored locally within the host computer system. It is further contemplated that in certain aspects, the Libraries 226 and/or User Data Files 228, as well as copies of these, may be stored in another host computer system and/or in the Data Storage System 112 of the computer system 110. However, for simplicity and explanation in paragraphs that follow, it may be assumed in a non-limiting manner that the system 219 may reside on a single host computer system such as 114a with additional backups, for example, of the User Data Files and Libraries, in the Data Storage System 112.

In certain aspects of the present disclosure, portions of the modeling system 219, such as the GUI module 220, the Modeling and Simulation module 222, the Data Storage and Retrieval module 224, and/or the Libraries 226 may be included or executed in combination with commercially available system package(s). These components may operate on one of the host systems 114a-114n, and may include one or more operating systems, such as, Windows XP®, Windows 7, Windows 8, Windows HPC Server 2008 R2, Unix®, Linux®, Mac OS®, iOS, Chrome® OS, Android®, and the like. It is further contemplated that the modules of the modeling system 219 may written in any one of a variety of computer programming languages, such as, C, C++, C#, Java®, or any combination(s) thereof, or other commercially available programming languages.

It is contemplated that the GUI module 220 may display GUI windows in connection with obtaining data for use in performing modeling, simulation, and/or other problem solving for one or more processes and/or physics phenomena under consideration by a system user. The one or more processes and/or phenomena may be assembled and solved by the Modeling and Simulation module 222. That is, user data may be gathered or received by the system using modules, such as the GUI module 220, and subsequently used by the Modeling and Simulation module 222. Thereafter, the data may be transferred or forwarded to the Data Storage and Retrieval module 224 where the user-entered data may be stored in a separate data structure (e.g., User Data Files 228). It is contemplated that other data and information may also be stored and retrieved from a separate data structure, such as Libraries 226, which may be used by the Modeling and Simulation module 222 or in connection with the GUI module 220.

The various data files that may be associated with a modeling system, such as User Data Files 228 and the Libraries 226, may be stored in any one of a variety of data file formats in connection with a file system used in the host computer system or in the Data Storage System 112. In certain aspects, the system 219 may use any one of a variety of database packages in connection with the storage and retrieval of data. The User Data files 228 may also be used in connection with other simulation and modeling systems. For example, the User Data files 228 may be stored in a format that may also be used directly or indirectly as an input to any one of a variety of other modeling systems. In certain aspects, data may be imported and/or exported between the multiphysics modeling system and another system. The format of the data may be varied or customized in accordance with each of the system(s) as well as in accordance with additional functionalities that each of the system(s) may include.

It is contemplated that the systems and methods described herein may be used for combining physics interfaces that model different physical phenomena or processes. The combination of a plurality of physics interfaces can be referred to as a multiphysics model. Properties of the physics interfaces can be represented by PDEs that may be automatically combined to form PDEs describing physical quantities in a coupled system or representation. The coupled PDEs may be displayed, for example, in an "Equation view" that allows for the coupled PDEs to be modified and used as input into a solver. It is also contemplated that the PDEs may be provided to the solver either independently as one PDE or a system of PDEs, describing a single phenomenon or process, or as one or several systems of PDEs describing several phenomena or processes.

In certain aspects of the present disclosure, a multiphysics modeling system can provide an ability to combine physics interfaces that model physical properties through one or more GUIs that allow a user to select one or more physics interfaces from a list. In addition to displaying physics interfaces names, it is further contemplated that variable names for physical quantities may be selected through a GUI. It is contemplated that the physics interfaces may have different formulations that depend on a "Study" settings feature, which is described in more detail elsewhere herein.

It is further contemplated that it may be desirable for a multiphysics modeling system to provide the ability to access predefined combinations of several physics phenomena for defining multiphysics model(s). The predefined combinations may be referred to as multiphysics interfaces, which similar to the physics interfaces, may also have different formulations that depend on a study settings feature.

It is contemplated that in certain aspects of the present disclosure physical properties can be used to model physical quantities for component(s) and/or process(es) being examined using the modeling system, and the physical properties can be defined using a GUI that allow the physical properties to be described as numerical values. In certain aspects, physical properties can also be defined as mathematical expressions that include one or more numerical values, space coordinates, time coordinates, and/or the actual physical quantities. In certain aspects, the physical properties may apply to some parts of a geometrical domain, and the physical quantity itself may be undefined in the other parts of the geometrical domain. A geometrical domain or "domain" may be partitioned into disjoint subdomains. The mathematical union of these subdomains forms the geometrical domain or "domain". The complete boundary of a domain may also be divided into sections referred to as "boundaries". Adjacent subdomains may have common boundaries referred to as "borders". The complete boundary is the mathematical union of all the boundaries including, for example, subdomain borders. For example, in certain aspects, a geometrical domain may be one-dimensional, two-dimensional, or three-dimensional in a GUI. However, as described in more detail elsewhere herein, the solvers may be able to handle any space dimension. It is contemplated that through the use of GUIs in one implementation, physical properties on a boundary of a domain may be specified and used to derive the boundary conditions of the PDEs.

Additional features of a modeling system, such as feature that may be found in the Modeling and Simulation module 222, may provide for automatically deriving a system of PDE's and boundary conditions for a multiphysics model. This technique can include merging the PDEs of the plurality of phenomena or processes, and may produce a single system of coupled PDEs, also using coupling variables or operators to couple processes in different coordinate systems, and may perform symbolic differentiation of the system of PDEs with respect to all the dependent variables for later use by the solver.

It is contemplated that in certain aspects, a coupled system of PDEs may be modified before being differentiated and sent to the solver. The modification may be performed using a settings window included in a GUI displaying the combined PDEs in an "Equation view". When the system of PDEs is modified in this way, the settings for the corresponding physical properties can become "locked". The properties may subsequently be unlocked by a user taking certain action(s).

It is contemplated that certain aspects of the present disclosure may include features for modeling one or more of a plurality of engineering and scientific disciplines, including, for example, acoustics, chemical reactions, diffusion, electromagnetism, fluid mechanics, geophysics, heat transfer, optics, plasma physics, quantum mechanics, semiconductor physics, structural mechanics, wave propagation, and the like. Certain aspects of a modeling system may involve more than one of the foregoing disciplines and can also include representing or modeling a combination of the foregoing disciplines. Furthermore, the techniques that are described herein may be used in connection with one or more systems of PDEs.

It is contemplated that in certain aspects of the present disclosure, system(s) of PDEs may be represented in general, coefficient, and/or weak form. The coefficient form may be more suitable in connection with linear or almost linear problems, while the general and weak forms may be better suited for use in connection with non-linear problems. The system(s) being modeled may have one or more associated studies, for example, such as stationary, time dependent, eigenvalue, or eigenfrequency. In the aspects described herein, a finite element method (FEM) may be used to solve for the PDEs together with, for example, adaptive meshing, adaptive time stepping, and/or a choice of a one or more different numerical solvers.

It is contemplated that in certain aspects of the present disclosure, a finite element mesh may include simplices forming a representation of a geometrical domain. Each simplex can belong to a unique subdomain, and a union of the simplices can form an approximation of the geometrical domain. The boundary of the domain may also be represented by simplices of the dimensions 0, 1, and 2, for geometrical dimensions 1, 2, and 3, respectively.

It is further contemplated that a mesh representing a geometry may also be created by an outside or external application and may subsequently be imported for use into the modeling system(s) described in the present disclosure.

The initial value of the solution process may be given as numerical values, or expressions that may include numerical values, space coordinates, time coordinates and the actual physical quantities. The initial value(s) may also include physical quantities previously determined.

The solution of the PDEs may be determined for any subset of the physical properties and their related quantities. Further, any subset not solved for may be treated as initial values to the system of PDEs.

It is contemplated that it may be desirable for a user to select a space dimension, combinations of physics, and a type of study in a multiphysics modeling system using a model wizard. The model wizard may take the user through these selection steps and it may also allow for the combination of several space dimensions, several physics, and several studies or study steps in a multiphysics model.

Figure 3:
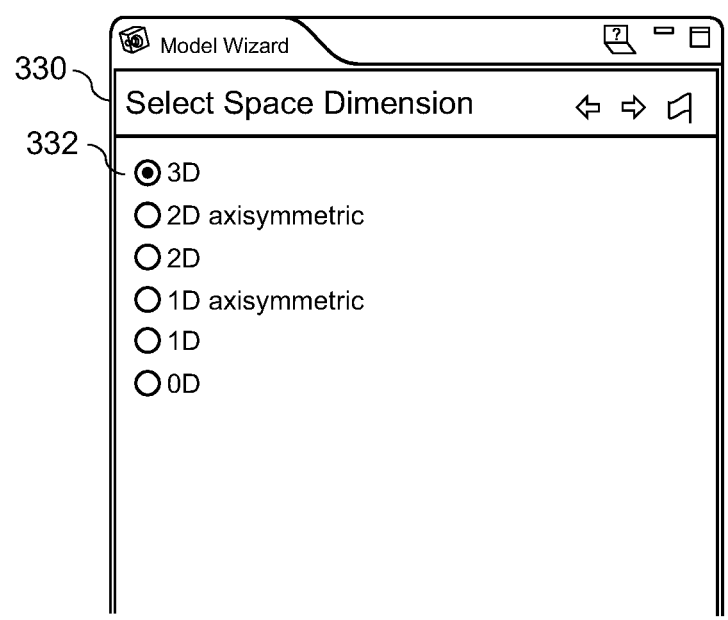
FIG. 3 illustrates an exemplary aspect of a graphical user interface for specifying space dimensions, according to aspects of the present disclosure.

Referring now to FIG. 3, an exemplary aspect of a user interface or GUI 330 is illustrated that may be used to specify a space dimension 332 of a multiphysics model. The model may be specified in coordinate systems of the space dimensions including 0 dimensional (space independent, only time dependent), 1-dimensional, 1-dimensional axisymmetric, 2-dimensional, 2-dimensional axisymmetric, and 3-dimensional. It is further contemplated that a user may also combine models involving several of the above mentioned coordinate systems in order to describe phenomena or processes comprising multiple parts or scales.

Figure 4:
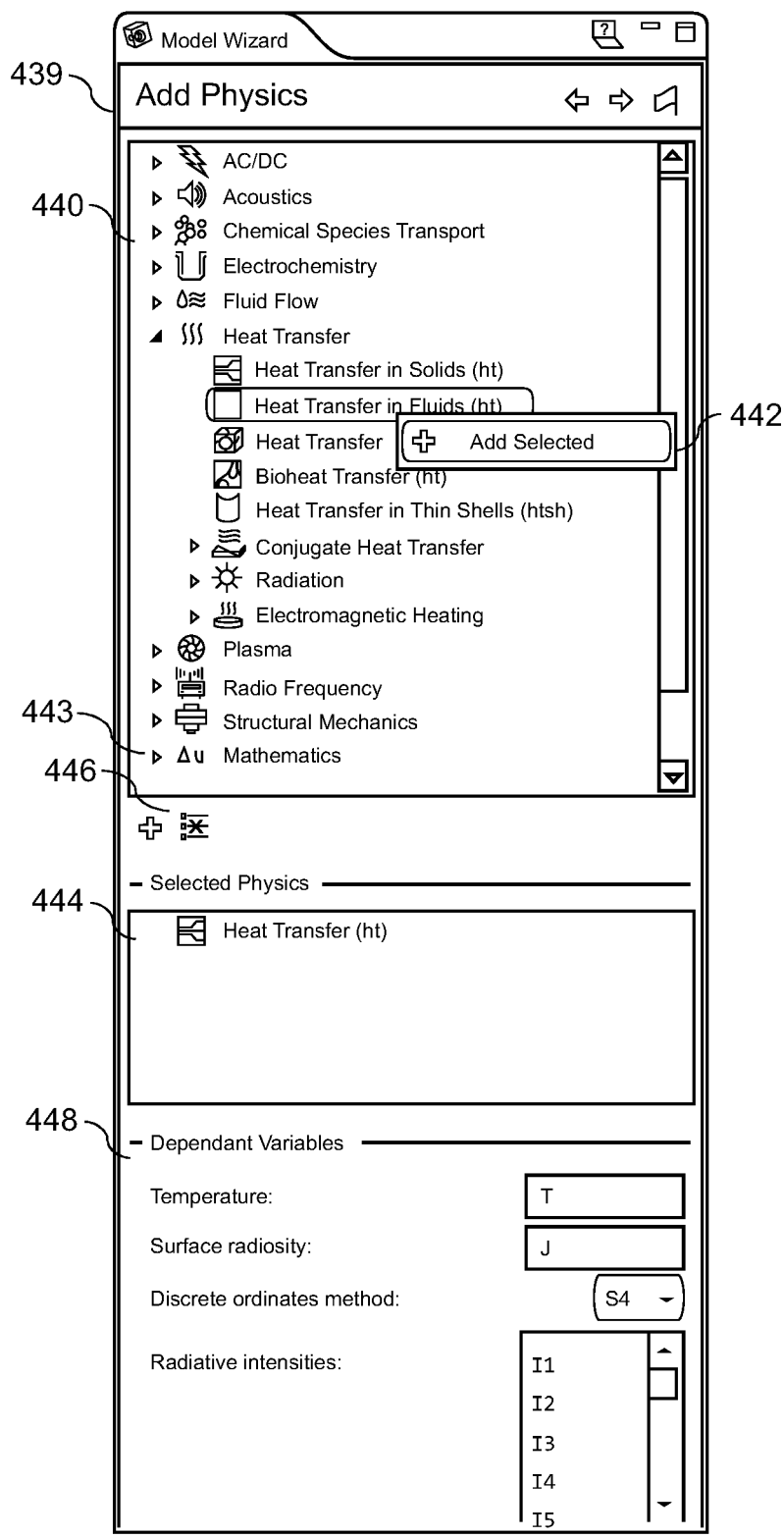
FIG. 4 illustrates an exemplary aspect of a graphical user interface for specifying physics interface(s), according to aspects of the present disclosure.

Referring now to FIG. 4, an exemplary aspect of a user interface or GUI 439 is illustrated that may be used to specify a multiphysics model having a combination of more than one phenomena or process(es) (e.g., acoustics, fluid flow, electromagnetics, heat transfer, structural mechanics). It is contemplated that each phenomenon or process to be combined may correspond to a physics interface. Through the use of the GUI 439, the physics interfaces that are to be used in this combined multiphysics model may be specified. Each physics interface can be configured to model physical quantities in terms of PDEs. The physical quantities may be represented either directly as dependent variable(s) in the PDE, or by a relation between the dependent variable and a variable representing the physical quantity. The PDEs in this exemplary aspect may be generally "hidden" (e.g., not made directly visible) from the user through the use of GUIs. As discussed previously, once several physics interfaces are combined into one single model or a system of models, the model or models may be referred to as a multiphysics model.

The GUI 439 also includes an exemplary list of physics interfaces 440 (e.g., AC/DC, Acoustics, Chemical Species Transport, Electrochemistry, Fluid Flow, Heat Transfer, Plasma, Radio Frequency, Structural Mechanics) from which a user may select in accordance with a user's choice of space dimensions. To add physics interfaces to a multiphysics model, the user selects physics interfaces from the list and may specify that these physics interfaces are to be included in a multiphysics model. For example, the user may right-click and then select context menu item "Add selected" 442 to add a physics interface (e.g., Heat Transfer in Fluids) to a multiphysics model. After selection, this physics interface is added to the list of "Selected physics" 444 below the physics list in the GUI 439. Physics interfaces may also be removed from the list by selecting a "Remove selected" button 446.

Each physics interface in a multiphysics model is given a unique name that may be used to identify the origin of the variables in the multiphysics model. After adding a physics interface to the "Selected physics" list 446, a user may edit the names of the dependent variables representing the physical quantities being solved for. For example, edits by a user may result in a new name for a variable, such as, for "Temperature" in the "Dependent variables" section 448 of GUI 439.

It is contemplated that the selectable interfaces can also include a mathematics interface 443 that is configured to directly correspond to PDEs. In mathematics interface(s), quantities can be represented by the dependent variables for the multiphysics model. It is contemplated that in certain aspects each mathematics interface may have more than one dependent variable. It is further contemplated that the number of dependent variables and the dimension of the system of PDEs may be entered in the "Dependent variables" section 448 in the GUI 439.

Figure 5:
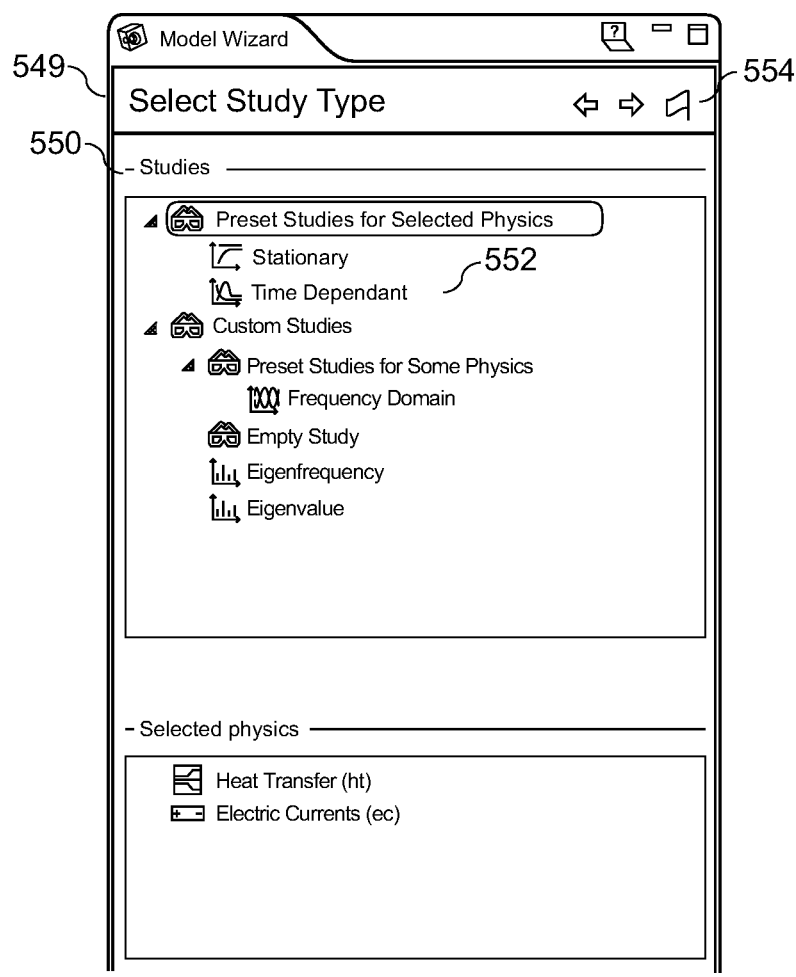
FIG. 5 illustrates an exemplary aspect of a graphical user interface for specifying study type(s), according to aspects of the present disclosure.

Referring now to FIG. 5, an exemplary aspect of a user interface or GUI 549 is illustrated for specifying one or more study types for a multiphysics model. In certain aspects of the modeling system, an interface may include preset studies that are associated with selected physics interfaces. The interface may allow for customization of study steps where, for example, the studies for each of the physics interfaces are customized or some of the studies are preset (e.g., stationary, time dependent) and others are customized (e.g., eigenfrequency). It is further contemplated that a study may combine several study steps relevant for a simulation study of a multiphysics model.

It is contemplated that in certain aspect of the present disclosure, a study can determine the type of analysis that may be done on a multiphysics model, such as stationary, time-dependent, eigenvalue, and eigenfrequency. The study may control the type of equation formulation used in a multiphysics model, the type of mesh (e.g., selected from a list of possible meshes), and/or the type of solvers that may be used to solve the different studies or study steps in a multiphysics model. In one exemplary aspect, a study may comprise a stationary study step followed by a transient study step. The study then formulates the equations, meshes, and solvers for the stationary and time-dependent study steps. A user may select a study from the studies list 550 and then finish the model wizard steps by clicking the "Finish" button 554.

It is contemplated that in certain aspects of the present disclosure, multiphysics model data (e.g., selections made in GUIs 330, 439, 549) may be communicated from the GUI (e.g., 220) to the Data Storage and Retrieval Module (e.g., 224) for storage in the User Data Files (e.g., 228). For example, a multiphysics model, such as one generated via model wizard steps previously described in FIGS. 3-5, including geometry, materials, physics interfaces, mesh, studies, and results, may be represented as a model tree in a GUI. Selecting (e.g., left clicking on) a node in a model tree may give a user access to the settings for the corresponding operation represented by the node. Further selection (e.g., right-clicking) of a node may also give a user access to a menu where a user may add properties and operations to the corresponding node. These added properties and operations may be represented as child nodes to the selected node.

It is contemplated that in certain aspects of the present disclosure, the foregoing screen display(s) (e.g., GUI 330) may be displayed by and/or included as part of the component for the GUI module (e.g., 220) of a modeling system (e.g., 219). It is further contemplated that a modeling system is configured to include different types of physics interfaces, including some that may be predefined and/or some that may be user-defined. A predefined physics interface may be one for which the interface properties are included in Libraries (e.g., 226), and that may, for example, be available from a vendor (e.g., a vendor may supply libraries including defined systems of PDEs, analysis types, GUIs and the like for a particular type of system, such as heat transfer). A user-defined physics interface is configured to allow for user-defined models or physics interfaces for which a user may specify the PDEs, the quantities being modeled, and the like. The user-defined model may be saved in a user-defined library, such as a library included in the User Data files (e.g., 228). Definitions and other data files associated with a user-defined model may be stored in any one of a variety of data formats, for example, similar to those of the Libraries (e.g., 226). It is contemplated that the format and operation may vary for the stored models and model parameters.

Figure 6:
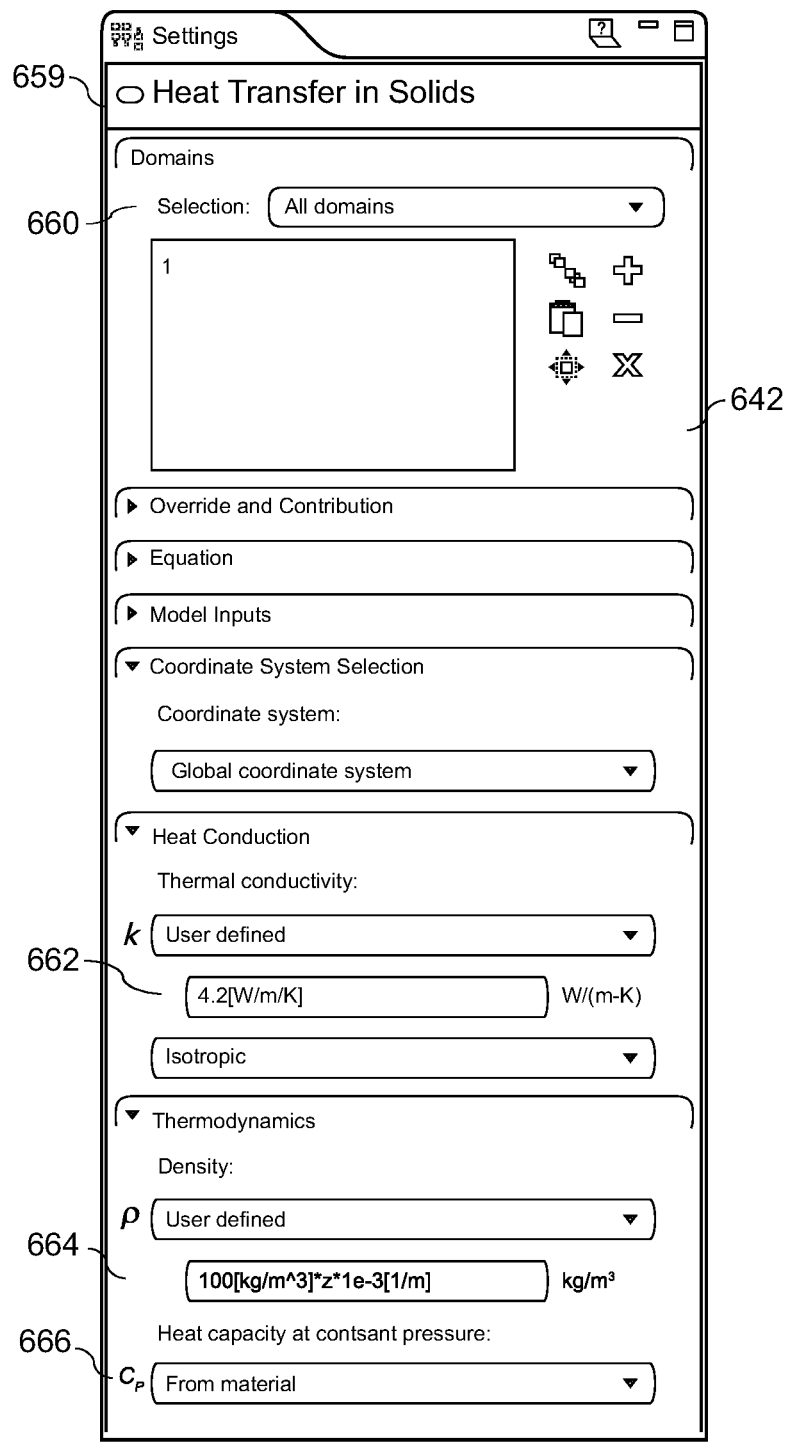
FIG. 6 illustrates an exemplary aspect of a graphical user interface for specifying physical properties for an exemplary physics interface, according to aspects of the present disclosure.

Referring now to FIG. 6, an exemplary aspect of a settings window 659 is illustrated for physical property specification of an exemplary physics interface (e.g., heat transfer in solids). It is contemplated that each physics interface may have one or several GUI settings windows customized to the physics phenomena or process for which the physical properties associated with that physics interface may be specified. The physics interface and the settings for a physics interface may be represented as nodes in a model tree. For example, selecting (e.g., right-clicking on) a physics interface node can open a form where a user can do one or more tasks, such as adding domain properties to a physics interface or a setting, renaming the node, or displaying properties about the selected node.

Settings window 659 includes a domain list 660 that may have one or more geometrical domains to which the physical properties may apply. The domains may also be referred to as subdomains. It is contemplated that a user may select (e.g., via a mouse, keyboard, or other selection feature) one or several subdomains by selecting directly from a graphical representation of the geometrical domain in a graphics window. It is also contemplated that in certain aspects, the user may select domains from a predefined selection of domains that represent a specific part of a component being modeled in a multiphysics model.

The physical properties of the domains (or subdomains) are specified in the settings window. As previously described, the physical properties may be expressed in different forms including being specified as numerical values 662, as symbolic expressions in terms of space coordinate(s) 664, physical quantities and their space derivatives, and/or time. It is also contemplated that physical quantities may also be obtained from a materials setting 666 that may be defined elsewhere in the model and as described elsewhere herein. It is further contemplated that a physical property may be specified via a procedure or routine that computes a value of the property. The name or the procedure or routine may be entered in the setting window 659 along with parameters, if any, to be included. In one exemplary aspect, the procedure or routine may be written using C, Visual Basic®, Fortran, MATLAB®, or Microsoft Excel®. The particular programming language for an implementation may vary in accordance with each particular aspect and the calling standards and conventions included therein.

Figure 7:
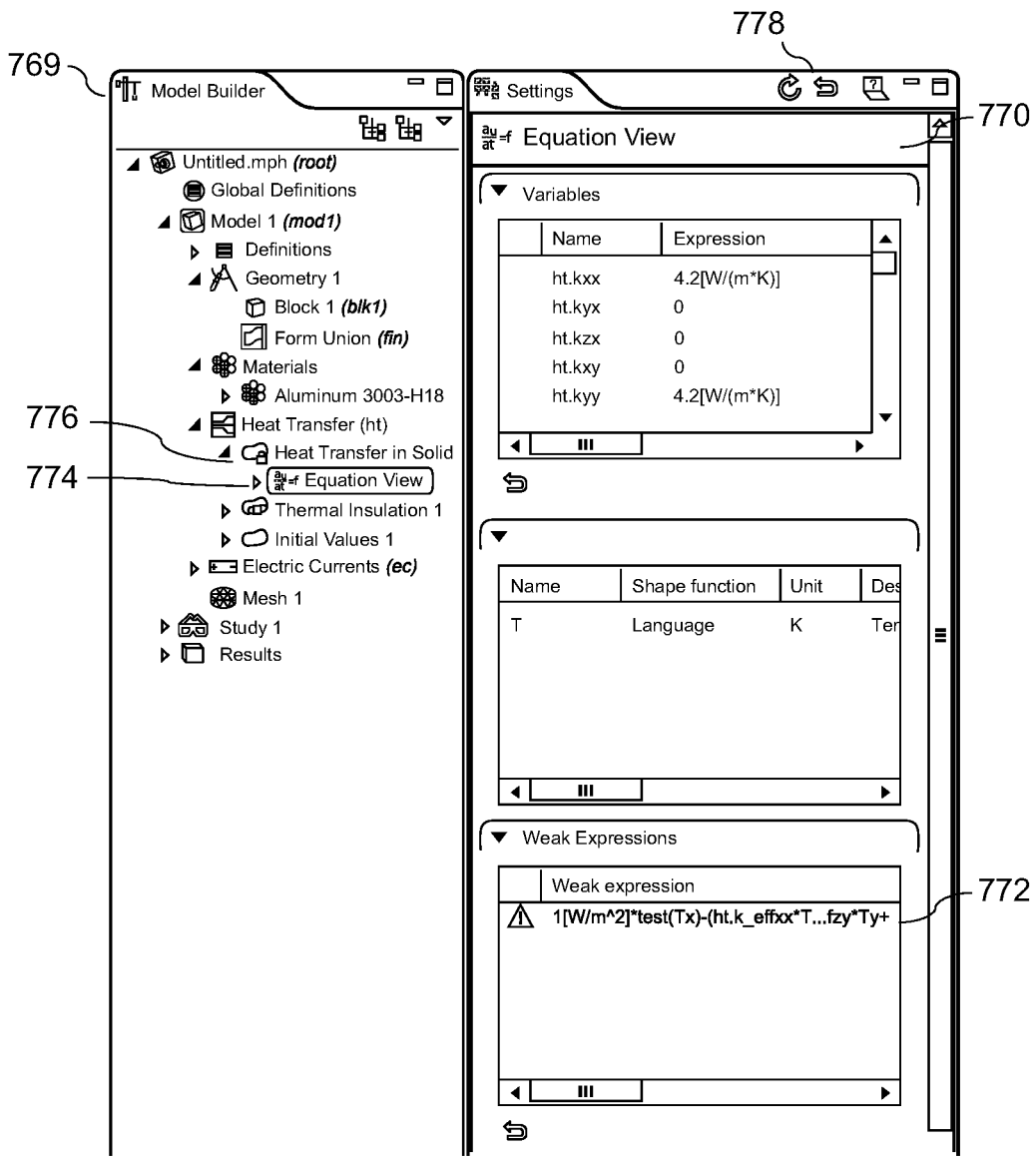
FIG. 7 illustrates an exemplary aspect of a graphical user interface for modifying partial differential equation(s), according to aspects of the present disclosure.

Referring now to FIG. 7, an exemplary aspect of a GUI 769 is illustrated that may be used to modify the PDEs via an "Equation view" window. For example, PDEs, such as the exemplary equation 772, may be defined by a physics interface and further displayed and modified by a user in order to introduce description(s) that may not be defined in the settings windows for the corresponding property. In one exemplary aspect, the PDEs may be displayed in response to a user selecting a "Show equation view" element from a menu. It is contemplated that in certain aspects, each property of the model then displays a corresponding "Equation view" with a corresponding settings window 770 where changes to the equations may be made by a user. The "Equation view" may be represented as a child node (e.g., element 774) to a physics interface property node (e.g., element 776). It is contemplated that in certain aspects following a change to the settings window 770 for an "Equation view" node (e.g., element 774), the corresponding settings for the physics interface property may be locked. In one aspect, a lock indicia may be placed on the physics interface icon (e.g., element 776) to indicate that one or more properties for that interface of the model tree are locked. The property may also be unlocked by the user by, for example, selecting a "Reset all" feature 778, or other unlocking element, in the settings window for the corresponding a corresponding "Equation view" node 774.

Figure 8:
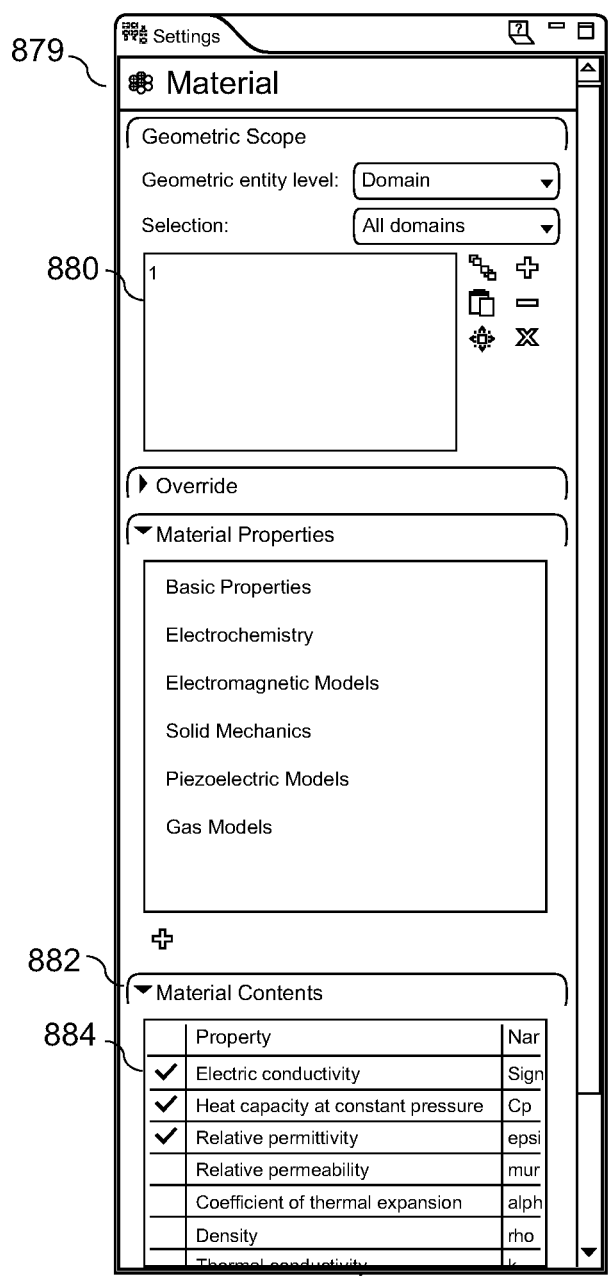
FIG. 8 illustrates an exemplary aspect of a graphical user interface for setting material propert(ies) for a domain in a multiphysics model, according to aspects of the present disclosure.

Referring now to FIG. 8, an exemplary aspect a material settings window 879 is illustrated for setting material properties of a domain. Material settings can include material properties for some or all of the physics interfaces included in a multiphysics model. It is contemplated that a model can include different materials that are selected for the different domains identified in the domain list 880. The material properties may be defined by a user or they may be obtained from a predefined materials library. In one aspect of a material settings window, a material contents 882 list may display a status of the material properties for a selected material, in a selected domain, considering the physics interfaces in the multiphysics model. For example, in the context of an exemplary Joule heating process, the material contents list may label, using an icon, the properties associated with a multiphysics process involving Joule heating and the properties described in a multiphysics interface. The exemplary material properties may include, for example, heat capacity, thermal conductivity, electric conductivity, relative permittivity, and density. The material properties for describing Joule heating may be defined via the material settings window 879. Any required material properties may be labeled or otherwise identified with an icon 84 or other indicia (e.g., check mark). If a required material property is not defined, the material contents 882 list can identify the condition by highlighting the corresponding material property row (e.g., using a red stop sign icon).

It is contemplated that materials and material properties defined by a user can be saved and later accessed from user-defined material libraries for use in separate or different models. This aspect provides versatility by allowing users to create material libraries for specific applications and further can allow system developers to create material libraries for use with a multiphysics modeling system.

It is contemplated that materials and materials properties in a modeling system may be represented via nodes in a model tree. This can allow for materials and material properties to be displayed, renamed, and/or added to a node in a form accessible by a user (e.g., by right-clicking or otherwise selecting the corresponding node in the model tree).

Figure 9:
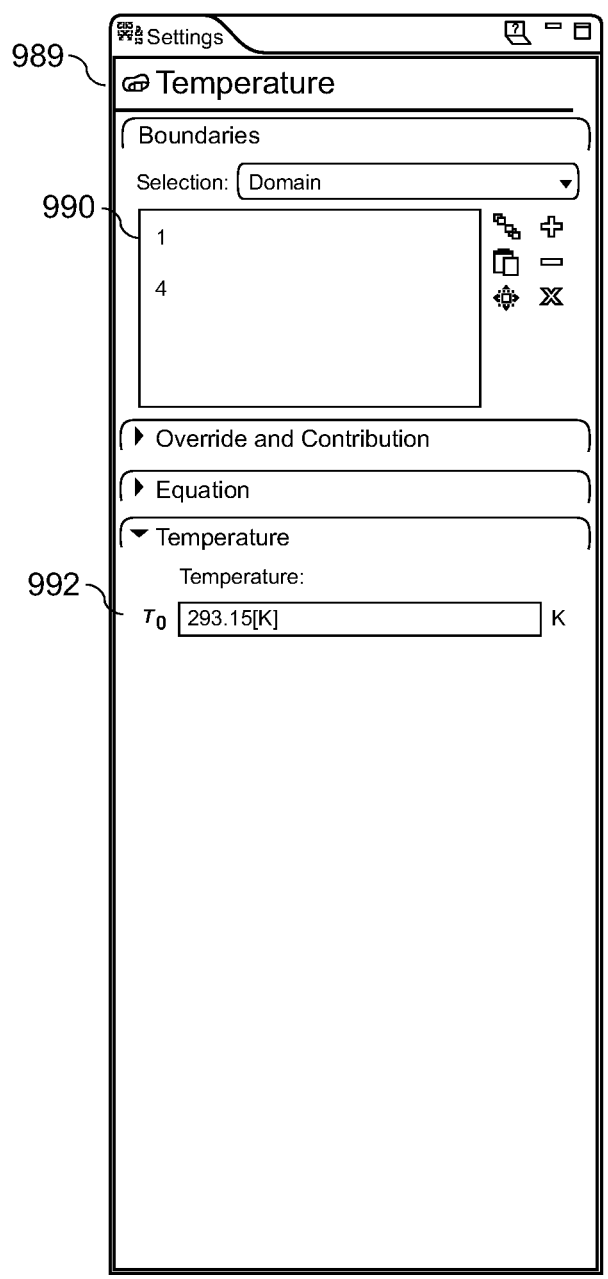
FIG. 9 illustrates an exemplary aspect of a graphical user interface for setting physical boundary condition(s) for an exemplary physics interface, according to aspects of the present disclosure.

Referring now to FIG. 9, an exemplary aspect of a boundary condition settings window 989 is illustrated for a physical property boundary condition (e.g., temperature) for a physics interface (e.g. heat transfer interface). The settings window 989 may include a boundary list 990 to identify the geometric boundaries on which physical propert(ies) may apply. It is contemplated that a user can include one or more boundaries in the boundary list by selecting a boundary from graphical representations of the geometrical domain in one or more graphics windows. Selection of the boundary can occur via a selection-type device typically used for a computing system (e.g., mouse, keyboard, other selection device). It is further contemplated that a user may also select boundaries from a predefined selection of boundaries representing a specific portion of the boundary of a component being modeled in a multiphysics model (e.g., boundary selection). The specific portion may include the entire, or something less than the entire, boundary of the component.

The physical properties of geometrical boundaries can be specified in the boundary condition settings window 989 for a corresponding boundary. The properties can be expressed as values 992 specified in terms of numerical values, as symbolic expressions in terms of the space coordinates, or based on time. It is also contemplated that the properties can be expressed as the physical quantities and the corresponding space derivatives from a physics interface added using systems described elsewhere herein. It is further contemplated that a procedure or routine to determine the value of a property may also be specified and/or named in a manner similar to as described elsewhere herein.

It is contemplated that boundary condition settings in a modeling system may be represented via nodes in a model tree. This can allow a user to add boundary properties to a physics interface boundary condition, to rename a node, or to display properties about a node (e.g., by right-clicking or otherwise selecting the corresponding node in the model tree).

Figure 10:
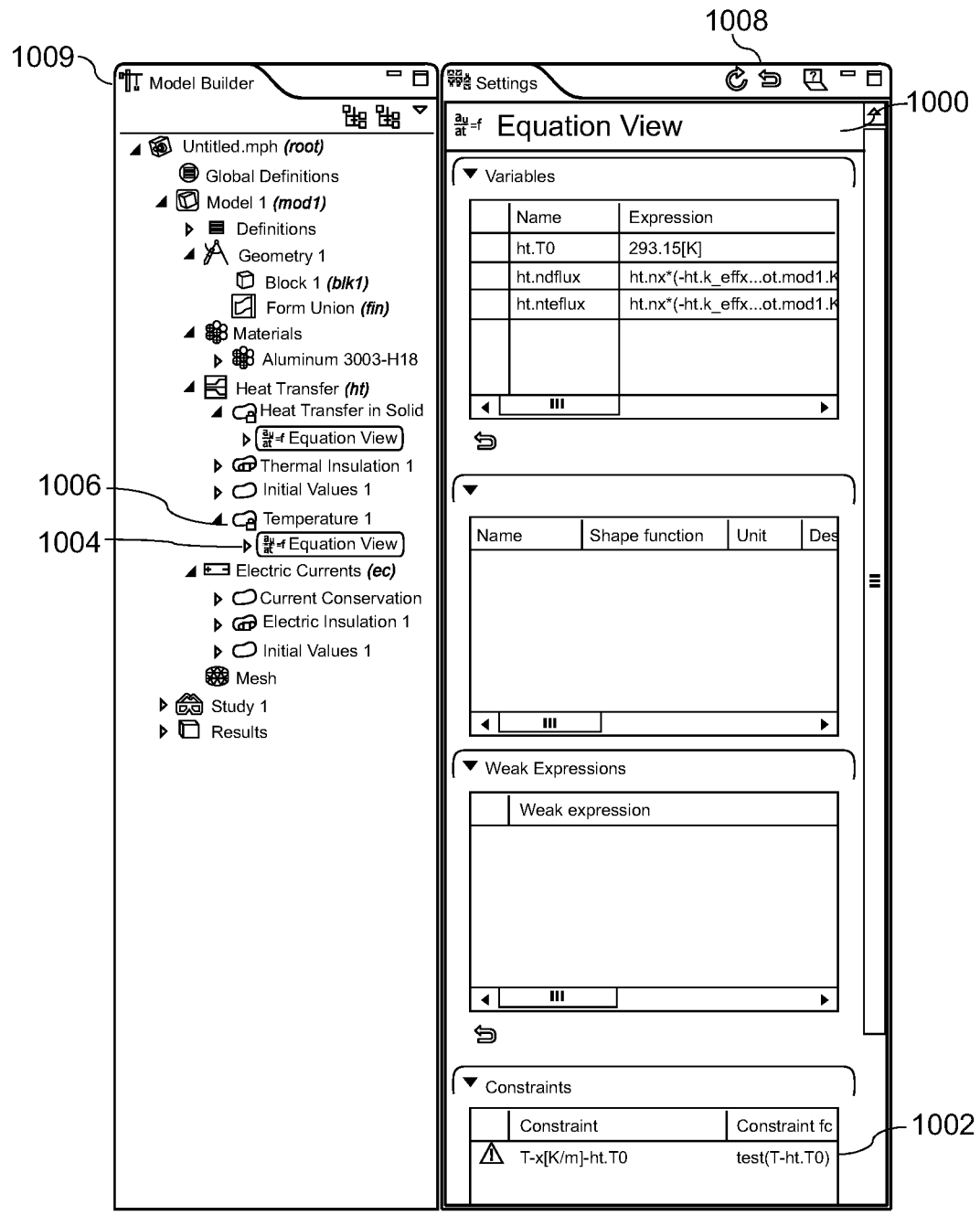
FIG. 10 illustrates an exemplary aspect of a graphical user interface for modifying partial differential equation boundary condition(s), according to aspects of the present disclosure.

Referring now to FIG. 10, an exemplary aspect of a GUI 1009 is illustrated for modifying PDE boundary conditions via another "Equation view" feature 1000. Boundary conditions defined by a physics interface may be displayed 1002 and modified by a user in order to introduce description(s) that may not have been defined in the settings window(s) for the corresponding physics interface. In one embodiment, the boundary equations may be displayed by a user selecting, for example, a "Show equation view" item from a Preferences menu (not shown). It is contemplated that following a change to the PDE boundary equations using the "Equation view" feature (e.g., equation view node 1004), the corresponding settings for that boundary condition may be locked. To identify the locked nature of the boundary condition, the boundary condition node 1006 for the boundary condition property in a model tree may include an indicia that looks like a lock. The boundary condition may be unlocked by the user selecting "Reset all" 1008 in the settings window, or some other unlocking feature, for the corresponding property.

Figure 13:
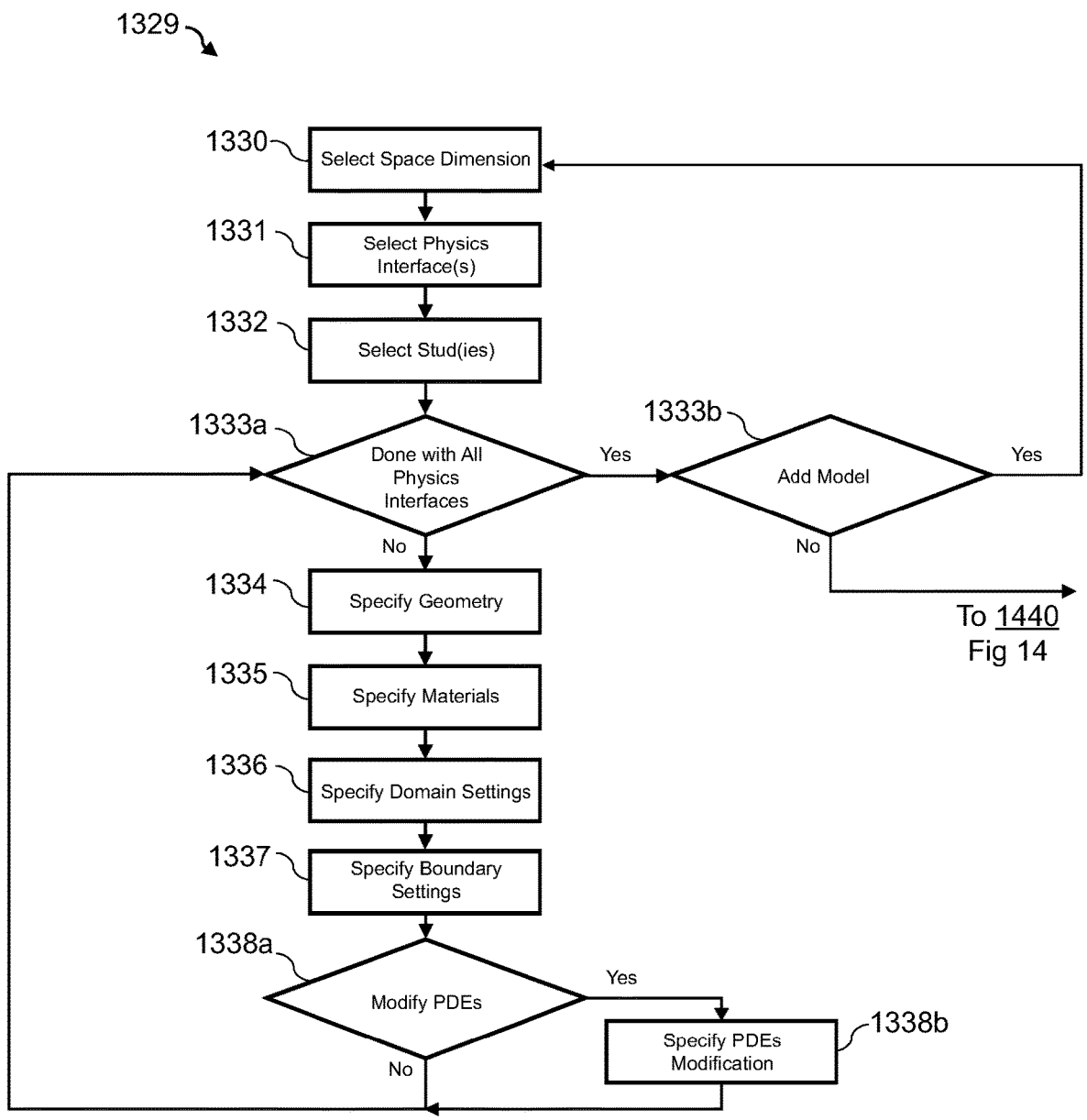
FIGS. 13-15 are flowcharts of steps for an exemplary aspect for specifying and solving systems of partial differential equations in a multiphysics modeling system, according to aspects of the present disclosure.
Figure 14:
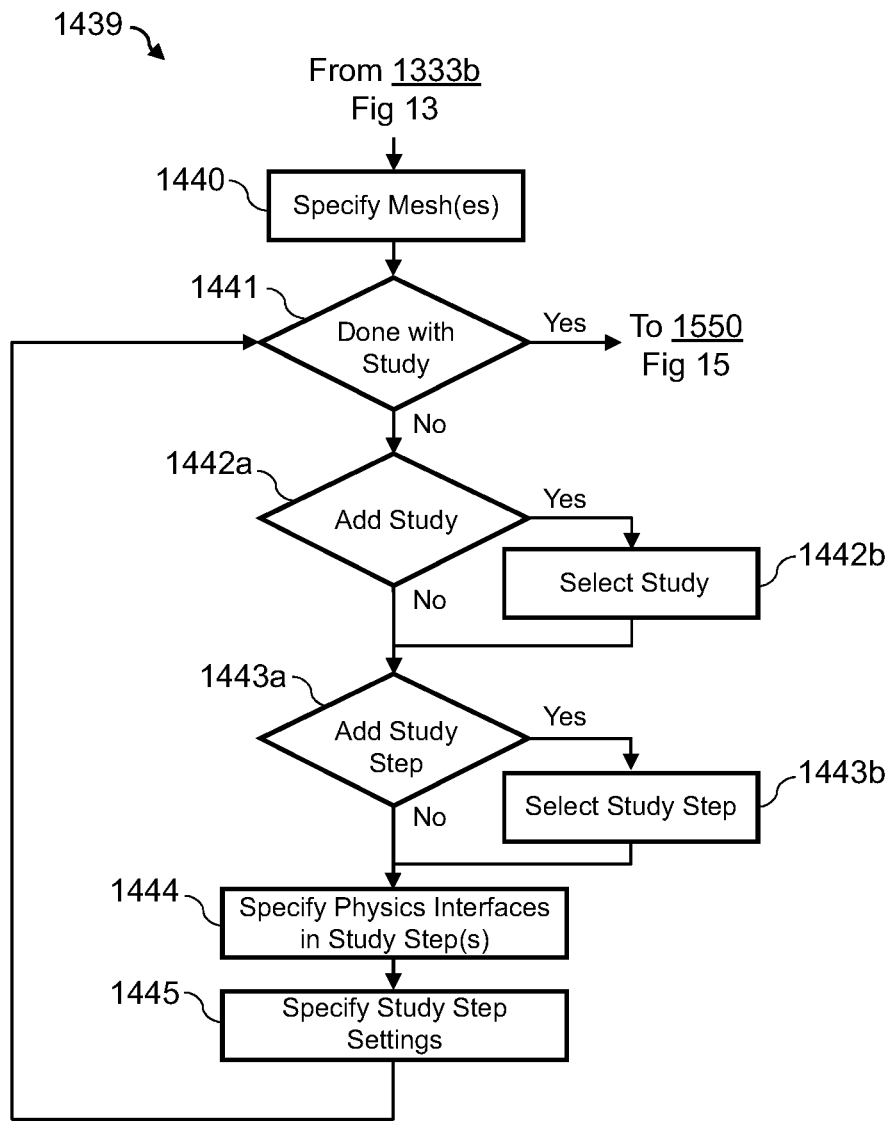
Figure 15:
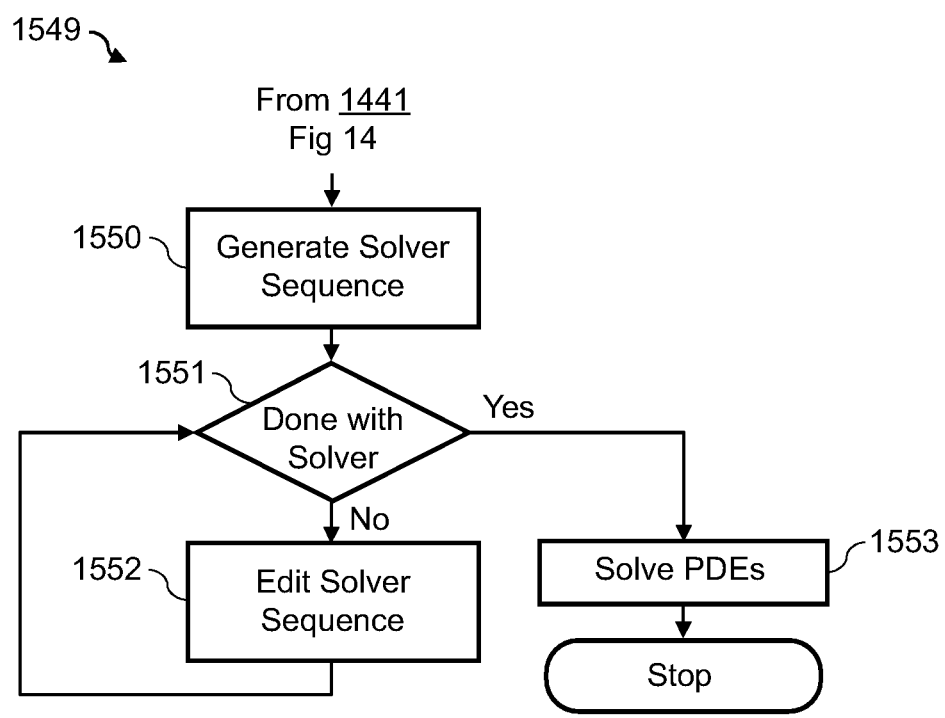

It is contemplated that in certain aspects of a modeling system it may be desirable for the PDEs and boundary conditions for the various selected physics interfaces associated with a coupled system of PDEs to be stored in a model object (e.g., model data structure), which is described in more detail in the descriptions for FIGS. 13-15. A model object may be desirable because if the PDEs and boundary conditions are modified, for example, using the GUI 769 in FIG. 7, the corresponding model object may be updated accordingly. For example, through the use of the settings windows for domains and boundaries, respectively, the physical properties for the domains and boundaries along with possible modifications specified in "Equation view", the Modeling and Simulation Module 222 (see, e.g., FIG. 2) in one exemplary aspect may create, initialize, and modify a model object that includes data associated with a multiphysics model (e.g., multiphysics model data structure). It is furthermore contemplated that the coupled system of PDEs and associated boundary condition fields may be updated, as well.

Figure 11:
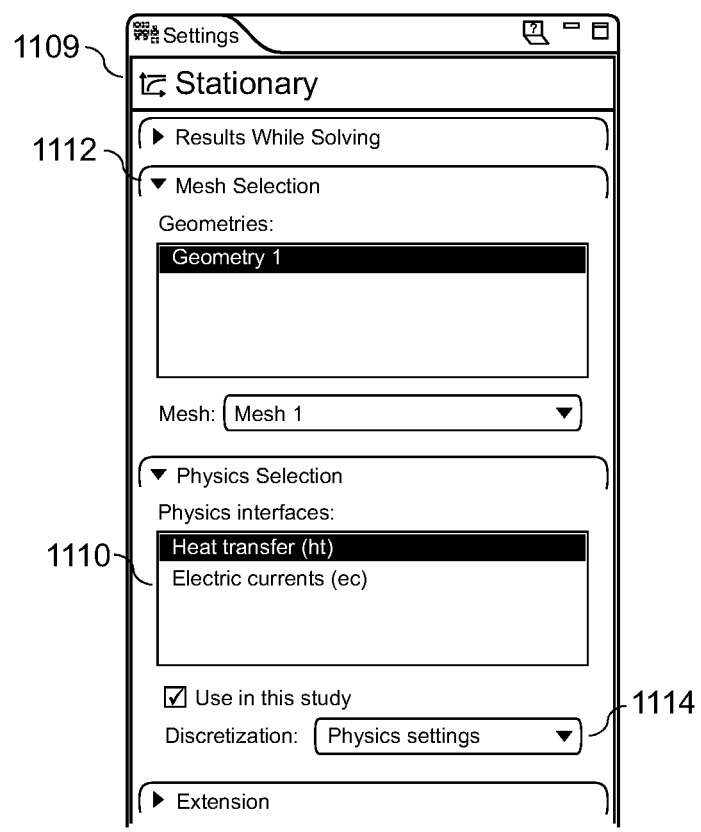
FIG. 11 illustrates an exemplary aspect of a graphical user interface for a setting window associated with a study step used to solve a study including partial differential equations, according to aspects of the present disclosure.

Referring now to FIG. 11, an exemplary aspect of another type of settings window 1109 is illustrated for a study step (e.g., stationary, time dependent, frequency) that may be used in connection with solving for a study having one or more study steps. The settings window 1109 may be associated with solving PDEs for any subset of physical quantities from any one or more physics interfaces, or from a coupled PDE system. The GUI for the settings window 1109 includes a physics interfaces display area 1110 that lists the one or more physics interfaces selected for a multiphysics model. The settings window 1109 may also be configured to allow a selection of different meshes 1112 along with different discretization 1114 and tolerances for different study step. It is contemplated that the particular physics interfaces for a model may be selected along with corresponding study step settings. Then, the corresponding PDEs may be solved one at the time in different study steps or the corresponding PDEs may be solved for several physics interfaces as a coupled system of PDEs in each study step.

Figure 12:
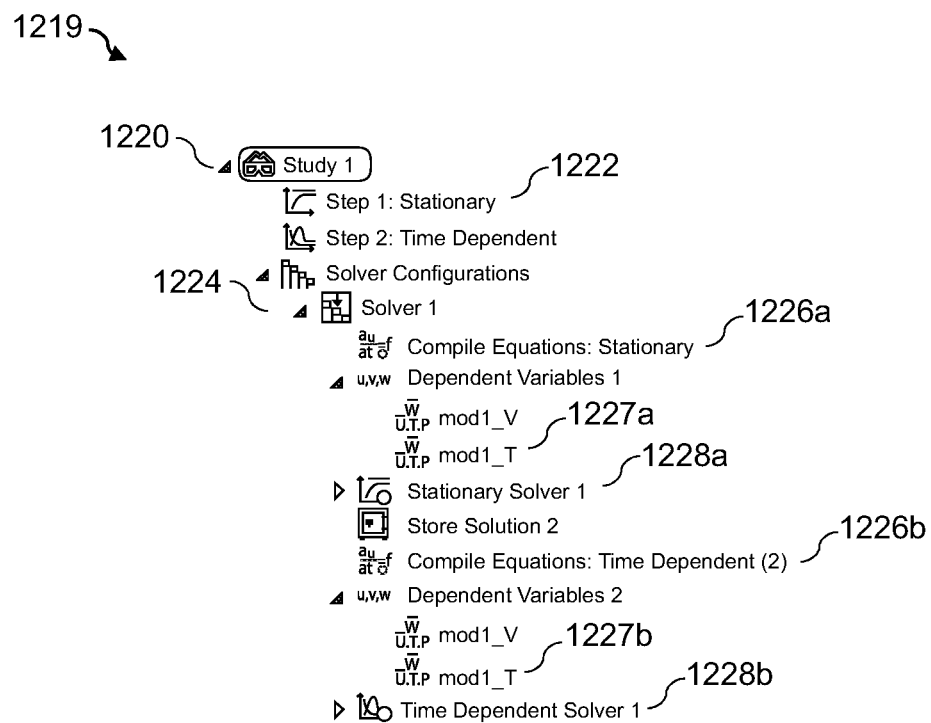
FIG. 12 illustrates an exemplary model tree including a primary node with secondary nodes, according to aspects of the present disclosure.

Referring now to FIG. 12, an exemplary aspect of a model tree 1219 is illustrated that includes a study node (e.g., "Study 1" 1220) along with several child nodes (e.g., "Step 1: Stationary" 1222, "Solver Configurations"). The child nodes in this exemplary aspect include study steps (e.g., "Step 1: Stationary" 1222, "Step 2: Time Dependent") and solver node(s) (e.g., "Solver 1" 1224). A parent node (e.g., primary node) and its child nodes (e.g., secondary nodes, subnodes) may be referred to as branches in the model tree (e.g., the study branch 1219). The study branch may include, for example, PDE formulations (e.g., "Compile Equations: Stationary" 1226a, "Compile Equations: Time Dependent 2" 1226b) and solver settings (e.g., "Stationary Solver 1" 1228a, "Time-Dependent Solver 1" 1228b) for the different studies (e.g., a stationary and a time-dependent analysis, respectively). It is contemplated that a user may select a subset of the models physics interfaces to be solved in each of the study steps or select to solve for all physics interfaces in every study step. It is further contemplated that a user may also include several model nodes (e.g., model component nodes) with corresponding physics interfaces, representing models described in different spatial dimensions, and solving a subset of the physics interfaces in each of the study steps or all physics interfaces in every study step. The selection of physics interfaces in each study step and the settings for a study step can also be included in a model object.

The solver branch (e.g., Solver Configurations) of exemplary model tree 1219 is a child node to the study branch (e.g., Study 1) and can also include its own child nodes, such as a solver (e.g., "Solver 1") and/or a dependent variable node (e.g., "Dependent Variables 1"). These child nodes may further have additional or their own child nodes, such as "mod1_V" 1227a and "mod1_T" 1227b. The dependent variable node may be configured to allow a user to make a finer selection of the solution in every study step, so that the solver may be set to solve or not solve for individual variables within a physics interface. It is contemplated that a selection of dependent variables in the solver step and the settings for a solver step are also reflected in the model object.

The exemplary aspects of the modeling system presented in FIGS. 3-12 are merely examples and are understood to apply to broader physics processes and physic phenomena, not just the processes or phenomena described herein or illustrated in the FIGS. For example, it would be understood that many different physics interfaces may be evaluated beyond the selected physics for heat transfer that is illustrated in FIG. 4. As another example, it is also understood that the multiple equation views can be viewed in FIG. 7 or that many different material properties may be selected in FIG. 8. The illustrated aspects are merely examples of the broader operations that may be performed by the multiphysics modeling system. Furthermore, the illustrated interfaces are representative of one type of interface that may be used in a multiphysics modeling system. Other types of graphical, user, or alternative input-type interfaces are contemplated.

Referring now to FIGS. 13-15, non-limiting exemplary flowcharts 1329, 1439, 1549 are illustrated for method(s) including acts for automatically specifying one or more systems of PDEs, representing the system of PDEs in a single coupled form, and solving for the system of PDEs. The various aspects described for the present disclosure can be implemented using object-oriented programming languages (e.g., Java®, C++, C#) where an object is a type of data structure that includes data fields and methods along with their interactions. For example, objects in a model can be created, modified, and accessed by method calls for a model object. A model object may include the algorithms and data structures for the model and may be further used to represent the model. The model object can further include methods for setting up and executing sequences of operations to create geometry, meshes, and solutions for the model.

It is further contemplated that the methods of the model object can be structured in a tree-like manner, such that methods calls can be associated with the operations represented by the nodes in a model tree. By operating with such a tree-like or model-tree type structure, top-level methods (e.g., represented as parent nodes) may return references that support further methods (e.g., represented by child nodes or otherwise). At certain levels within the model object, the method will perform certain acts, such as adding data to the model object, performing computations, or returning data. In the exemplary aspect of a geometry node (see, e.g., FIG. 29), a model object may have different operations associated with the geometry of a model that are represented by secondary nodes (e.g., child nodes) to a geometry node.

Referring now to FIG. 13, at step 1330, a space dimension is selected either directly (e.g., actual selection) or indirectly (e.g., through a step associated with a predefined feature) by a modeling system user. It may be desirable for the selection of a space dimension to occur using the wizard window previously described in FIG. 3 or through another type of interface. Selection of the space dimension can include an automatic update of a model object with a model item having the method call syntax, model.modelNode( ).create( ), and/or a geometry item that specifies the space dimension using the method call syntax, model.geom( ).create( ).

Next, at step 1331, the selection of physics interface(s) may be performed. The selection(s) can occur using, for example, the wizard window described for FIG. 4. Selection of the physics interface(s) can include updating the model object and adding corresponding physics item(s) in the model object, model.physics( ).create( ). Next, at step 1332, the type(s) of stud(ies) may be selected. For example, the selection of a study may be made using the wizard windows previously described in FIG. 5. It is contemplated that the selected stud(ies) can be later used to automatically generate equation formulations and solver settings. It is further contemplated that the model object can be updated with a corresponding study item, model.study( ).create( ). In certain aspects, some or all of the created model object items may be equipped with child items that may be represented by nodes in the model tree. The nodes may describe the operations specified in the model wizard and/or in the settings windows described above.

At step 1333a, a determination is made if the settings for the physics interfaces have been selected. If the logical determination is true, the method then proceeds to step 1333b, where another determination is made if a model is to be added. If another model (e.g., model component) is to be added (i.e., true) to the component(s) and/or process(es) already received by the modeling system, the method then returns to step 1330 to receive input associated with the additional model. A new model item, model.modelNode( ).create( ), may then be added including a model item with different or the same space dimensions than the already available model. This allows for the simulation of multiple processes in a multiphysics model. If no additional models are to be added (i.e., false), the method can proceed to step 1440. If the logical determination in step 1333a is false, the method then proceeds to step 1334, where for each physics interface a geometry is specified, except for zero-dimensional physics interfaces where the assigned geometry is a point. It is contemplated that geometric representation(s) may be created or otherwise imported from a geometry file (e.g., a file created using a CAD system). It is further contemplated that the model object for the geometry can be updated to include a geometric representation.

At step 1335, a specification of materials and corresponding material properties is made. It is contemplated that selection of materials and material properties may be performed, for example, using the settings windows previously described in FIG. 8. It is further contemplated that the model object may be updated with a corresponding material item, model.material( ).create( ). Next, at step 136, the specification of physical properties in the different domains and for the different physics interfaces may be performed. It is contemplated that the specification of domain settings may be performed, for example, using the settings windows previously described in FIG. 6. At step 1337, the physical properties and interactions at the boundaries may be specified for the different physics interfaces. It is contemplated that the specification of boundary conditions may be performed, for example, using the settings windows previously described in FIG. 9. It is further contemplated that the model object can be updated for both domain settings and boundary conditions using model object items of the type, model.physics( ).feature( ).

At step 1338a, a determination is made if any of the PDEs for the physics interfaces are to be modified. If the logical determination is true, the method proceeds to step 1338b, where predefined PDEs for some or all of the physics interface(s) can be changed, including domain equations and/or boundary conditions. It is contemplated that specification of the predefined physics interface equations in the PDEs modification step may be performed, for example, using the settings windows previously described in FIGS. 7 and/or 10. Step 1338b may also include updating the model object. If the logical determination is false, or after the PDE modification step is performed, the method may then proceed back to step 1333a.

Upon completion of the specification of all physics interfaces and upon no more models being added for the component(s) and/or process(es) being modeled, the method then proceeds to FIG. 14 and step 1440 where the mesh(es) may be specified (see, e.g., FIG. 11). It is contemplated that the specification of the mesh can include updating the model object with a mesh item, model.mesh( ).create( ). Next, at step 1441, a determination is made if all the desired study parameters have been included for the model. If the logical determination is true, then the method proceeds to step 1550. If the logical determination is false, the method proceeds to steps for adding a study and/or adding a study step. For example, at step 1442a, a determination is made if a new study is to be added. If the logical determination is true, then the method proceeds to step 1442b, which allows for the selection of the additional study. It is contemplated that the additional study may be added according to study item, model.study( ).create( ). Following the selection of the additional study or if the logical determination in step 1442a is false, the method can proceed to step 1443a, where a determination is made if study step(s) are to be added. If the logical determination is true, the method proceeds to allow study step(s) to be added for the model at step 1443b. Once the study step(s) are selected or if the logical determination at step 1443a is false, the method proceeds to steps 1444 and 1445 where the physics interfaces in the study steps are specified along with the study step settings. It is contemplated that the study settings may be specified, for example, using the settings window described for FIG. 11. It is further contemplated that study settings may update the model object according to one or several items of the type, model.study( ).feature( ).set( ). Following completion of the study settings, the method proceeds to step 1550.

Referring now to FIG. 15, at step 1550, a solver sequence is generated, and at step 1552, the solver sequence can be edited based on a decision at step 1551 depending on whether the solver is determined to be complete. It is contemplated that the solver sequence can update the model object by creating an item, model.sol( ).create( ), based on the stud(ies) associated with the model object. It is further contemplated that the solver sequence can be edited with items being added according to the model object item, model.sol( ).feature( ).create( ). Then, at step 153, the method solves the PDEs and can generate a solution for the model. It is contemplated that the solution step can be updated by the model item, model.sol( ).runAll( ).

What has just been described in FIGS. 13-15 are non-limiting exemplary aspects of method(s) for automatically forming one or more sets of PDEs associated with one or more physics interfaces and one or more geometric representations (e.g., models that represent components or processes) in different space dimensions. It is contemplated that in certain aspects of the method(s), the PDEs may be combined into a single, combined system of PDEs. A numerical solver, such as a finite element solver may be included, for example, in Modeling and Simulation Module (e.g., 222) and may be used to solve a system of PDEs. The finite element solver, for example, may solve a single system of PDE corresponding to a single physics interface or may solve for a coupled system of PDEs corresponding to several physics interfaces and several geometric representations (e.g., represented by model nodes).

Figure 16:
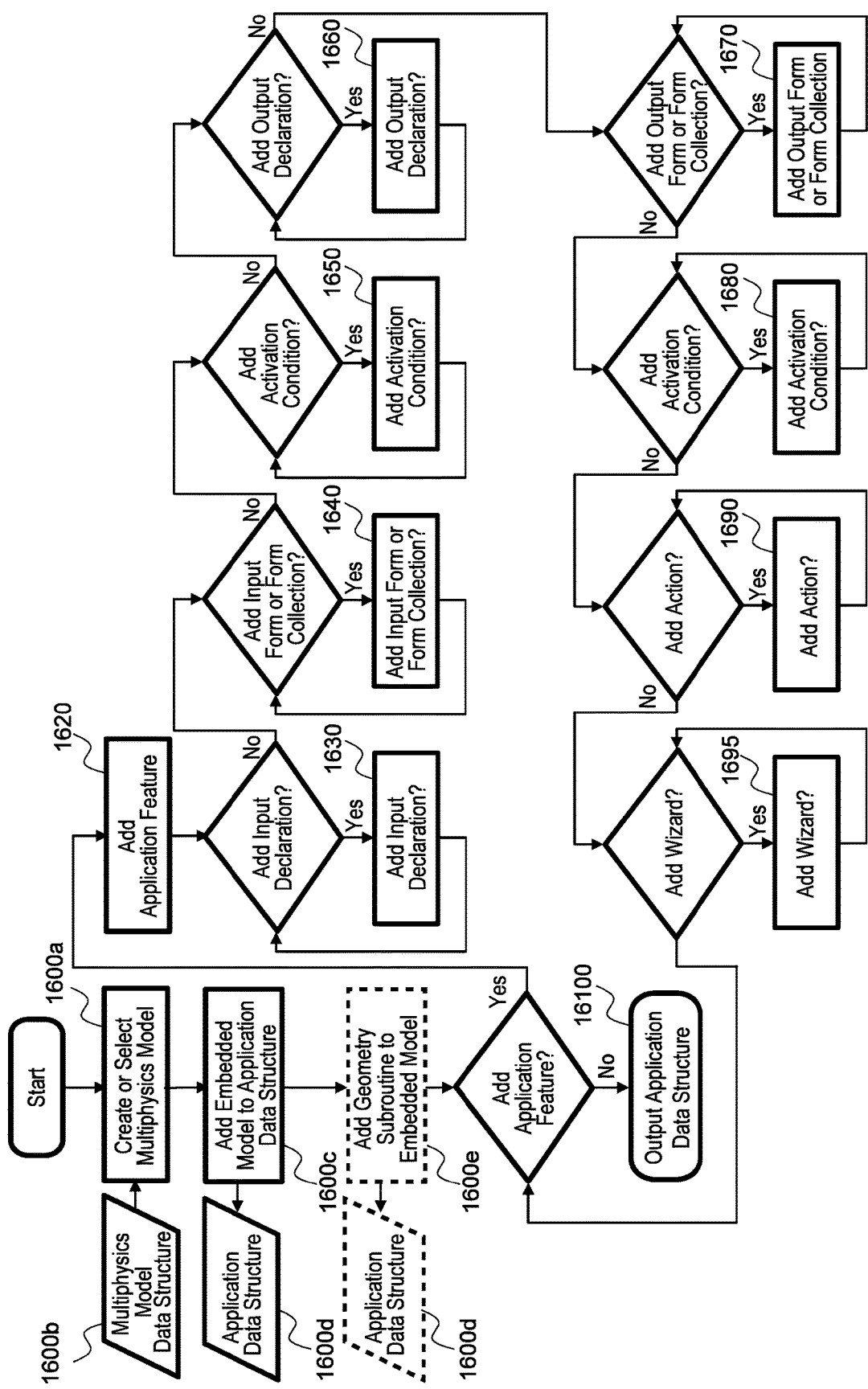
FIG. 16 illustrates a flowchart for an exemplary aspect of a method for creating an application data structure that includes adding a geometry subroutine, according to aspects of the present disclosure.

Referring now to FIG. 16, a flowchart is illustrated that includes method steps for some aspects of a method for creating or forming an application data structure (e.g., application object). The method may be implemented on any one of the systems and apparatus described elsewhere herein. The illustrated method steps can be available to a user through a user interface in an application builder module. In some aspects of the present disclosure, application data structure(s) that are produced or created by the described method(s) can be loaded into (e.g., executed in) multiphysics modeling system(s), such as system(s) described elsewhere herein, to generate customized application model(s), with corresponding application model tree(s), for controlling selected settings in a multiphysics model. In certain aspects, a resulting application data structure can include a reference to its own application-specific desktop design, which when loaded into (or executed in) a multiphysics modeling system, customizes the multiphysics modeling systems desktop. The application model can then be accessed by a user in the application's own user interface.

The method step for creating or forming an application data structure can begin by creating or selecting a multiphysics model 1600a and retrieving or loading onto the system associated with the method a corresponding multiphysics model data structure (e.g., model object) 1600b. In some aspects, it is contemplated that the multiphysics model data structure can be embedded 1600c, as an embedded model, in an initial application data structure 1600d. It is further contemplated that in some aspects, the saving or storing of a multiphysics model as an application file onto a memory device can also create an initial application data structure with a corresponding embedded model. In some aspects, the creation or forming of an application data structure can also include the act of adding geometry subroutine(s) to the embedded model 1600e (and to the embedded model data structure). The added geometry subroutines are then also embedded in the application data structure 1600d.

In certain aspects, a customized (e.g., application-specific) desktop feature can be added or embedded into the application data structure. The desktop feature can be represented as a node in an application tree. The desktop feature can, upon execution of the application, display a desktop window that includes windows, widgets, and forms. In certain aspects where an application is executed in the desktop of a multiphysics modeling system, a desktop feature may or may not be needed.

Next, at step 1620, another aspect of the steps for creating and forming an application data structure is described where an application feature can be added to the application data structure. The application feature can be represented by an application node in the application tree. The application feature can be used to add an application model node in an application model tree that is created from a resulting application data structure. An application model node in an application model tree can be specified to refer to a setting in a model, such as a multiphysics model. An application feature can also be added to the application model from a widget or form (such as a button, combobox, or a checkbox) in the application's desktop or window when the application data structure is executed.

An application feature is applied to an initial application data structure and used to create a customized application model data structure. An application feature can be identified by a type, a description, and an icon. The type identifier is a unique identifier that may be used to refer to the application feature in the application data structure and can also be displayed next to the feature in the application tree in an application builder module, as may be displayed on a GUI associated with the system on which the application builder module is operating. The description identifier can be displayed in a graphical user interface in a resulting application model tree and may also be descriptive of an operation that the node in the application model tree represents. The description or identifier can also be displayed in a widget or form in a desktop or window, as an alternative to a node in the application model tree. The icon identifier, which may refer to an image file containing the icon's graphics, may also display the icon graphics in the application model tree, or in a widget or form, shown when the application associated with an application data structure is executed on a computer system.

In some aspects, application feature(s) can be defined with restrictions and preferences, which then can be apply to a corresponding application model node in an application model tree, or as an alternative a corresponding widget or form in a desktop or window. A restriction may be defined such that an application model node can only be presented after another node, for example when such a node depends on an operation represented by a previous node. In some aspects, the preferences can be defined such that an application model node, or the widget or form, is shown by default in the application model tree, or in a desktop or window, or that an application model node may be present as a singleton node in an application model tree. In aspects, such a singleton node may only be added once to the application model tree, for example to define a setting such as an initial value or condition.

Next, at step 1630, an input declaration can be added to an application data structure. An input declaration is used to declare a new data field where each data field may have a unique identifier, name, an optional description, or combinations thereof. Several types of input declarations are contemplated. For example, a string data field can be applied to declare a string value, a string array data field can be applied to declare an array of strings of arbitrary length, or a double string array data field can be applied to declare a double-array of strings (e.g., an array where the array elements also are arrays) with arbitrary length(s) for the outer and inner level. As another example, a binary data field can be applied to declare a field that can store any type of data more efficiently using a binary form (e.g., serialization). A data field that stores a large number of floating-point numbers is an example of a field for which it may be desirable to store as a binary field, although it is possible to represent such a field otherwise, such as with an array of strings. It is also contemplated that any of the data fields in an embedded model (e.g., the model embedded in the application data structure, can also be used as input declarations. Such data fields may be parameters in the embedded model that once declared may be accessed by a user of an application based on a created or formed application data structure.

Next, in step 1640, windows, input forms, and form collections can be added to an application data structure. It is contemplated that in some aspects an input form represents a widget or a collection of widgets that listens to or monitors different user actions when the application is executed. A widget may include element(s) of a graphical user interface that display information or provide specific way(s) for a user to interact with the application or a widget can also be a short process for describing what a particular element of a GUI looks like, how it behaves, and how it interacts in response to user actions. An input form can be added to a window or menu associated with an application feature. It is contemplated that an application builder module may include predefined template forms, form collections, and widget collections that can be applied, for example, for creating settings windows.

A few exemplary aspects of input forms are now described.

Figure 25:
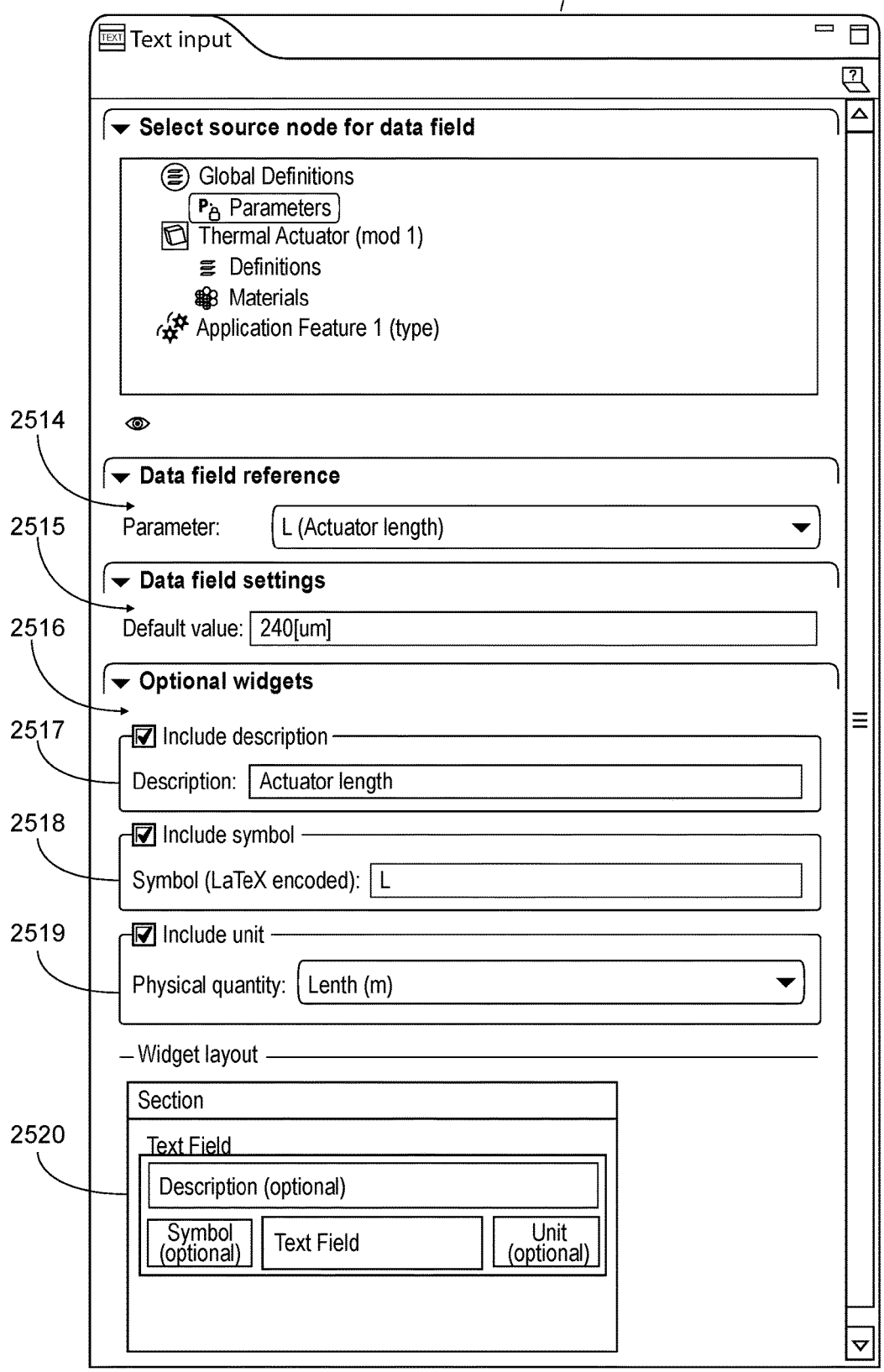
FIG. 25 illustrates an exemplary aspect of a settings window for a text input form, according to aspects of the present disclosure.
Figure 34:
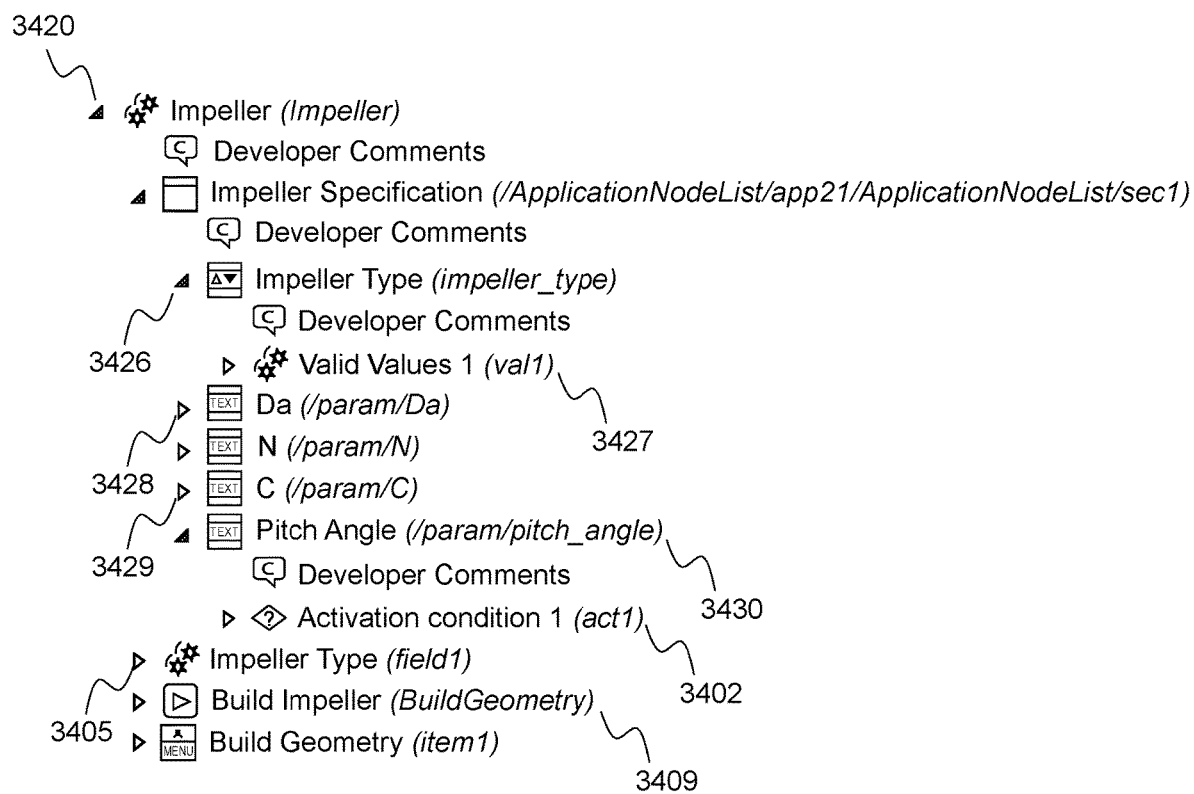
FIG. 34 illustrates an exemplary aspect of an application feature tree for an impeller application feature, according to aspects of the present disclosure.

A text input form can include a text field that links to the value of some string data, which is typically though not always in a text box. In some aspects, linking can include assigning to the text field the value of the string data which may be based on some received input, such as received text input or input received from a combobox. FIG. 25 also exemplifies an aspect of linking where input received in a text input form can be associated with an internal data field in an embedded model (e.g., exemplary parameter, L, for actuator length). FIG. 34 exemplifies another aspect of linking where a combobox (e.g., exemplary impeller type 3426) sets a value of a data field (e.g., exemplary impeller type field 3405) Settings for combobox input forms are contemplated in some aspects to be similar to the setting for text input forms (e.g., FIG. 25).

Apart from selecting any of the string data field objects in an application feature, a string data value in the embedded model can also be selected. An example of such a string data value includes a model parameter. A combo box form can be used to display a list of choices that can include values of some string data, for example a string data field. The settings may be similar to those of the text input. A check box form can be applied to allow a user to select between two alternatives, for example on or off, when an application is executed. A button form can be used in a widget collection to perform an action when clicked or otherwise selected in an application. A menu item form may define a menu item for the menu it is a child to. The parent can be a menu or an application feature. A menu item form that has an application feature as parent may be included in a context menu for that application feature when the application is executed. A table input form can provide for edits to values of string array data field declarations, usually one field reference per column of the table.

A form collection can be applied to group a collection of member forms to achieve a desired layout for an application's user interface. A member form may be an input form or an output form (see below) and may also include widgets as members. Members in a form collection may be added by reference to input and output forms or by directly adding input and output forms as children (e.g., child nodes in a model tree aspect) to the form collection.

It is contemplated that several types of form collections may be available in some aspects of an application builder module. A desktop window can be a type of form collection, and in some aspects, the desktop window form collection can define a frame in a computer desktop where other forms may be displayed upon the execution of an application.

A section panel can be shown inside a desktop window or form window, and can further be associated with an application feature when an application based on a created application data structure is executed. Such a section panel can include a heading bar presenting for example a description and the member forms placed beneath the bar. A form window can include at least one section panel and it is further contemplated that an application feature may automatically obtain one section panel child.

Another type of form collection available in an application builder module can include a menu. Menu(s) can be accessed in, for example, a toolbar in a desktop window, or as a context menu for an application node when the application based on a created application data structure is executed. A menu can include at least one menu item as a child feature or at least another menu as a child feature. A menu may include one or more settings for its description in an application builder module.

A form group can be yet another type of form collection available in an application builder module. A form group can be applied to arrange several other forms into one new form. One such an example includes a situation where several forms are to be shown above each other in a desktop window or settings window when an application based on a created application data structure is executed.

A card stack may be yet another type of form collection. Such a form collection can include a number of predefined forms that are shown depending on choices made by a system user during the execution of an application based on the created application data structure. In some aspects, it is contemplated that only a single member of the forms that is also a member in a card stack is allowed to be active at a given time when an application containing such a form collection is executed. Controlling which of the forms in a card stack that is shown can be implemented by applying activation conditions, which are described in more detail below. Other aspects of form collection can include a desktop window. A desktop window form collection can define a frame in a computer desktop where other forms may be displayed when an application based on a created application data structure is executed. Form windows can be specific and predefined type(s) of desktop window(s). A form window can define a frame where other forms may be shown and positioned in rows and columns. A form window can further be a default window for an application settings window associated with every application feature during the execution of an application based on a created application data structure. A canvas window is yet another type of a specific and predefined desktop window, and thus is also a form collection. A canvas window can be used to display graphics, such as geometries, meshes, and plots when an application is executed.

Next, in step 1650, an activation condition can be added to an input form or form collection added in step 1640. An activation condition can be applied to specify a logical condition that checks the value of an input declaration. For example, for an input form, an activation condition can be applied to determine if the form will be enabled or disabled in the form window during the execution of the application. A disabled form can either be hidden from a window or grayed-out into an inactive state.

Next, in step 1660, an output declaration can be added to an application data structure. Output declarations can be applied to declare data fields that cannot be changed by a user when the application is executed. Instead the declared data fields can be used for reading values from an application or an embedded model in the application data structure. For example, an output declaration can be used for declaring a result from an evaluation in the embedded model when an application based on the application data structure is executed.

Next, in step 1670, output forms or form collections can be added to an application data structure. An output form may represent any widget that displays data from an output declaration or an object in the embedded model that presents data. A plot group in the embedded model is an example of an output form that can be used directly in a canvas window. It is contemplated that in some aspects output forms are updated by an action step (see below) in order to update and display the result of the action during the execution of an application based on the application data structure.

It is contemplated that a plurality of output forms may be desirable to define in an application builder module used to generate an application data structure. A data display output form can be applied to specify a display for output declarations. A data display output form can also include a reference to a global evaluation in the embedded model that is added to the application data structure. The value of such a global evaluation can be updated when the form is executed by an action during the execution of the application. A table data display output form can be a desirable way of presenting a large number of output data from output declarations. For example, it may be possible to use one output reference per column of the table. An export output form can also be used to open an export dialog to save a result to a file during the execution of an application. An export output form may refer to export objects in the embedded model added to the application data structure, and may, for example, include animations, images, and data.

Next, in step 1680, an activation condition may be added to an output form. Such an activation condition can be applied to determine if an output form should or should not be displayed. For example, an activation condition can determine if the output form will be enabled or disabled in the form window during the execution of an application. A disabled form can either be hidden from the window or just grayed-out during the execution of an application.

Next, in step 1690, an action may be added to an application data structure. An action can include definitions for a sequence of operations and can be executed from an input form during the execution of an application based on a created application data structure. For example, the action or sequence definitions can be executed from an input form in response to or following the receipt of a selection of a button or icon. An action can also include an update of an output form. For example, an action can include an update of a plot in the embedded model, which then generates a new plot in a graphics window in an application, using, for example, a canvas window.

Next, in some aspects, step 1695 is contemplated. In step 1695, a wizard can be added to an application data structure. A wizard can be applied to specify a sequence of windows that may be displayed on a GUI one at a time or in various combinations. A wizard can be placed directly under an application root node and can start when a new application model is created during the execution or implementation of an application based on a created application data structure. In some aspects, a wizard can be set up as a child to an application feature and can be started when a new instance of the application feature is created during the execution of the application. It is contemplated that in some aspects that a wizard includes at least one wizard step that is a child node. Such a child node wizard step can include a specification of the window for each step in the wizard. For example, in some aspect each wizard step can include a different window that may be defined in a settings window form.

Next, the method proceeds to determine if additional application features are to be determined or added. If not, the method proceeds to step 16100, where an application data structure is generated as output from the above described method steps.

It is contemplated in some aspects that the application data structure includes the multiphysics model data structure as an embedded model, from the model that the application is based upon, together with a hierarchy that represent the nodes generated by the method steps above.

It is further contemplated that the deployment step of an updated or modified application data structure can include placing the application data structure in a new or in an existing library. A library may represent a real folder structure on a file system, or in a network. Any of the existing libraries can be accessed by a system configured or adapted to create multiphysics model data structure(s) based on an application data structure.

It is contemplated that the above described method for adding application features and generating an application data structure is are associated with a model of a physical system. The application feature(s), including the input declaration(s), form feature(s), activation condition(s), and action feature(s), are contemplated as being represented as data that is added, acquired, received, or transmitted as part of forming or generating a modified or updated application data structure that includes the application features.

Figure 17:
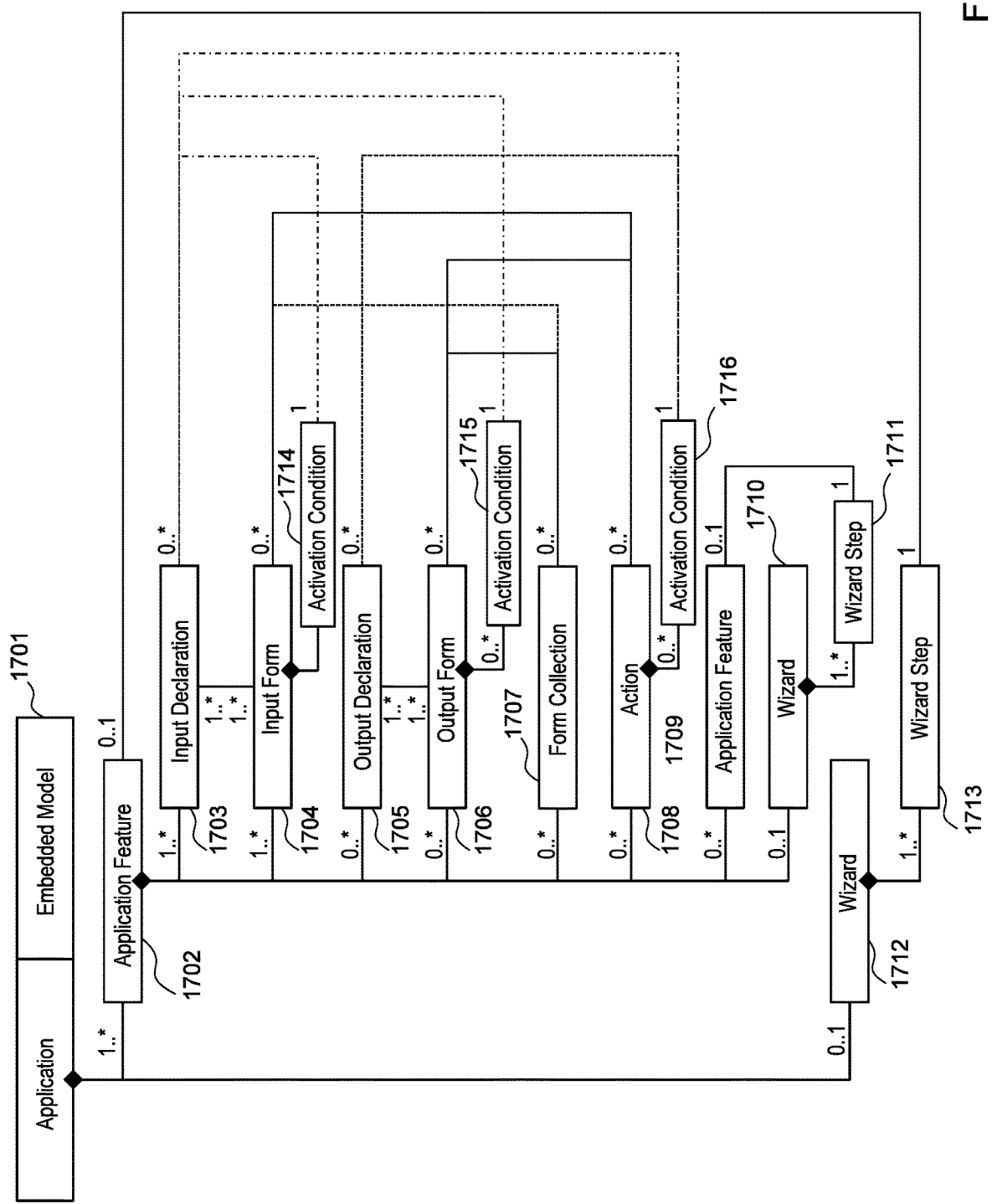
FIG. 17 illustrates an exemplary unified modeling language (UML) object diagram of instance level relationships between features in an application data structure, according to aspects of the present disclosure.

Referring to FIG. 17, an example of a unified modeling language (UML) object diagram of instance level relationships is illustrated between features in some aspects of an application data structure created by the actions for the process described in FIG. 16.

An application data structure can include at least one embedded model 1701 and at least one application feature 1702. As an alternative, an application data structure can include a desktop with desktop windows, forms, and widgets. A plurality or one or more embedded models and application features are also contemplated. An application data structure can include one or more (e.g., 1 . . . *) of input declarations 1703 and one or more input forms 1704, which can further be defined with a corresponding activation condition 1714. An application data structure can also include anywhere from zero to one to a plurality (e.g., 0 . . . *) of output declarations 1705 and output forms 1706 that may also include a corresponding activation condition 1715. One or more (e.g., 0 . . . *) form collections can also be included in an application feature 1702. Such collections can comprise inputs forms and/or output forms. Zero to one or more (e.g., 0 . . . *) actions 1708 can be included in an application data structure that may further be defined with zero to one or more (e.g., 0 . . . *) corresponding activation conditions 1716. In some aspects, an application feature's settings can also be linked to a wizard step 1713 that is includes in a wizard feature 1712. In addition, an application feature can also include child application features 1709 that may also have their own corresponding child features. An application data structure can also include a wizard feature 1710 with corresponding wizard steps 1711 that may link to child application features 1709 of the application feature 1702. In some aspects, a link can be understood to include that the settings made in the wizard may set through setting forms certain activation conditions, values in text inputs, execution of actions, etc. In some aspects, linking can be done by setting values of string data. For example, in FIG. 34, an exemplary settings window for impeller type may be included in a wizard step where an exemplary selection of impeller would then be linked to the impeller type and decide whether or not to show the impeller pitch edit field.

Figure 18:
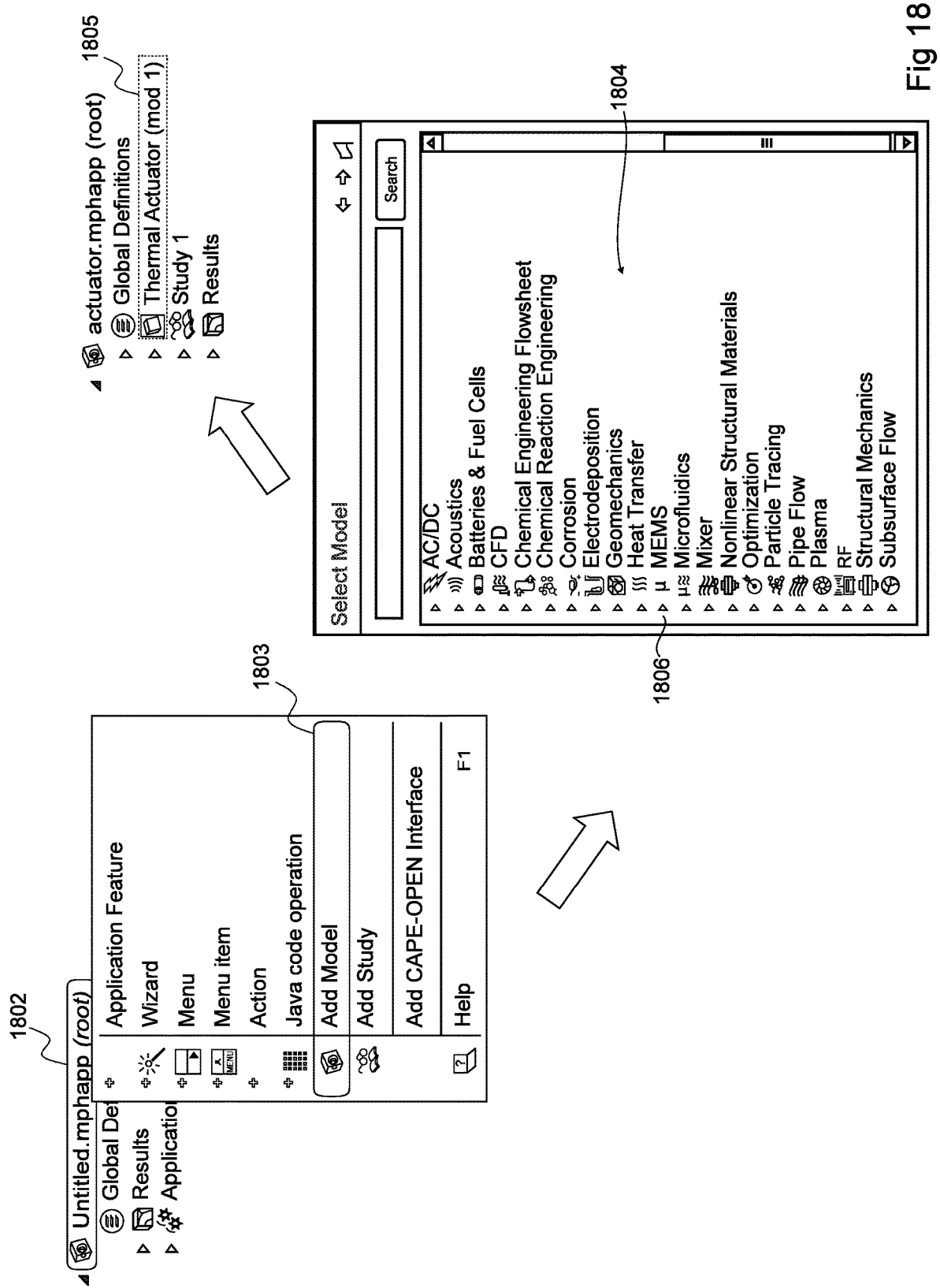
FIG. 18 shows an exemplary aspect of an application tree for adding a multiphysics model to an application data structure, according to aspects of the present disclosure.

Referring now to FIG. 18, an exemplary application tree is illustrated that can be included in some aspects of features 1600*a-d* in FIG. 16 for adding a multiphysics model data structure to an initial application data structure. Right-clicking or selecting a root node 1802 in the application tree can open or display a context menu where a multiphysics model data structure may be added 1803 to the initial application data structure.

The multiphysics model data structure can be selected from a dialog box listing a library of multiphysics models 1804 that may be available from a multiphysics modeling system or that may be or that may have been previously created and stored by a user of a multiphysics modeling system. Any such multiphysics model with its corresponding multiphysics model data structure can describe devices and processes accounting for static and quasi-static electromagnetic fields, time harmonic and dynamic electric fields, acoustics, fluid flow and chemical reactions, heat transfer, structural mechanics, electromechanics, plasma chemistry and physics, fluid-structure interactions, thermal stresses and thermal expansion, electrochemistry, and other coupled physics phenomena and processes. It is contemplated that in some aspects of the systems and methods described in herein that exemplary application features may set the frequency for a time harmonic electromagnetic field (input), run a simulation (action), and display the S-parameters (output) by running a model defined in an embedded model. Another example is an exemplary application feature for receiving an input for updating a reference pressure, running a simulation, and displaying the resulting wave propagation by running an embedded model of an acoustics simulation. Yet another example may be an exemplary application feature that receives an inlet flow rate, runs a fluid flow simulation, and displays the average flow rate at a pipe outlet from a fluid flow model for a tank defined in an embedded model. Yet another example may be an exemplary application feature that determines the size of a heat sink (activation condition, output) required to keep temperature below a given input value (input), for a given input load (input), by running a simulation (action) of a model of an electronic device defined in an embedded model. Yet another example is an exemplary application feature that receives the values of a parameterized plasma reactor, updates the geometry accordingly (action, activation condition), and runs a simulation in order to calculate the deposit thickness of semiconductor materials on the surface of a wafer, by running a plasma reactor model defined in an embedded model.

As a further example it is contemplated that an exemplary model of a microactuator in a micro-electromechanical systems (MEMS) module 1806 of a multiphysics modeling system may be selected. Once selected, the multiphysics model data structure can be represented as a model node 1805 in the application tree and, now referring back to FIG. 16, added to the application data structure according to steps 1610*c* and 1600*d*.

Figure 19:
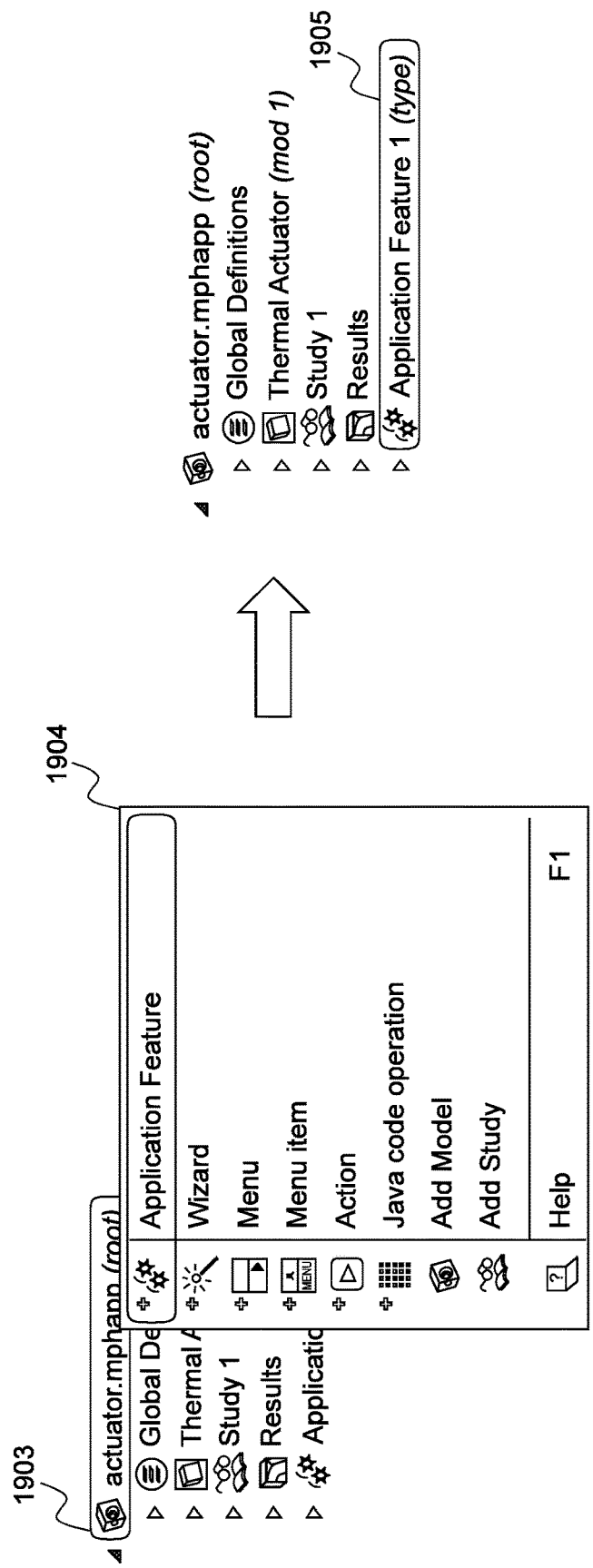
FIG. 19 illustrates an exemplary aspect of an application tree for adding an application feature to an application data structure, according to aspects of the present disclosure.

Referring now to FIG. 19, an exemplary aspect of an application tree is illustrated according to some aspects of step 1620 from FIG. 16 for adding an application feature to an application data structure. Right-clicking or otherwise selecting a root node 1903 in the application tree can open a context menu 1904 where an application feature may be added to the application data structure. As an alternative to a context menu, application feature may be added by clicking the corresponding application feature button from toolbar menus in an application builder desktop. Furthermore, in some aspects, an application can also include an application feature node, widget, or form, which is present by default when a new application is created when the application data structure is executed. The application feature can be represented as an application feature node 1905 in the application tree. The application feature can be applied to represent settings in an exemplary model of a device, for example a thermal microactuator, which is further described by the multiphysics model data structure.

Figure 20:
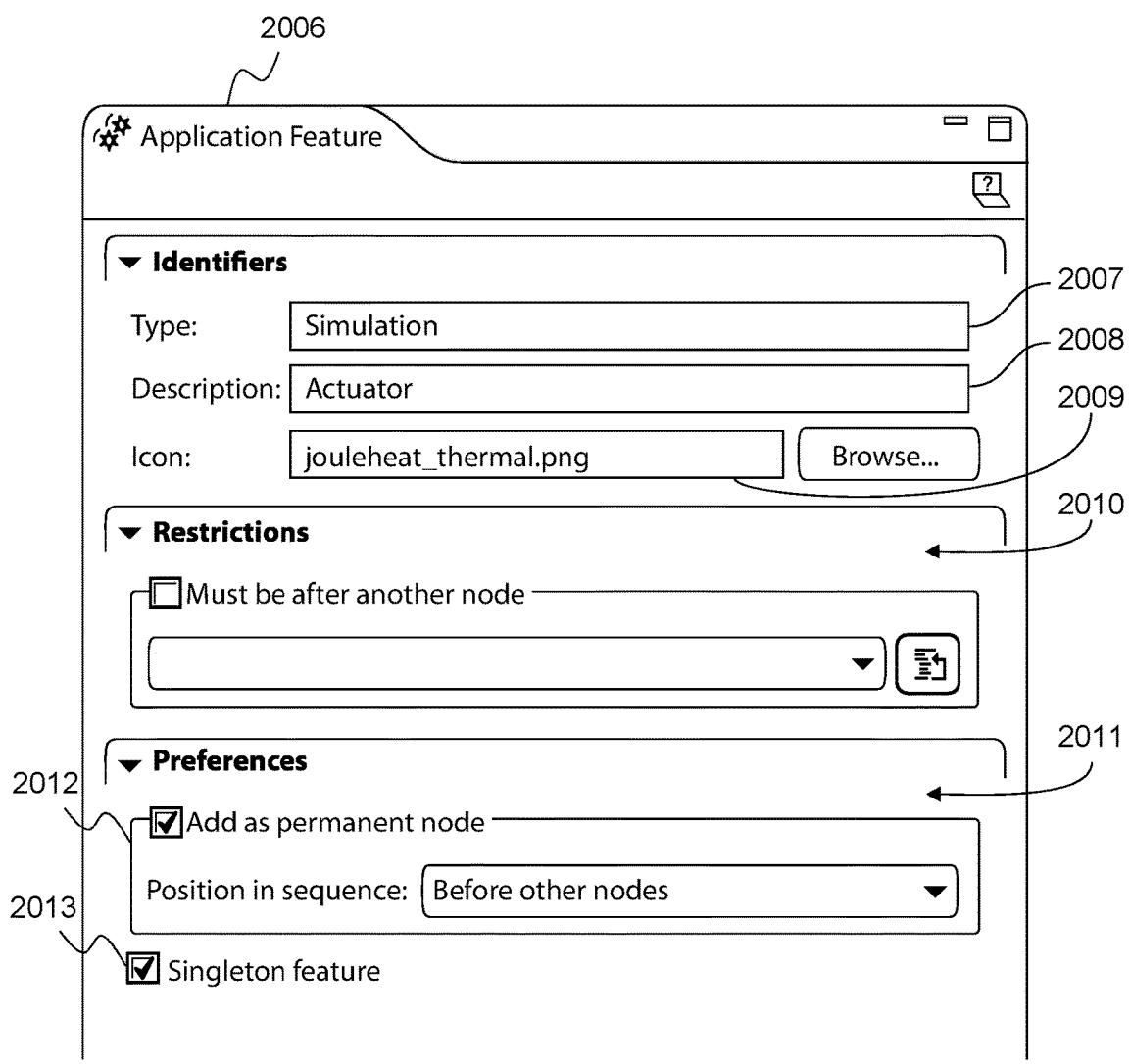
FIG. 20 illustrates an exemplary aspect of a settings window for an application feature, according to aspects of the present disclosure.

Referring now to FIG. 20, an exemplary settings window 2006 is illustrated for one exemplary application feature representing settings for the thermal microactuator in the multiphysics model according to some aspects of a method for creating an application data structure. The settings window for the application feature can include a type 2007, a description 2008, and an icon edit field 2009. It can also include setting window sections for restrictions 2010 and preferences 2011. In the preferences section, the "add as permanent node" check box 2012 can be selected, which when selected implies that this node will always be shown in the application model tree when the application is used. As an alternative, also a checkbox for adding a permanent widget or form may be shown. A singleton checkbox 2013 can also be used to specify that an application feature can only be present alone in the application model tree when the application is executed.

Figure 21:
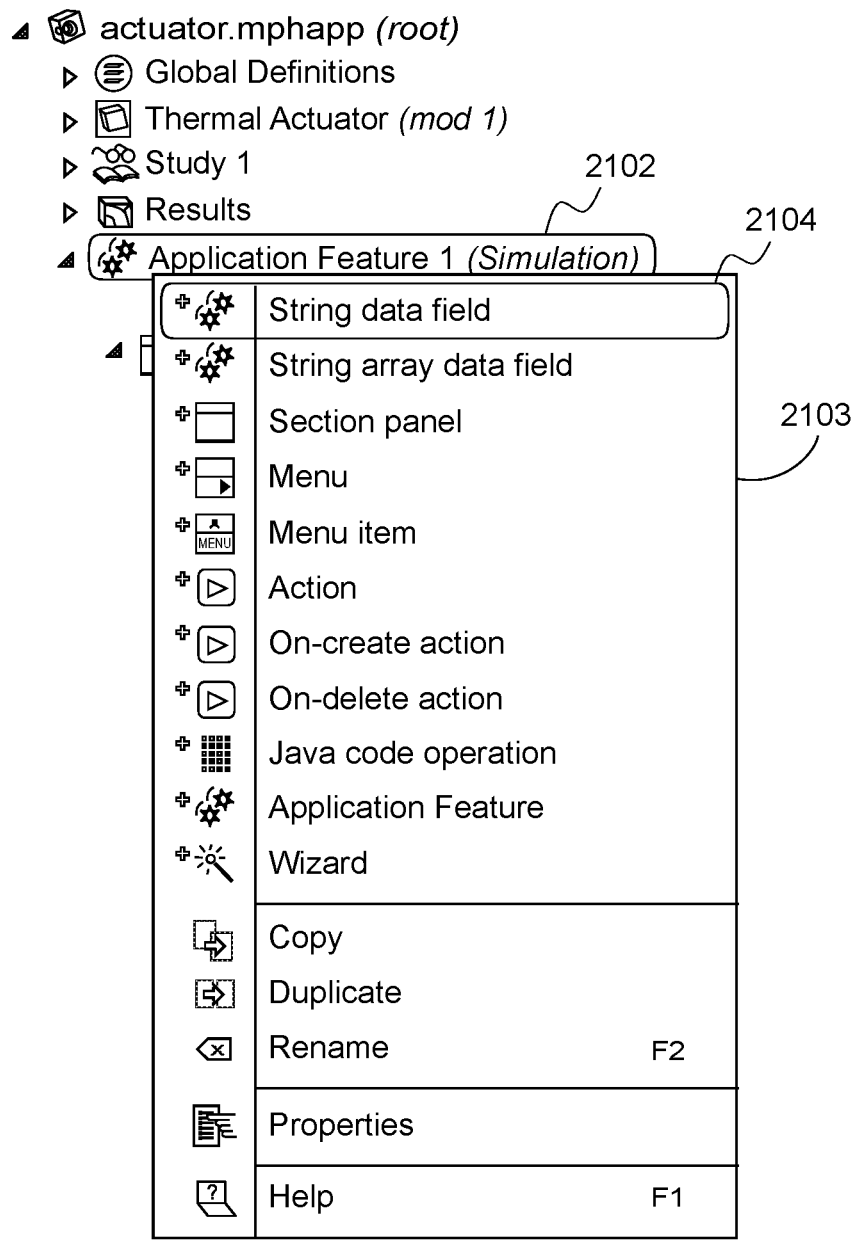
FIG. 21 illustrates an exemplary application tree for adding an input declaration to an application data structure, according to aspects of the present disclosure.

Referring now to FIG. 21, an exemplary application tree is illustrated according to some aspects of step 1630 from FIG. 16 for adding an input declaration to an application data structure. Right-clicking or otherwise selecting a feature node 2102 in the application tree can open a context menu 2103 where an input declaration can be added to the application data structure, for example a string data field 2104 or any other input declaration type that is available or listed. It is contemplated that such an input declaration can be used to receive inputs for parameters used to control settings in an embedded model when the application is executed.

Figure 22:
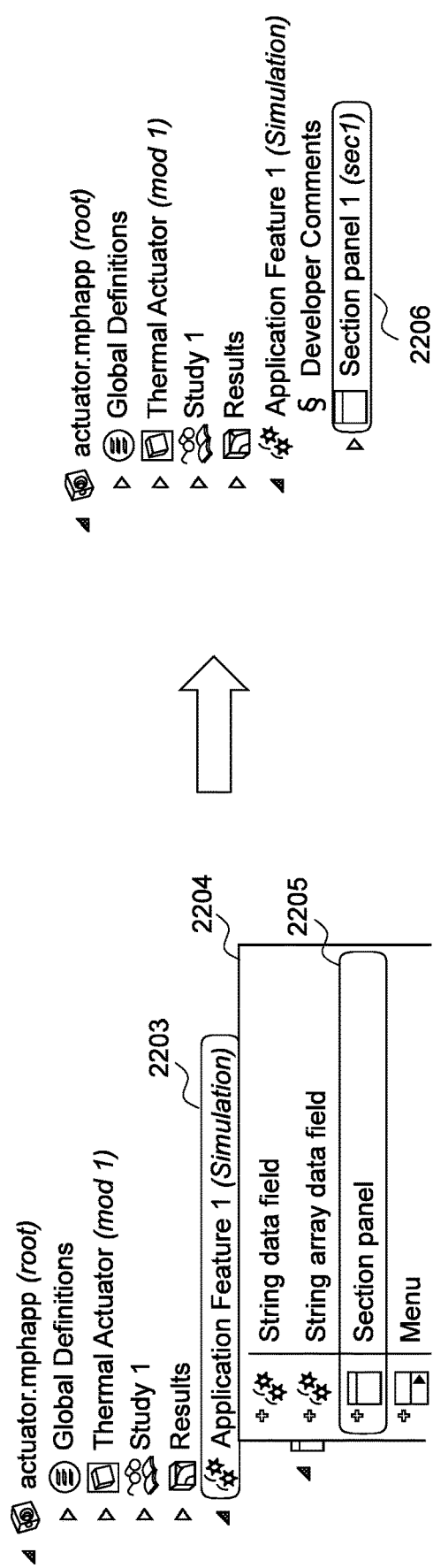
FIG. 22 illustrates an exemplary application tree for adding a panel input form to an application data structure, according to aspects of the present disclosure.

Referring now to FIG. 22, an exemplary application tree is illustrated according to some aspects of step 1640 from FIG. 16 for adding a form collection to an application data structure. Right-clicking or otherwise selecting (e.g., touchscreen, scrolling through list, hovering over) a feature node 2203 in the application tree (or alternatively a button in a toolbar) can open a context menu 2204 where an input form or a form collection can be added to the application data structure, for example a section panel 2205. Other input forms and form collections may be available in such a context menu, for example menus. A section panel can also be available by default when an application is created. A section panel, or any other input form or form collection, can be represented as a node in the application tree 2206.

Figure 23:
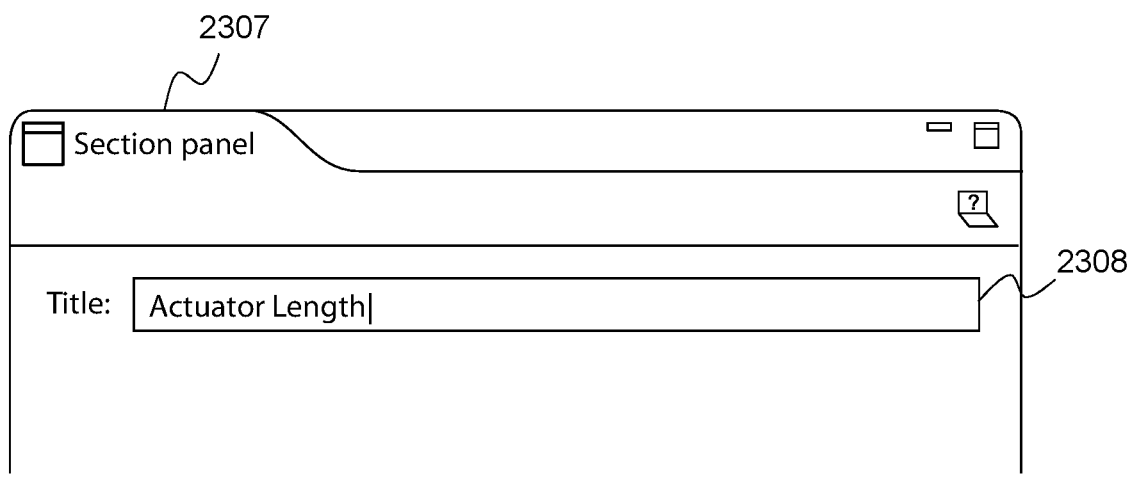
FIG. 23 illustrates an exemplary aspect of a settings window for a section panel form collection, according to aspects of the present disclosure.

Referring now to FIG. 23, an exemplary settings window 2307 is illustrated for a section panel form collection according to some aspects of a method for creating an application data structure. The section panel form settings window in this exemplary aspect may only require a title for the section panel 2308; though it is contemplated that additional child features can be applied to define the contents of the section panel form collection. For example, a section panel can be designed to receive an input for the length of a MEMS actuator defined in the embedded model. The section panel title can therefore be set to actuator length 2308.

Figure 24:
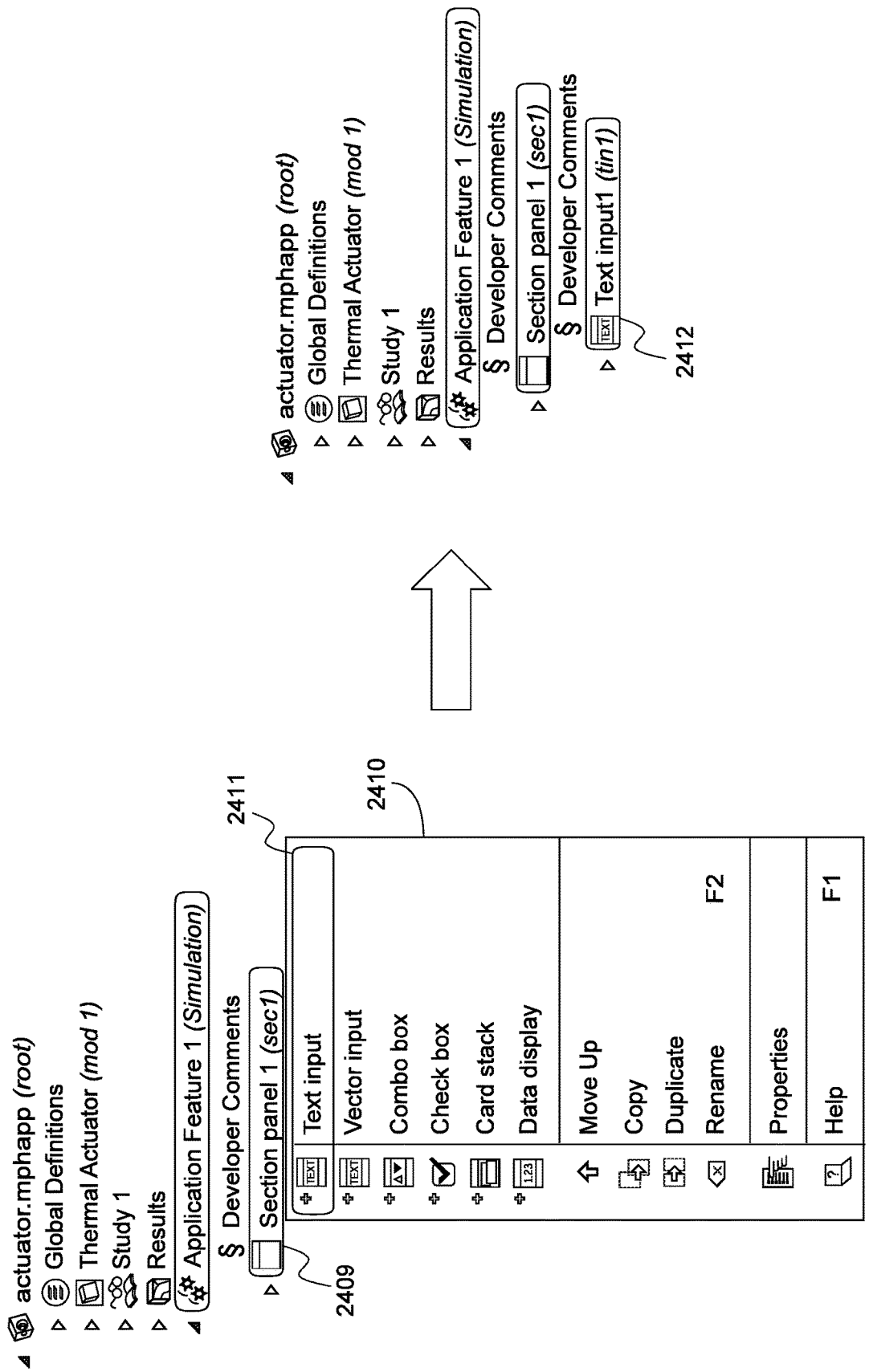
FIG. 24 illustrates an exemplary aspect of an application tree for adding a text input form to an application data structure, according to aspects of the present disclosure.

Referring now to FIG. 24, an exemplary application tree is illustrated according to some aspects of another exemplary alternative of step 1640 from FIG. 16 for adding a text input form to an application data structure. Right-clicking or otherwise selecting a section panel node 2409 in the application tree, or any other form collection node, can open a context menu 2410 where a child input form can be added to section panel form collection in the application data structure. For example, the section panel can include a text input form 2411 for receiving a text input for an actuator length in the embedded model when the application is executed. The text input form can be represented as a node 2412 in the application tree.

Referring now to FIG. 25, an exemplary settings window 2513 is illustrated for a text input form according to some aspects of a method for creating an application data structure. It is contemplated that such a settings window can include a data field reference 2514 that points to data declared in an input declaration or to data previously declared in the embedded model. For example, the text input can refer to a parameter defined in the embedded model that controls the length of the MEMS actuator. The settings window can also include a data field settings section 2515 that may allow settings such as default values to be defined. Such a default value can be shown in an input edit field when the application is executed. In some aspects, an optional widget section 2516 offers a ready-made widget collection for the design of the text field. These optional widgets can include description 2517, symbol 2518, and unit 2519. A widget layout preview 2520 can show how the text field is displayed when the application is executed.

Figure 26:
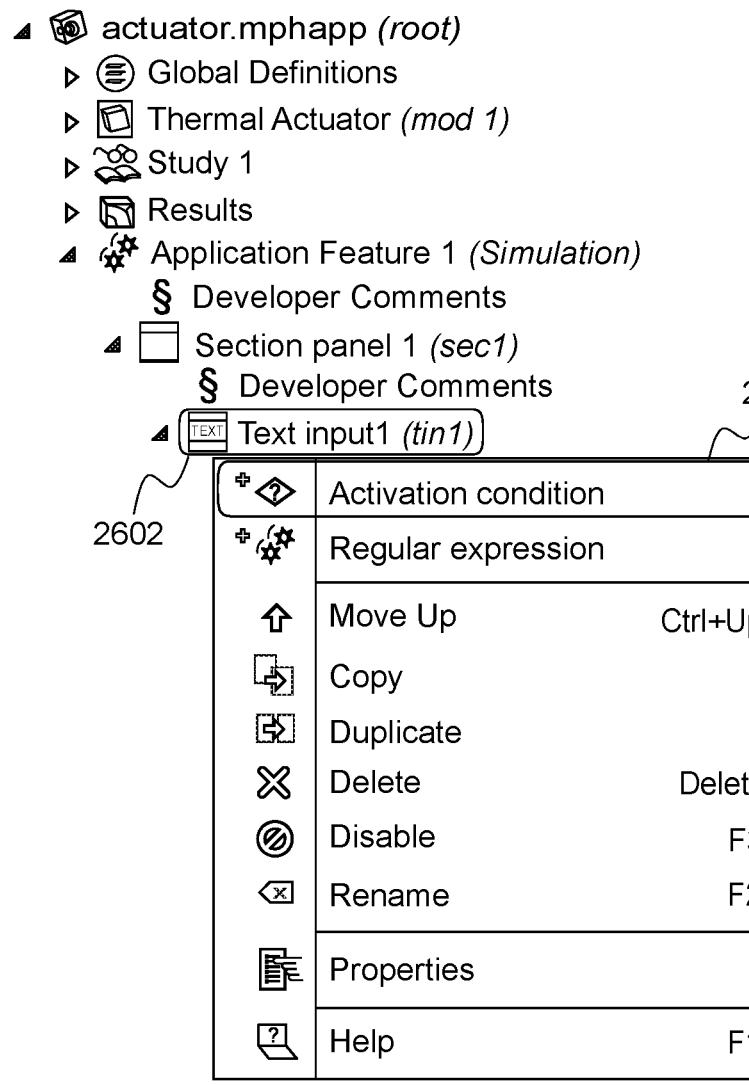
FIG. 26 illustrates an exemplary aspect of an application tree for adding an activation condition to an application data structure, according to aspects of the present disclosure.

Referring now to FIG. 26, an exemplary application tree is illustrated according to some aspects of step 1650 from FIG. 16 for adding an activation condition to an application data structure. Right-clicking or otherwise selecting a text input node 2602 in the application tree, or any other input form node, opens a context menu 2603 for adding an activation condition 2604. In this example, such a condition can activate a text input form depending of the value of an input parameter when the application is executed. Such an input parameter can be obtained from another input declaration and input form or by reference to a parameter in the embedded model. An activation condition can be represented as a child node to an input form in the application tree.

Figure 27:
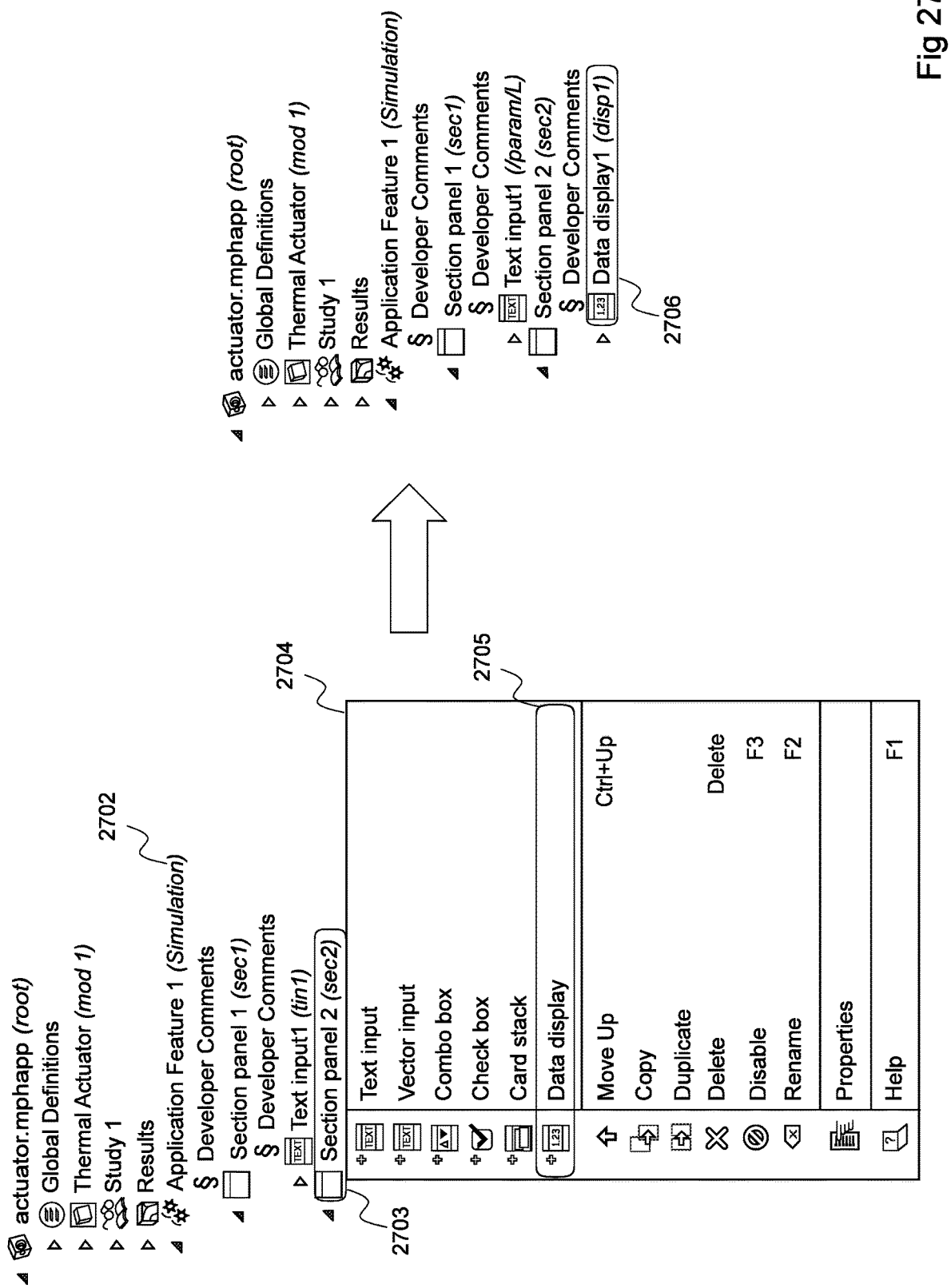
FIG. 27 illustrates an exemplary aspect of an application tree for adding a panel collection form and a data display output form to an application data structure, according to aspects of the present disclosure.

Referring now to FIG. 27, an exemplary application tree is illustrated according to some aspects of steps 1660 and 1670 from FIG. 16 for adding a section panel and a data display output form to an application data structure. It is contemplated that an output declaration can be included in the embedded model and linked to an output form by reference, as described below. Right-clicking or otherwise selecting an application feature node 2702 in the application tree can open a context menu for adding form collections, such as a section panel that can include an output form. It is contemplated that such a section panel can be represented as a node in the application tree 2703. Right-clicking or otherwise selecting the section panel node 2703 can open a context menu 2704 where an output form, such as a data display form 2705 can be added to the section panel form collection. A data display form can be used to display the value of a derived value in the embedded model or to display any other data declared in an output declaration when the application is executed. The data display output form can be represented as a child node to a section panel form collection node 2706 in the application tree. It is further contemplated that in some aspects an activation condition can be added to an output form, such as the activation condition described earlier for step 1680 from FIG. 16. The activation condition can be added to the output form similar to how an activation condition is added to an input for, as described for activation condition 2604 from FIG. 26.

Figure 28:
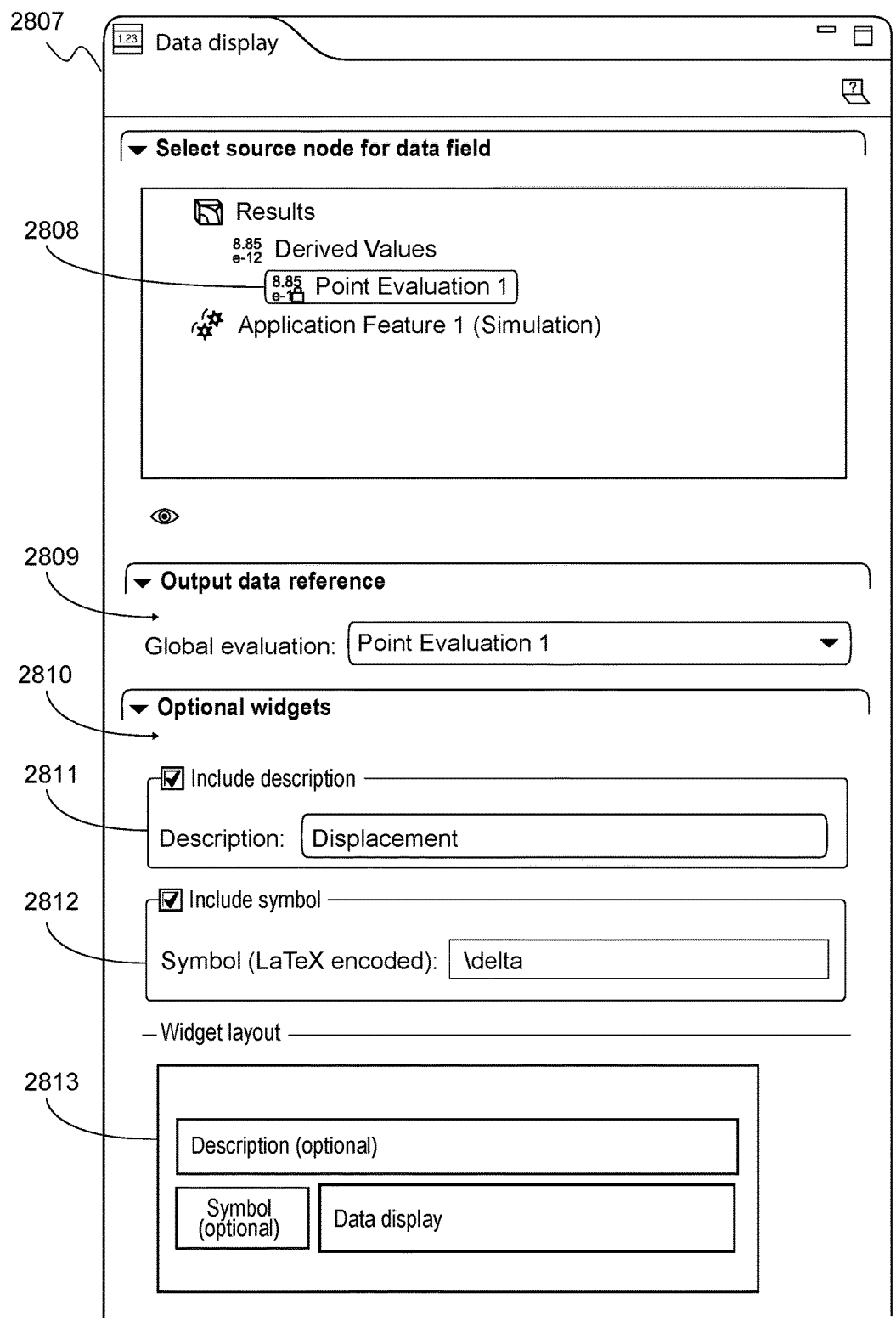
FIG. 28 illustrates an exemplary aspect of a settings window for a data display output form, according to aspects of the present disclosure.

Referring now to FIG. 28, an exemplary settings window 2807 is illustrated for a data display form according to some aspects of a method for creating an application data structure. Such a settings window can include an output data field reference 2809 that points to data declared in an output declaration or data already defined in the embedded model at step 1650 from FIG. 16. For example, the data display form can refer to a point evaluation 2808 defined in the embedded model that displays the total displacement of a MEMS actuator. An optional widget section 2810 can offer a ready-made widget collection for the design of the data display form. Optional widgets can include description 2811 and symbol 2812. A widget layout preview 2813 can hint how the data display form may be displayed during execution of the application.

Figure 29:
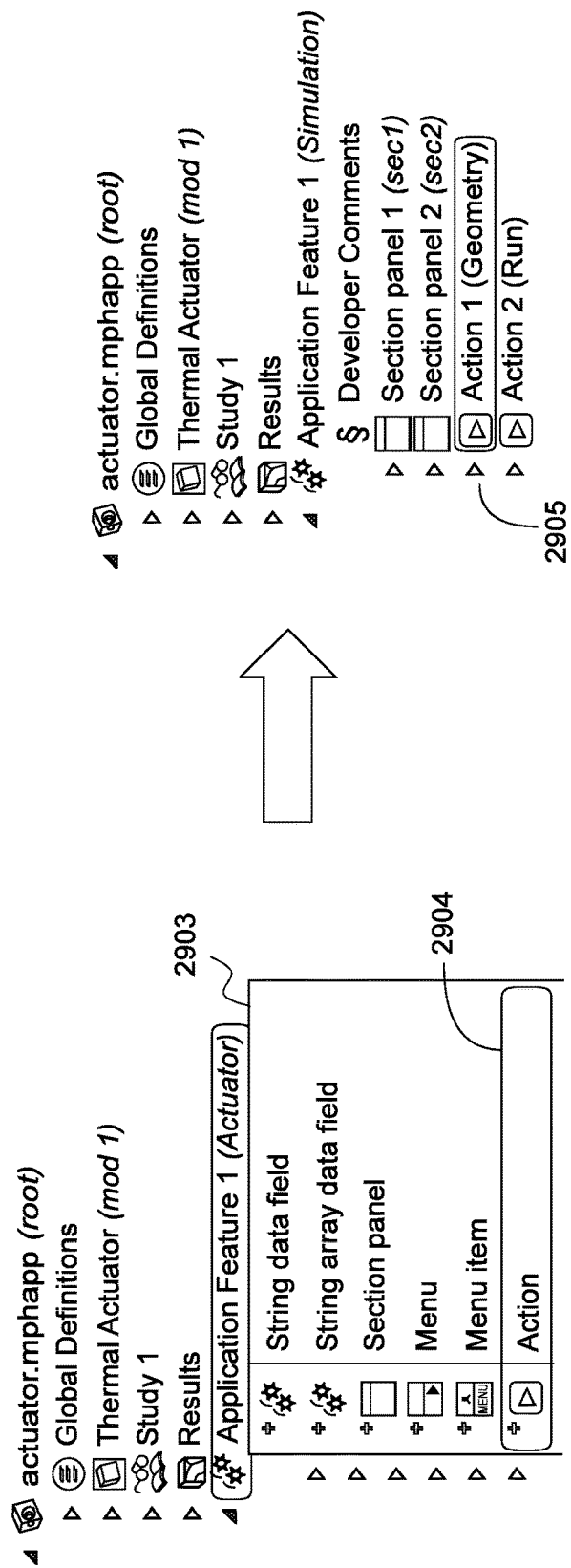
FIG. 29 illustrates an exemplary aspect of an application tree for adding an action feature to an application data structure, according to aspects of the present disclosure.

Referring now to FIG. 29, an exemplary application tree according to some aspects is illustrated based on step 1690 from FIG. 16 for adding an action to an application data structure. Right-clicking or otherwise selecting an application feature node in the application tree can open a context menu 2903 for adding an action 2904. It is contemplated that such an action can be represented as a node in the application tree 2905. In some aspects, an action can refer to the execution of a sequence of operations in the embedded model.

Figure 30:
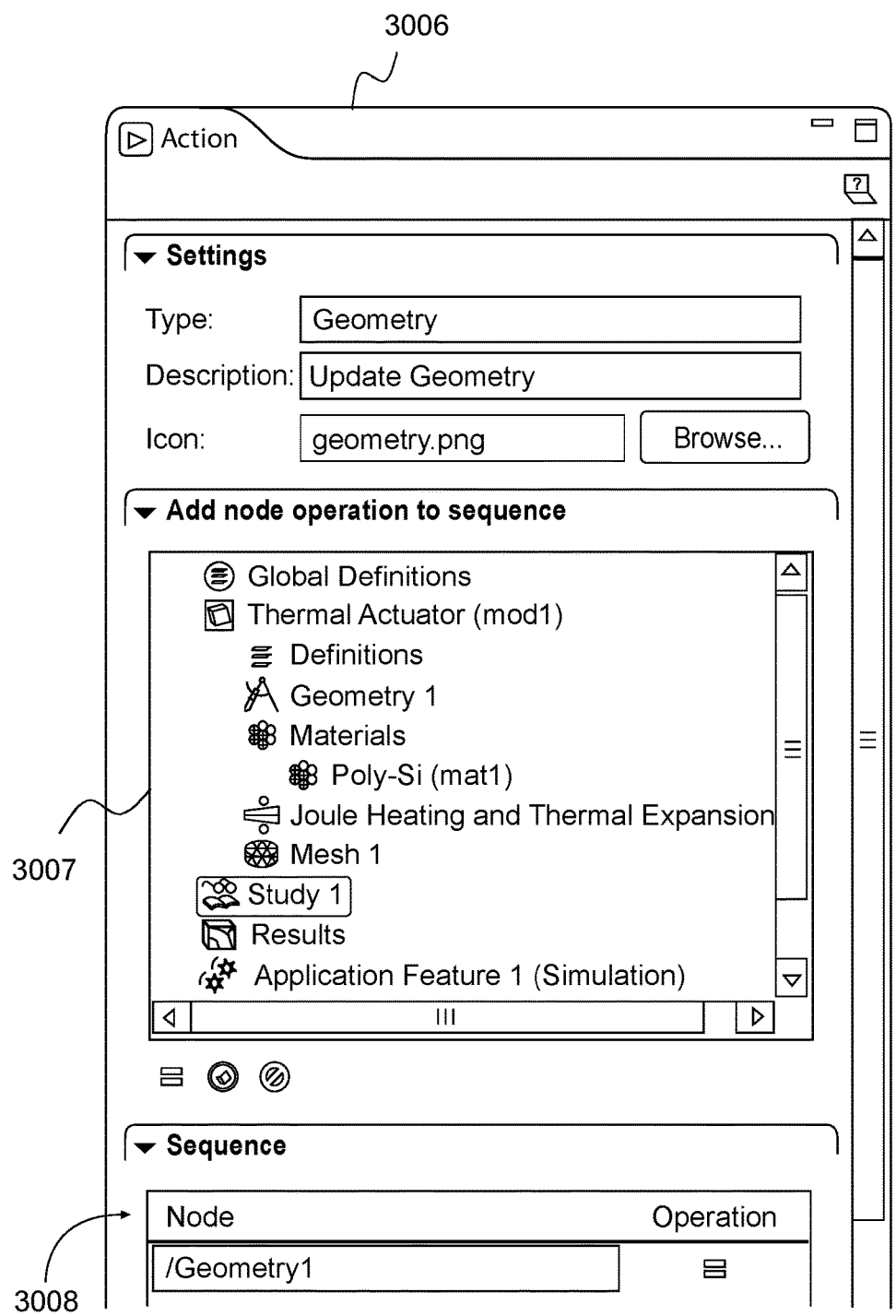
FIG. 30 illustrates an exemplary aspect of a settings window for an action feature, according to aspects of the present disclosure.

Referring now to FIG. 30, an exemplary settings window 3006 for an action feature is illustrated according to some aspects of a method for creating an application data structure. It is contemplated that such a settings window can include a replica 3007 of an exemplary model tree in the embedded model where an action can be linked or associated with an operation in the embedded model. For example, the action feature can be linked or associated with the sequence of operations 3008 that generates the geometry for an actuator and the operation that executes the simulation in the embedded model for the total displacement of a MEMS actuator.

Referring now to FIG. 31, an exemplary application tree is illustrated according to some aspects of an exemplary alternative to 1640 from FIG. 16 for adding a menu form to an application data structure. Right-clicking or otherwise selecting an application feature node 3121 in the application tree can open a context menu for adding a menu form 3122 to an application feature. The menu form can be included as a menu item in the context menu that is displayed when selecting the application feature during execution of the application. The menu form can be linked to an action that may be executed when selecting the context menu item during execution of the application. An action can refer to the execution of a sequence of operations in the embedded model, for example an action linking to the exemplary geometry sequence 3008 from FIG. 30. It is contemplated that such a link to an action can be created by selecting an action in menu forms settings window.

It is contemplated that in some aspects of the present disclosure the terms link and associate may be used interchangeably and can generally refer to an association relationship between two elements or features as would be understood in computer modeling. In some aspects, link may further be understood to be an instantiation of an association relationship, such as when an application is executed on a modeling system.

Figure 32:
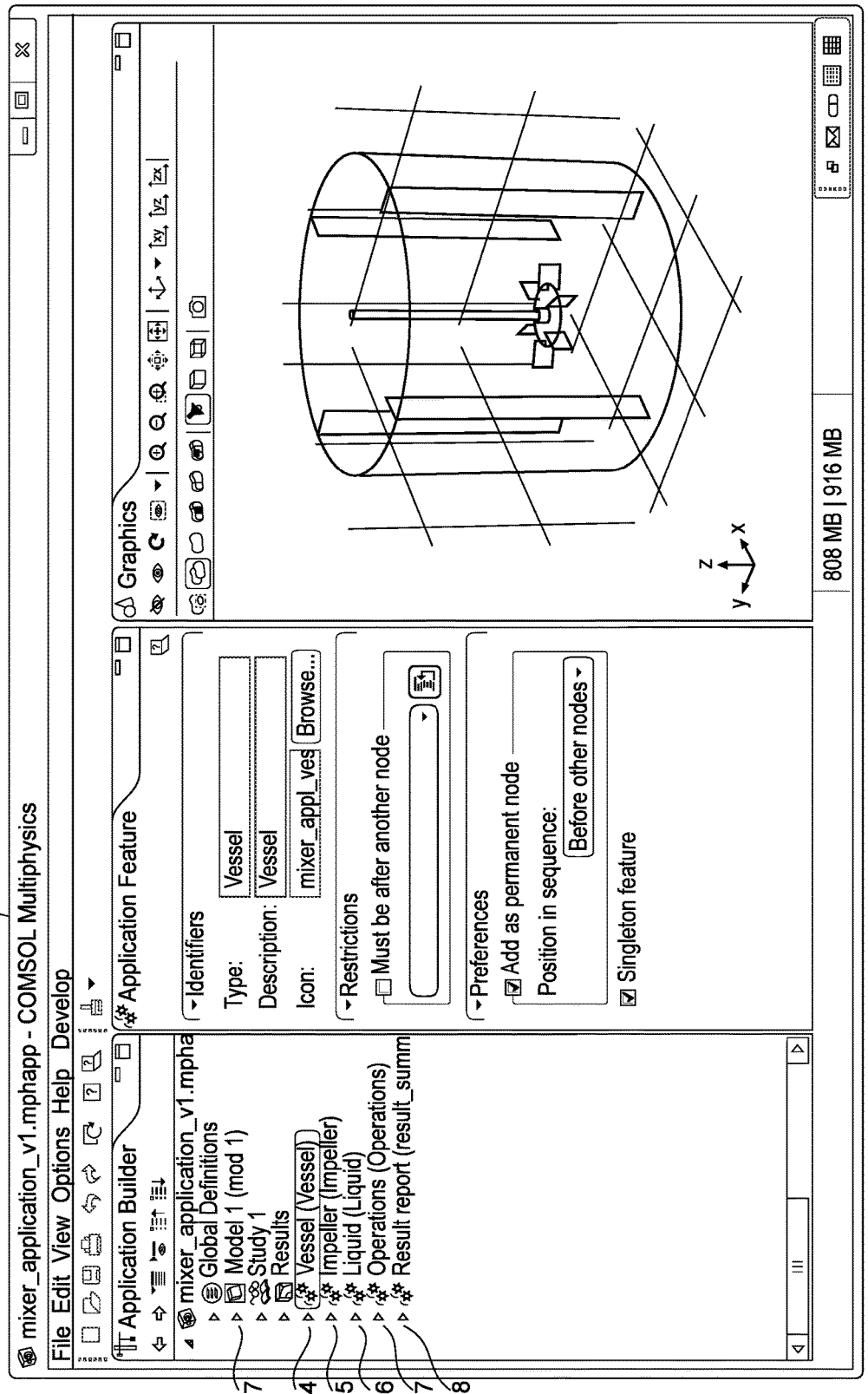
FIG. 32 illustrates an exemplary aspect of a graphical user interface in an application builder module for building a mixer application data structure, according to aspects of the present disclosure.

Referring now to FIG. 32, an exemplary graphical user interface 3206 is illustrated according to some aspects of an application builder system or module for creating or forming a mixer application data structure. An exemplary application builder tree includes a representation of an embedded multiphysics model 3207 of a mixer and five exemplary application features that define the user interface of the resulting mixer application. A mixer application may contain an application feature for defining the vessel 3214 of a mixer, the impeller 3215, the type of liquid 3216, the operation of the mixer 3217, and the results from the simulation 3218.

The embedded multiphysics model can include definitions of the geometry, material properties, physics, mesh, solver, and results for a mixer model. The embedded mixer model can be applied to solve a fluid flow problem, using the laws for conservation of momentum and mass defined by physics interfaces in a multiphysics modeling system, for the modeled mixer including a rotating impeller. In addition, the multiphysics model can also define and be applied to solve the concentration field for one or several chemical species in the solution contained in the mixer.

Figure 33:
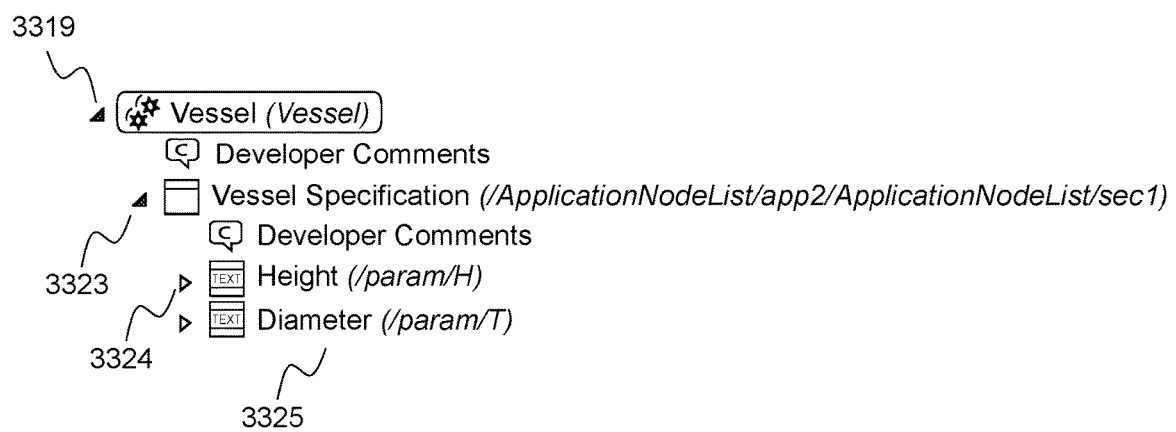
FIG. 33 illustrates an exemplary aspect of an application feature tree for a vessel application feature, according to aspects of the present disclosure.

Referring now to FIG. 33, an exemplary application feature tree is illustrated according to some aspects for a vessel application feature 3319 that can be used to receive inputs for creating the vessel geometry in a mixer in a method for creating an application data structure. The application tree can represent the contribution of the vessel application feature to the application data structure for the mixer application. The vessel feature can define a node in the model tree with a corresponding settings window that is displayed during execution of the application. This settings window can include a vessel specification section panel 3323 including two text input forms; one for the height 3324 and one for the diameter 3325 of the vessel. These input forms can refer to parameters in the embedded multiphysics model that can be used in the embedded multiphysics model to parameterize the vessel geometry and change the height and diameter of the vessel depending on the inputs entered by a user during execution of the application.

System(s) and method(s) are described herein (see FIGS. 16 and 17 and related exemplary GUIs) for creating an application data structure, based on a multiphysics model, through a graphical user interface (e.g., a dedicated GUI) in an application builder software configured to access features and feature settings for the multiphysics model. Such a graphical user interface gives access to methods for generating a data structure representing an application using the existing settings for the multiphysics model. The application data structure is then interpreted (e.g., executed) by another method to make it accessible from the GUI in a multiphysics modeling system for generating an application model data structure and a multiphysics model data structure for simulations.

Figure 37A:
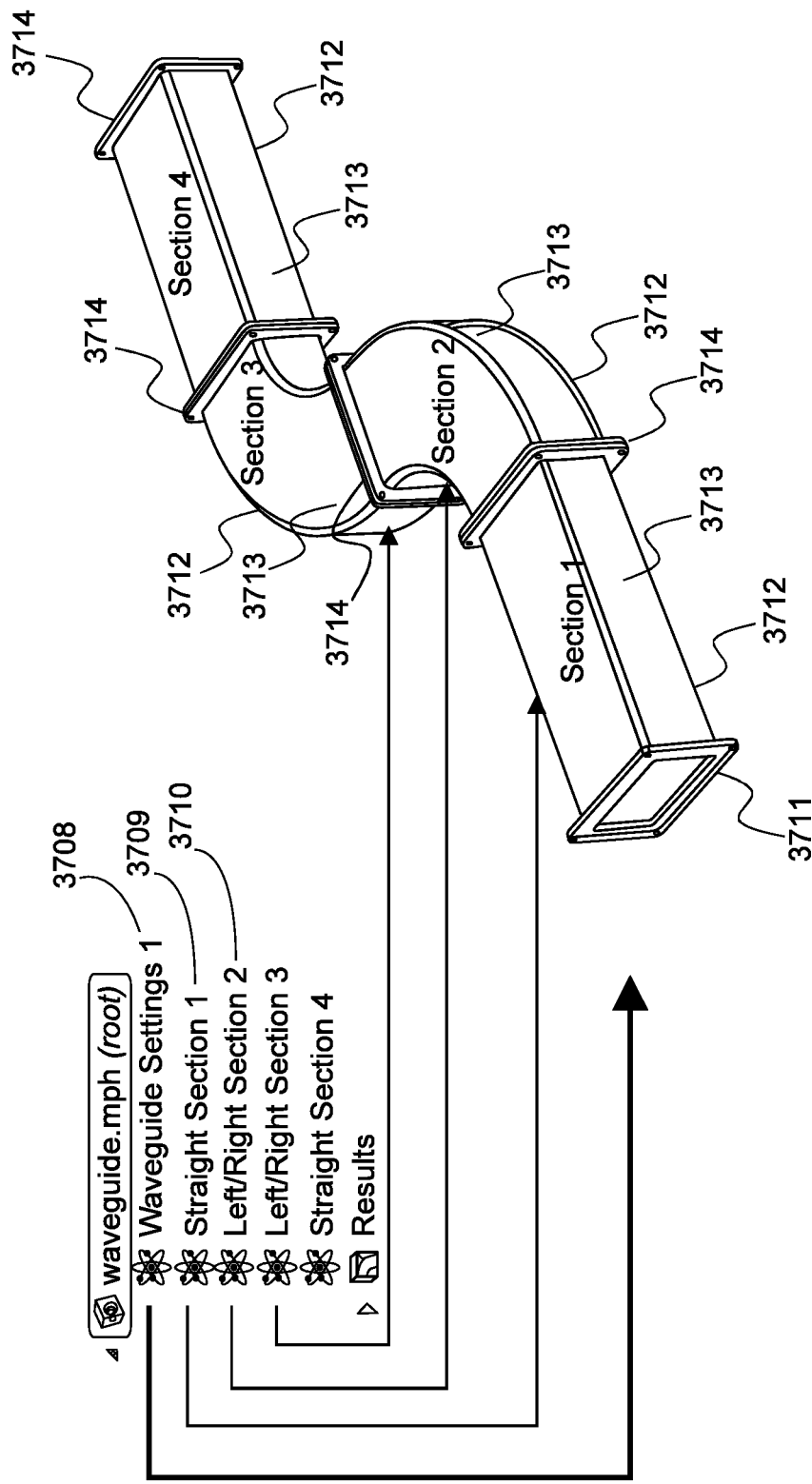

It can be desirable to expand the flexibility and range of capabilities for geometry subroutines and cumulative selections to allow geometry subroutines to be more reusable and more powerful. For example, geometry subroutines can be expanded to accept objects and selections as inputs. In addition, the definition of cross sections for geometry subroutines exemplified in the waveguide application illustrated and described in FIGS. 37A-37C is achieved by defining these cross sections in work planes in a multiphysics modeling system.

Referring now to FIG. 34, an exemplary application feature tree is illustrated for the impeller application feature 3420 according to some aspects of creating an application data structure. It is contemplated that the impeller can be of different types, for example a six-blade Rushton, a three-blade pitched, or a four-blade pitched impeller. The impeller feature can therefore include an impeller type parameter or string declared by the impeller type input declaration feature 3405. The impeller type parameter can obtain its value from the impeller type combo box input form 3426. A valid value feature 3427, which can be a child feature to the combo box input form, may show the values that are selected from the combo box input form during the execution of the application.

It is contemplated that in some aspects, the value of the impeller type can be used as input to an if-statement feature in the geometry sequence in the embedded model. Such an if-statement can be applied to determine which of the impeller types provides a better design option, and thus, which of the impeller types should be built or prototyped. This non-limiting exemplary aspect illustrates the expansion of geometry subroutines to, for example, accept objects and selections as inputs. The customization of applications for multiphysics models allow models to be defined and simulations to be executed for specific physical systems, such as the exemplary impeller aspect of the described mixer application. The customization of applications further allows designs for a physical system (e.g., a mixer, a waveguide, others) being simulated to be optimized and provided as an input to one or more computers controlling the manufacture of the physical system, and by extension to machines operatively associated with such one or more computers.

Each impeller type can in addition also receive parameter inputs, such as impeller diameter 3428 and clearance of the impeller from the bottom of the vessel 3429, from the impeller and vessel input forms. Some of these input forms can also include activation conditions 3402. For example, selecting a pitched impeller can display an edit field for entering a pitch angle for the impeller 3430. This text input form can then be displayed if the activation condition is activated by a user selecting a pitched impeller during the execution of the application.

In some aspects, the application feature tree can also include a node representing an action in the application data structure. For example, for the impeller application feature 3420, a "build impeller" node 3409 represents an action in the application data structure. Upon execution of the exemplary impeller application, it is contemplated that the action, which is defined in the embedded model, can include implementing a geometry sequence, determining an outcome of an if-statement, and/or implementing a geometry subroutine call for the impeller geometry.

Figure 35A:
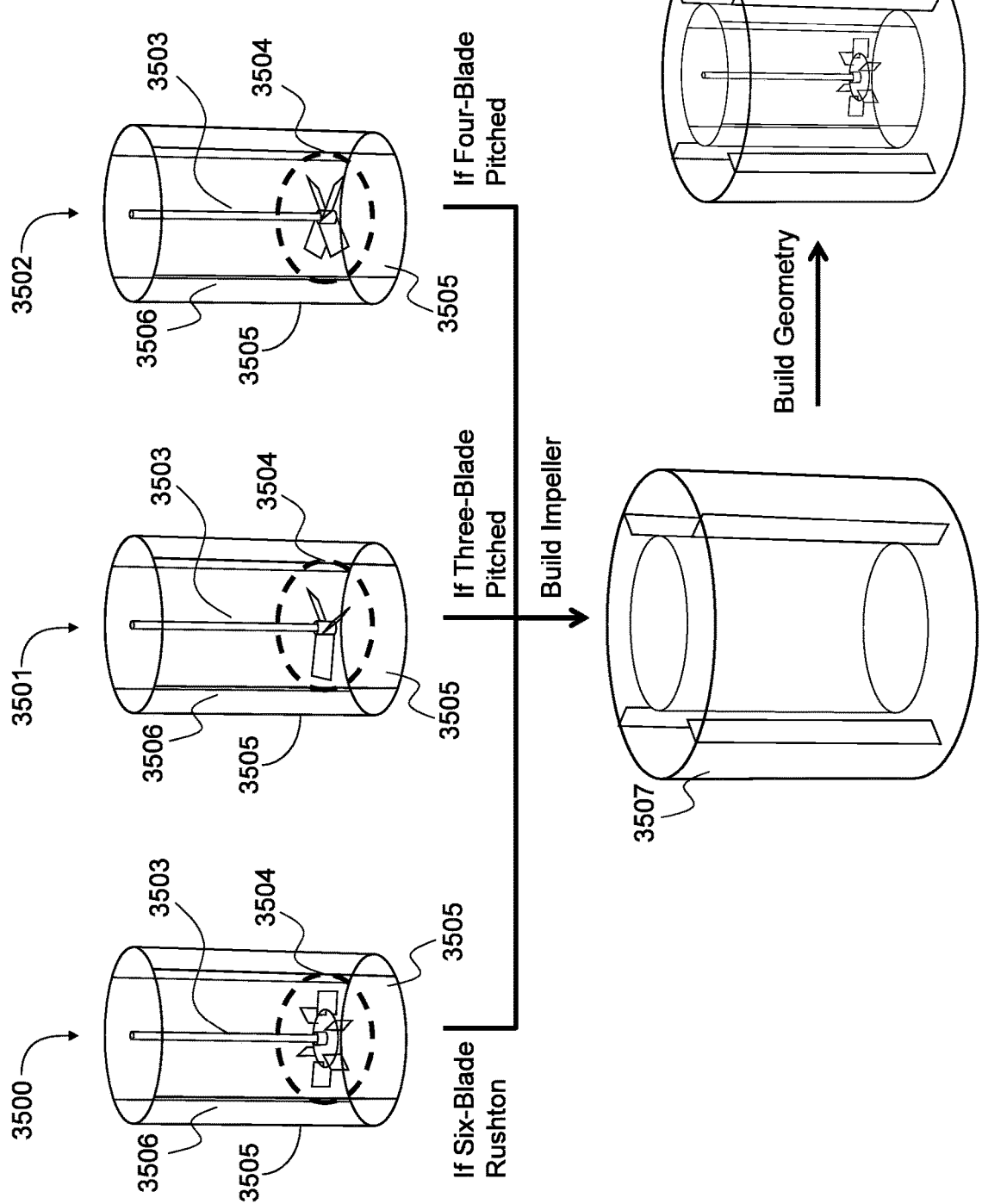
FIGS. 35A-35D illustrate an exemplary schematic of geometry and selection operations including exemplary geometry subroutine aspects, according to aspects of the present disclosure.

Referring now to FIG. 35A, an exemplary diagram with a schematic of the geometry operations and selections that can be executed by a geometry subroutine based on the inputs from an exemplary impeller application feature are illustrated according to some aspects for creating an application data structure and executing the application. By applying an action feature in an application feature, a geometry subroutine can be called from a geometry sequence and such call can be represented as a node in the model tree, such as in a geometry branch, in the embedded model. A geometry subroutine can run a parameterized geometry sequence for the corresponding impeller type determined by the if-statement, including, for example, the previously described a six-blade Rushton 3500, a three-blade pitched 3501, or a four-blade pitched impeller 3502. Other systems and objects for which geometry subroutines can be run are contemplated with the illustrated impeller being exemplary of one aspect for creating an application data structure and executing the application.

The output of the geometry subroutine can be the geometry of the impeller and a set of selections corresponding to the shaft surface 3503, impeller surface 3504, and also the surface 3505 between a domain corresponding to the impeller 3506 and the vessel domains 3507 as defined in the embedded model. Each set of these selections can be used to set the boundary conditions for the physics in the embedded model during execution of the application. For example, an impeller surface may be better implemented where a specific boundary condition for the flow equation is attributed to the rotation of the impeller. In addition, the interface of the cylinder surrounding the impeller can in one example be required to include a sliding mesh setting using for example an arbitrary Langrangian-Eulerian (ALE) method to simulate the rotation of the impeller.

Figure 35B:
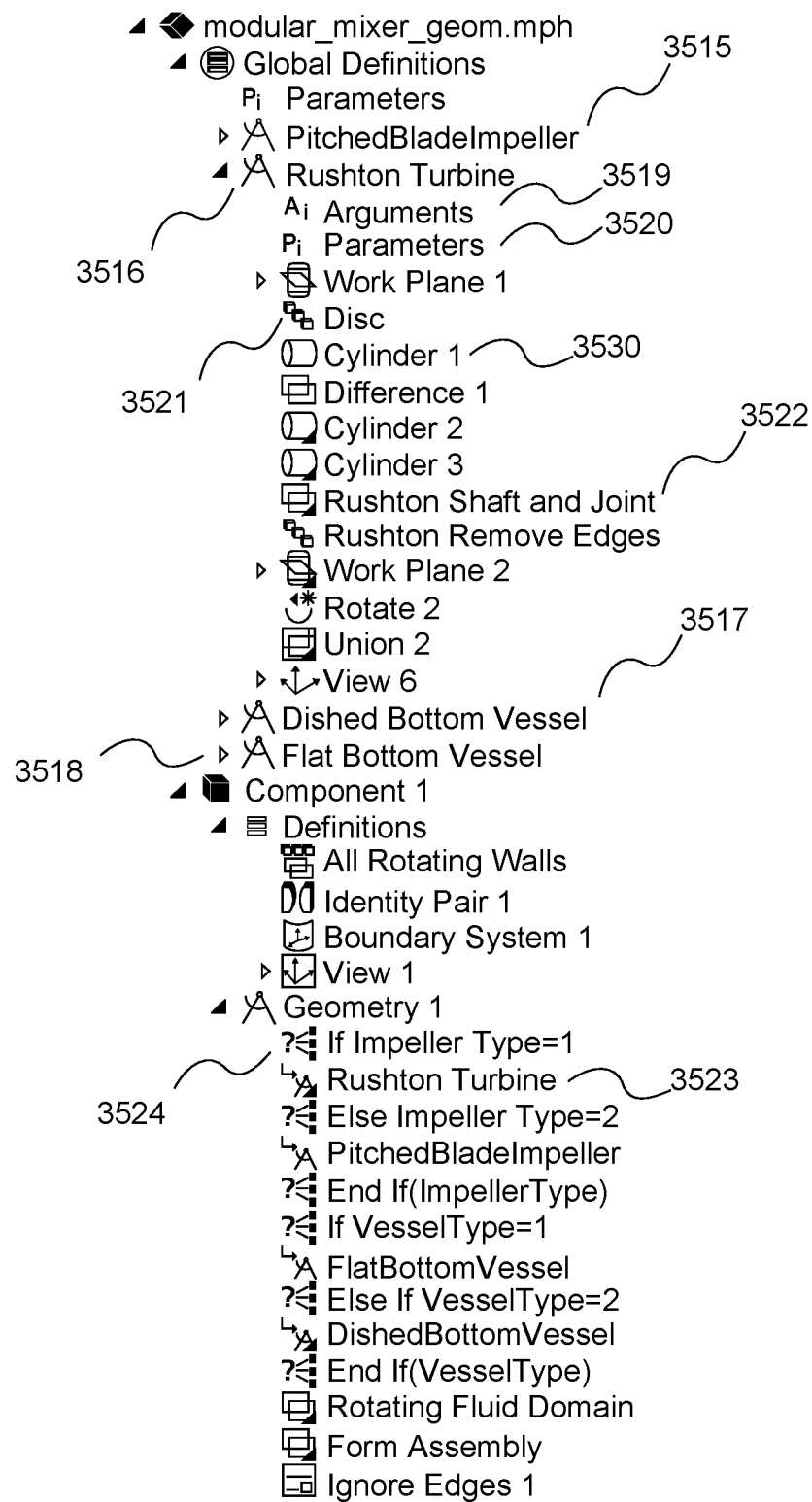
Figure 35C:
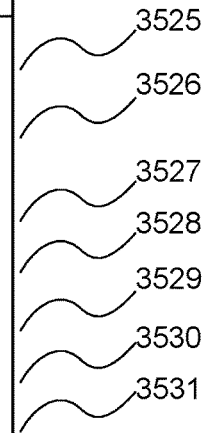

A geometry subroutine can define a set of local parameters that receive their values from or depend on (e.g., are expressions of) the geometry subroutine arguments (see, e.g., FIG. 35C). The geometry subroutine arguments in turn can refer to parameters outside of the geometry subroutine. Expressions in geometry features in a geometry subroutine can include arguments and local parameters in addition to global parameters (e.g., parameters that are defined both inside and outside of the geometry subroutine in the embedded multiphysics model). In case of conflict, the arguments and local parameters of the geometry subroutine are contemplated to override the global parameters. In some aspects, geometry subroutines can also include their own local functions. These local functions can, for example, be used for functions whose definition depends on a subroutine argument.

Referring now FIG. 35B, an exemplary geometry subroutine is illustrated that is represented in a model tree in an embedded model in an application builder software according to some aspects of the described methods and systems for creating an application data structure. An embedded model of a mixer, such as the one exemplified above in the application described for FIG. 35A, can include a geometry subroutine for a pitched blade impeller 3515, a Rushton turbine 3516, a dished bottom vessel 3517, and/or a flat bottom vessel 3218. Arguments are exemplified through the Rushton turbine geometry subroutine 3516 and can include a list of arguments 3519, a set of parameters 3520, and/or a set of output selections, such as a disc selection 3521 for the disk in the Rushton turbine.

It is contemplated that the geometry operation(s) in the geometry subroutine can also create output selections, which may contribute to cumulative selections, such as for a union operation for the shaft and joint of the impeller (see element 3522). The Rushton turbine geometry subroutine can be called in the geometry sequence in a geometry subroutine call 3523 that is included in an if-statement 3224 in the geometry sequence, and in some aspects, may only be called if the impeller type is Rushton turbine.

Referring now to FIG. 35C, a settings window is illustrated that includes a list of arguments according to some aspects of the described systems and methods for creating a geometry subroutine in an embedded model in an application data structure. The list of arguments can include parameters that control the dimensions of the objects created in the geometry subroutine. In the exemplary aspect of a Rushton turbine geometry subroutine, such parameters can control the dimension of the impeller directly or indirectly. For example, the arguments can control the impeller diameter 3225, the diameter of the impeller shaft 3226, the height of the vessel 3227, the diameter of the vessel 3228, the clearance of the impeller from the bottom of the vessel 3229, the blade length of the impeller 3230, the blade width 3231, and/or others (e.g., blade pitch, number of blades, handedness). These arguments are exemplary and it would be understood that geometry subroutines and the list of arguments could apply to many other applications that include geometrical aspects.

Figure 35D:
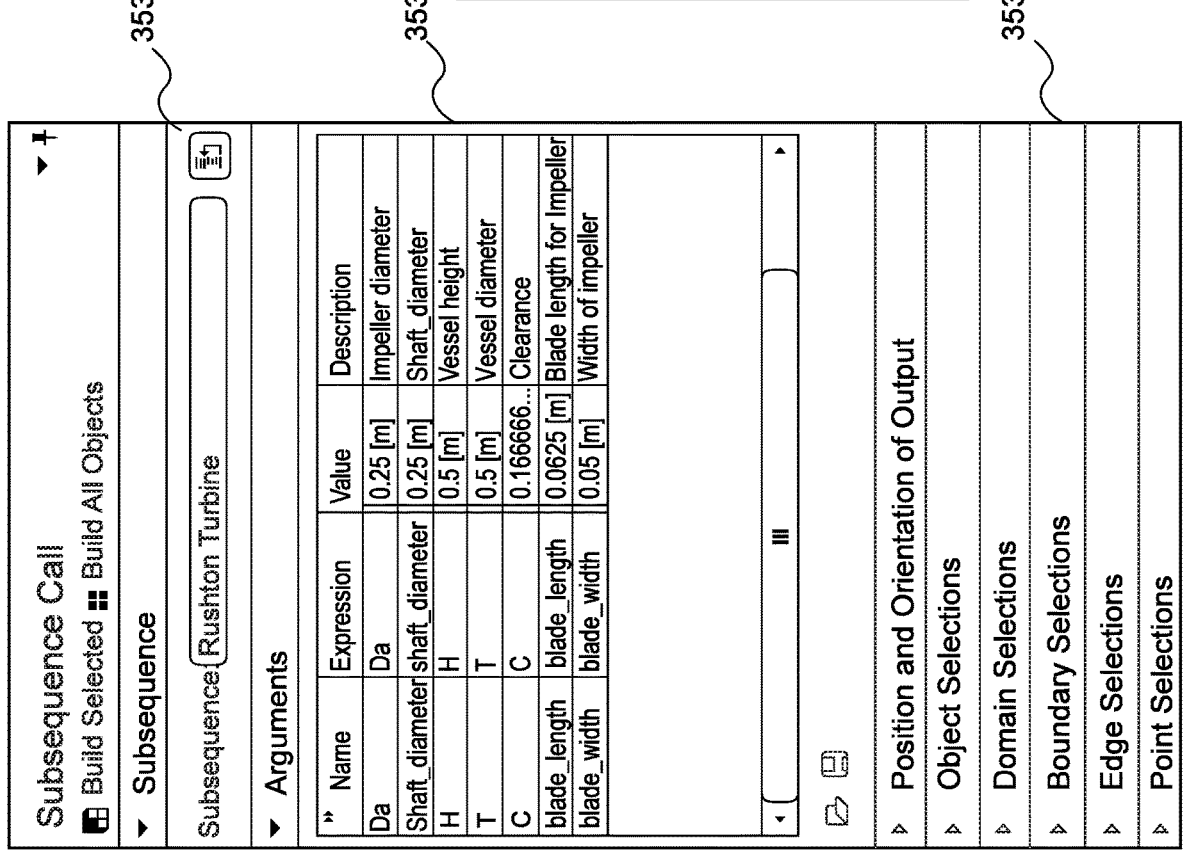

Referring now to FIG. 35D, an exemplary settings window for a geometry subroutine call 3532 (also referred to as a geometry subsequence call) is illustrated for the Rushton turbine geometry subroutine exemplified above. It is contemplated that different geometry subroutines can be called through selections, such as via a pull-down list 3532, or by browsing to a linked geometry subroutine, which is further described below. It is contemplated that the value(s) of the argument(s) to the geometry subroutine, as discussed above, can be set in the geometry subroutine call 3533. It is also contemplated that output selections can be listed according to the geometry entity level: object, domain, boundary, edge, and/or point. For example, the output selections for boundaries 3534 can be used in the embedded model to define different boundary conditions on different boundaries. For example, the disc selection can contribute to the rotating interior wall selection 3235 for the respective boundary condition. The Rushton turbine shaft and joint selection can contribute to a corresponding selection for a rotating wall condition 3536, and/or the Rushton blade selection can contribute to the selection for rotating interior walls 3537.

It is contemplated that geometry subroutines can receive selections associated with input geometry objects and input geometry entities such as domains, boundaries, edges, and/or points. Input selections for geometry object and geometry entities can be represented by an input selection node in the geometry subroutine branch in a model tree. The first time an input selection is added, an input selection feature may be added at the beginning of the geometry subroutine branch in the model tree. An input selection feature may be associated with a settings window that includes a geometric entity level combo box for selecting from objects, domains, boundaries, edges, and/or points; and/or a read-only list of selected objects or entities. When an input selection feature is selected, the corresponding selection may be highlighted in the graphics window of a multiphysics modeling system. In one exemplary aspect, an input selection can receive a boundary selection as input, and with that boundary selection, create a complex object by extruding and sweeping the boundaries in the selection according to a geometry sequence specified in the geometry subroutine.

In some aspects, it is contemplated that each feature represents an object or a geometry operation in a geometry sequence in a geometry subroutine. For example, the "Cylinder 1" node 3530 under the exemplary Rushton turbine geometry subroutine 3516 in FIG. 35B defines an impeller shaft geometry or the union operation 3522 unites the shaft and joint of the impeller. Geometry operations settings can also include a check box, or another selectable option, for creating output selections. In some aspects, the output selections are available in the geometry sequence and can also be outside of the geometry subroutine.

Referring back to FIG. 35D, geometry subroutines can also be created by linking to geometry subroutines in other multiphysics model files 3532. The name of a linked geometry subroutine node may be constructed from the file name and the subroutine's name in the file that the linked subroutine refers to. The settings window of a linked geometry subroutine can include a read-only filename text field including the relative or absolute path to the file that the link refers to, a check box for selecting relative or absolute path, a read-only subroutine text field, and/or a synchronize button. The synchronize button can execute any changes made in the file that the linked geometry subroutine refers to.

It is contemplated that linked geometry subroutine definitions can appear or be displayed, but such appearance or display may be in a read-only state (e.g., grayed out in the user interface). The local parameters can include global parameters from the file that the linked geometry subroutine refers to. The linked geometry subroutine may not use global parameters defined in the model where the link is created. The local functions may include global functions from the file that the linked geometry subroutine refers to. The linked geometry subroutine may not use global functions defined in the model where the link is created.

Figure 36:
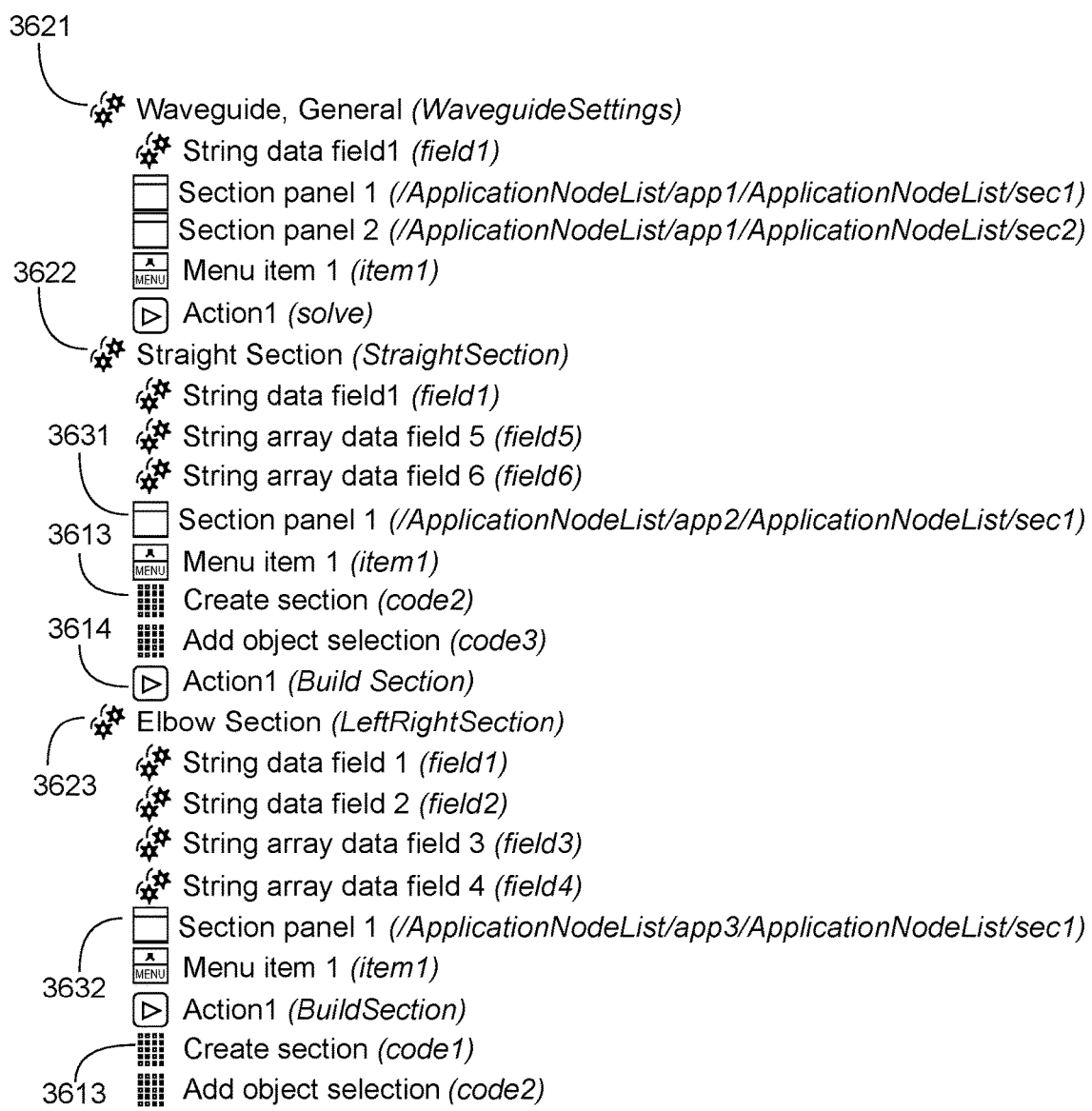
FIG. 36 illustrates an exemplary application tree for a waveguide application, according to aspects of the present disclosure.

Referring now to FIG. 36, an exemplary application tree for a waveguide application is illustrated according to some aspects for creating an application data structure. The exemplary waveguide can include straight and elbow-shaped sections. A first application feature, the waveguide general feature 3621, can include form collections and actions for specification of the cross section of the waveguide; the operating conditions such as frequency; and the output specifications, such as real or imaginary (if complex) value, db (decibel), and S-parameter (Scattering parameter) in corresponding output forms are displayed during the execution of the application. A straight section application feature 3622 can include form collections and actions for specifying the length 3631 of the sections and an action to build such section 3614. The corresponding elbow section feature 3623 can include form collections and actions for specifying the direction of the bend and its radius 3632.

The straight section and the elbow section features for the exemplary waveguide application can also create the corresponding geometry features in the embedded model's multiphysics model data structure during the execution of the application with the action feature being applied, such as a create section feature 3613. Correspondingly, a geometry feature can also be removed from the embedded model's geometry sequence if a user chooses to remove during execution of the application. In addition, a second action, such as an add object selection feature 3615, can add the selection created by the added waveguide section as a contribution to a set of already defined cumulative selections in the embedded model, as described further below.

Referring now to FIG. 37A, an exemplary model tree with waveguide geometry is illustrated. The exemplary model tree and geometry were created by a waveguide application including geometry subroutines executed in a multiphysics modeling system according to some aspects of interpreting an application data structure. Adding a waveguide section can add a geometry feature to the embedded model, and the models corresponding multiphysics model data structure, during execution of the application. Geometry subroutines for each section can be called from the geometry sequence in the embedded model. It is contemplated that such geometry subroutines can receive parameters for the cross-section of the waveguide 3711 from the waveguide settings 3708. A straight section subroutine can receive the inputs for the length of the waveguide from a straight section feature 3709 while an elbow can receive the cross section direction, and radius of the section from a Left/Right section feature 3710. In addition, any of the straight or elbow section subroutines can also receive an index that reveals if there is a previous geometry subroutine call in the geometry sequence. The geometry subroutine can also receive a starting position for the respective waveguide section and, if there are previous sections, the end position for the previous section can be used as starting point for the next one.

The output from each geometry subroutine can be the geometry of the corresponding section and a set of selections for the walls 3712 and domain of the waveguide 3713. The output can also include an index that reveals the number of the current section in the waveguide (1 if it is the first section, 2 if it is the second section, etc.) and the end position of a waveguide section 3714 to be used as the starting position of the next section. If there are several sections, each geometry subroutine can add its contribution to the domain and wall selections and by this create cumulative selections with contributions from each waveguide section.

Referring now to FIG. 37B, an exemplary model tree in an embedded model in a waveguide application is illustrated according to some aspects for creating or forming an application data structure. The exemplary embedded model for the waveguide includes geometry subroutines for a waveguide cross section 3738, a straight waveguide section 3739, and a left/right bend section 3740. It is contemplated that the geometry subroutine receives a start plane from a previous waveguide section 3741 allowing the new section to be geometrically attached to the existing waveguide sections. The geometry subroutine can also create an end plane 3242, which may be used as a start plane by waveguide sections added after the current waveguide section. Selections of geometry entities can be used, for example, as input selections in an analogous way but for general boundaries (or domains, edges, and point). The exemplary geometry subroutine can include cumulative output selections. For example, the cumulative output selections can be for the domain settings for the electromagnetic (EM) region 3743, for setting the boundary conditions of the electromagnetic wave input boundary 3744, and for the boundary conditions of the electromagnetic wave output boundaries 3745.

Referring now to FIG. 37C, an exemplary aspect of a settings window for a geometry subroutine call (also referred to a subsequence call) is illustrated according to some aspects for creating or forming an embedded model geometry in an application data structure. The geometry subroutine call, such as "Subsequence Call 2" for "Geometry 1" in FIG. 37B, can include a reference to an end plane 3746 in a previous geometry subroutine call 3747 to be used as a start plane 3748 in order to attach a new waveguide section to a previous one. It is contemplated that the features described in the context of the waveguide example can be applied for other settings windows for other geometric forms.

Figure 38:
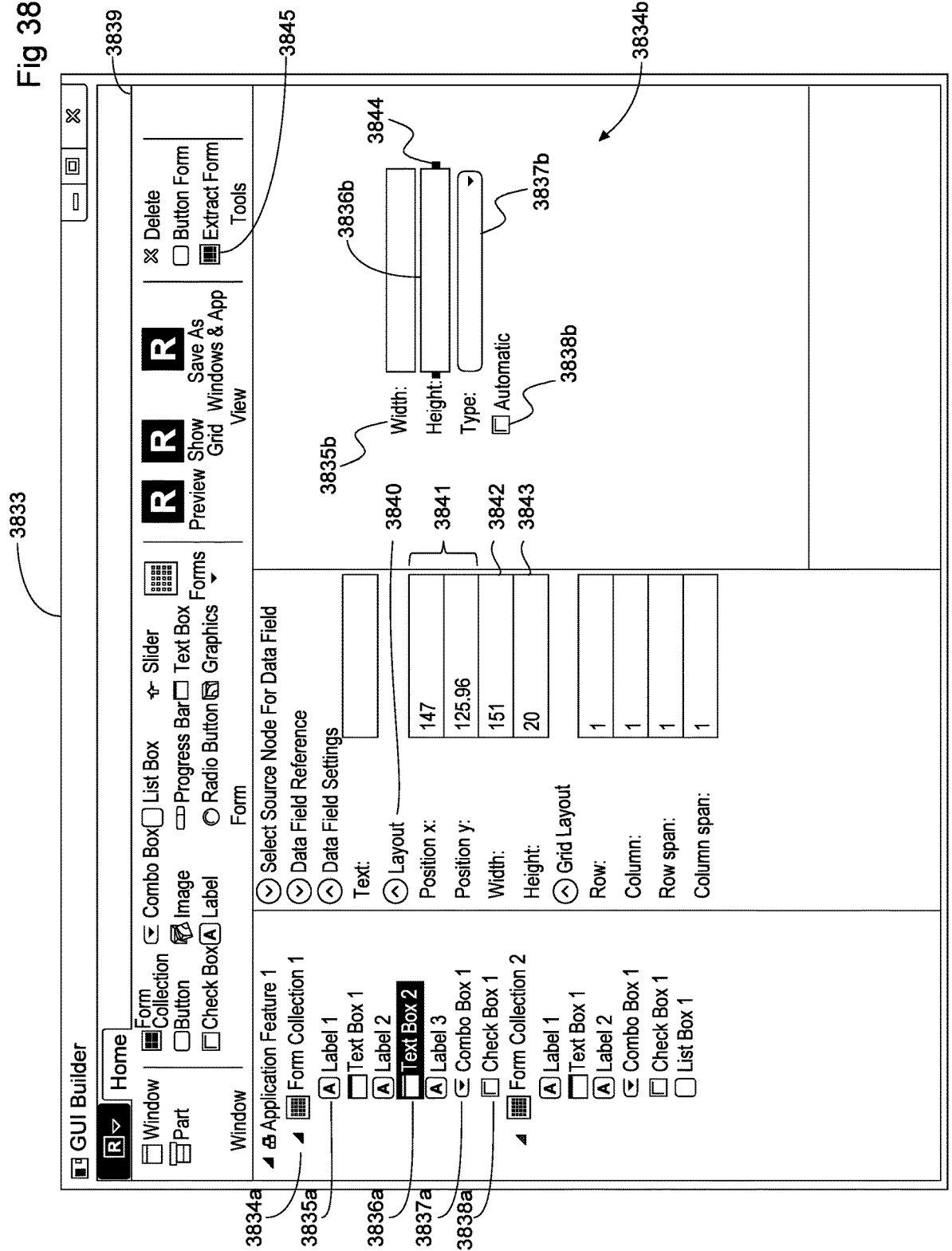
FIG. 38 illustrates an exemplary aspect of an application tree for a waveguide application, according to aspects of the present disclosure.

Referring now to FIG. 38, an exemplary aspect of a graphical user interface 3833 in an application builder system or module for designing input forms, output forms, and form collections is illustrated according to some aspects for creating an application data structure. The exemplary graphical user interface 3833 can allow for interactive drawing and positioning of input forms, output forms, and for interactive design of form collections 3834a, 3834b and widget collections including labels 3835a, 3835b, text boxes 3836a, 3836b, combo boxes 3837a, 3837b, check boxes 3838a, 3838b, and other forms and widgets. Snapping may also assist the user of the tool in positioning the forms and widgets. A toolbar 3839 is also contemplated and can include buttons and controls for showing and adding nodes to the tree as an alternative to a context menu.

When a form or widget node is selected in the application tree, for example a text box 3836a, its layout may be shown in a graphics builder window allowing for positioning in the corresponding form or widget collection interactively. An additional layout section 3840 can also be displayed in the settings window for widget and form features. In this layout section, the values for the layout information can be set; for example, position 3841, width 3842, and height 3843 of a form or widget. These values can be updated automatically with interactive changes in the graphics builder window.

It is contemplated that relative positioning can be used for forms in creating an application data structure. For example, a first form or widget can be placed freely on a form collection while other forms and widgets are then typically placed relative to this for or widget with the aid of horizontal and vertical snapping. Furthermore, in some aspects vertical snapping and horizontal snapping can be mutually independent, and each form or widget can contribute with several vertical and horizontal snapping lines. All forms or widgets can contribute with a horizontal snapping line along their left edge. In addition, forms or widgets with a fixed width, such as buttons, combo boxes, and text boxes, can contribute with a horizontal snapping line also along their right edge.

It is contemplated that there may also be a row spacing that can be specified as a preference for the graphics builder window and the row spacing may typically have a default value. In some aspects, the default spacing is about 5 pixels. The row spacing can specify how much empty space there should be from the bottom of one form or widget to the top of the next. It can also be used to decide where to position the form or widget on the row immediately below an existing form or widget. This row spacing can contribute with vertical snapping lines above and below a form or widget, making it easy to start a new row of forms or widgets above or below existing widgets.

When a user of the application builder system moves and resizes widgets (e.g., resize handler 3844), the snapping may try to align the left edge of the widget with the left edge of other widgets or the right edge of the widget with the right edge of other widgets and similarly in the vertical direction. While moving or resizing a widget, vertical and/or horizontal snapping lines may be drawn in the graphics builder window when snapping occurs. The snapping hot zone may be about 6-7 pixels in each direction of the snapping line so even though snapping is on it is possible to place the form or widget freely by positioning it outside the hot zone of any snapping line.

It is contemplated that there can be a two-way synchronization between the selection in the application tree and in the graphics builder window. If a form or widget node is selected in the application tree 3836a, the corresponding form or widget may be selected in the graphics builder window 3836b and vice versa. Since multiple forms and widgets can be selected in the graphics builder window but only one set of settings for one form or widget are displayed in the settings window at a time, controls for changing width and height may also be available on the toolbar. When multiple forms or widgets are selected there may also be toolbar buttons for the following operations: aligning the left, right, top, bottom, or center of the selected forms or widgets; distributing the widgets with equal spacing horizontally or vertically; and giving the widgets equal width or height. It is also contemplated to change the text displayed on labels, check boxes, buttons, and so on by double-clicking on the form or widget in the graphics builder window and then just entering the new text inline within the form or widget. Copy and paste may also be available to be able to easily reuse form and widget configurations in another form collection.

The graphics builder window can also have automatic row and column creation. For example, at each unique left border of a form or widget a new column may start and at each unique top border a new row may start. Because of the snapping used when drawing the forms and widgets, rather few rows and columns need to be created. Based on the width and height of a form or widget it may also be allowed to span several rows and columns. If several forms or widgets in a column have the same width as the form or widget with the maximum width in the column, these forms and widgets may be set to fill the column. This may be useful for getting several text boxes and combo boxes in a column with a straight right edge. The automatically created rows and columns may also be individual elements in the graphics builder window that can be selected by entering a certain selection mode. A selected row may then be moved interactively up and down the other rows. For a selected column, a user of the application builder may then specify a fixed width or that the width should adapt to the width of the top level form if this is resized. There may also be tools such as insert row and delete row to easily make room for a new row or delete all forms or widgets in a row and compact the layout accordingly.

A form collection can include many forms and widgets and the grid layout may become fairly complex as new forms and widgets are added to the form collection. In such cases, it may be desirable to divide the form collection into several form collections with individual layout management and then place these as child form collections in the original form. In such cases, it may be possible to enclose a couple of forms and widgets in a form collection using a rectangle and then use an extract toolbar button 3845 to specify that those forms and widgets should be extracted to their own form collection.

Figure 39:
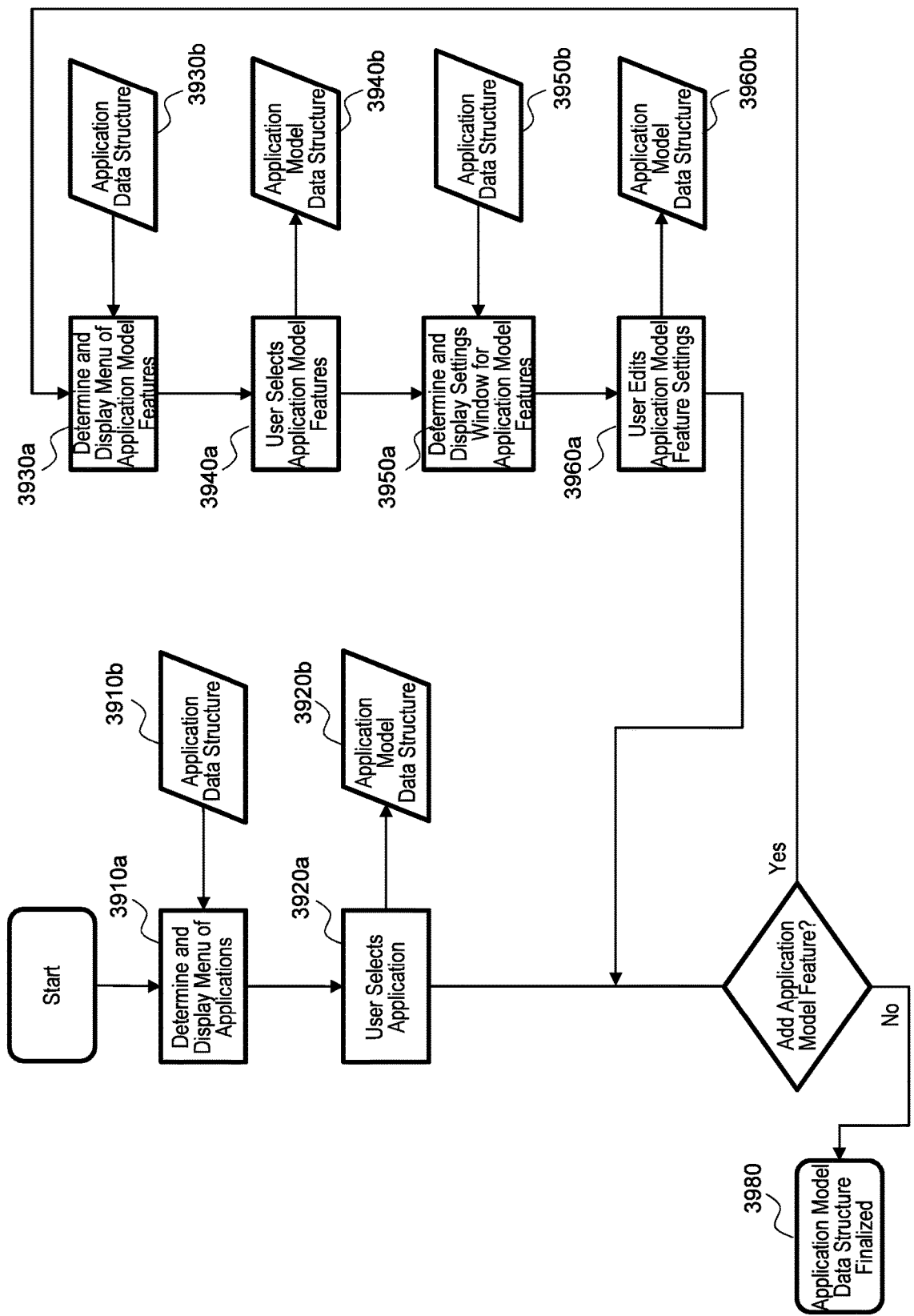
FIG. 39 illustrates an exemplary flowchart of method steps for interpreting (e.g., executing) an application data structure, according to aspects of the present disclosure.

Referring now to FIG. 39, an exemplary flowchart is illustrated of a method according to some aspects of interpreting an application data structure for generating and maintaining an application model tree, context menu, and settings window in a multiphysics modeling system. The interpretation method can further be applied to generate an application model data structure based on settings specified by a user of a multiphysics modeling system. At step 3910a, a list of applications are determined and displayed from a set of available application data structures 3910b. Next, at step 3920a, a user can select an application from the displayed menu list, which then adds the application model to an application model data structure 3920b.

After a decision is made to add an application model feature, the process in FIG. 39 then proceeds to step 3930a, where an application model tree with a corresponding context menu that includes application model features can be determined and displayed (1500a) based on the definition of application features available in the application data structure 3930b. Next, at step 3940a, an application model feature can be selected by a user. This selection determines an application model feature to be used in later method steps and adds the application model feature to the application model data structure 3940b. Next, at step 3950a, a settings window for an application model feature can be determined and displayed using the definition of user inputs for the application features available in the application data structure 3950b. Then, at step 3960a, a user can edit the settings in the settings window for an application model feature. The default settings and the changed settings are then stored in the application model data structure 3960b. Then, if no more application model features are to be added, the application model data structure is finalized in step 3980.

Figure 40:
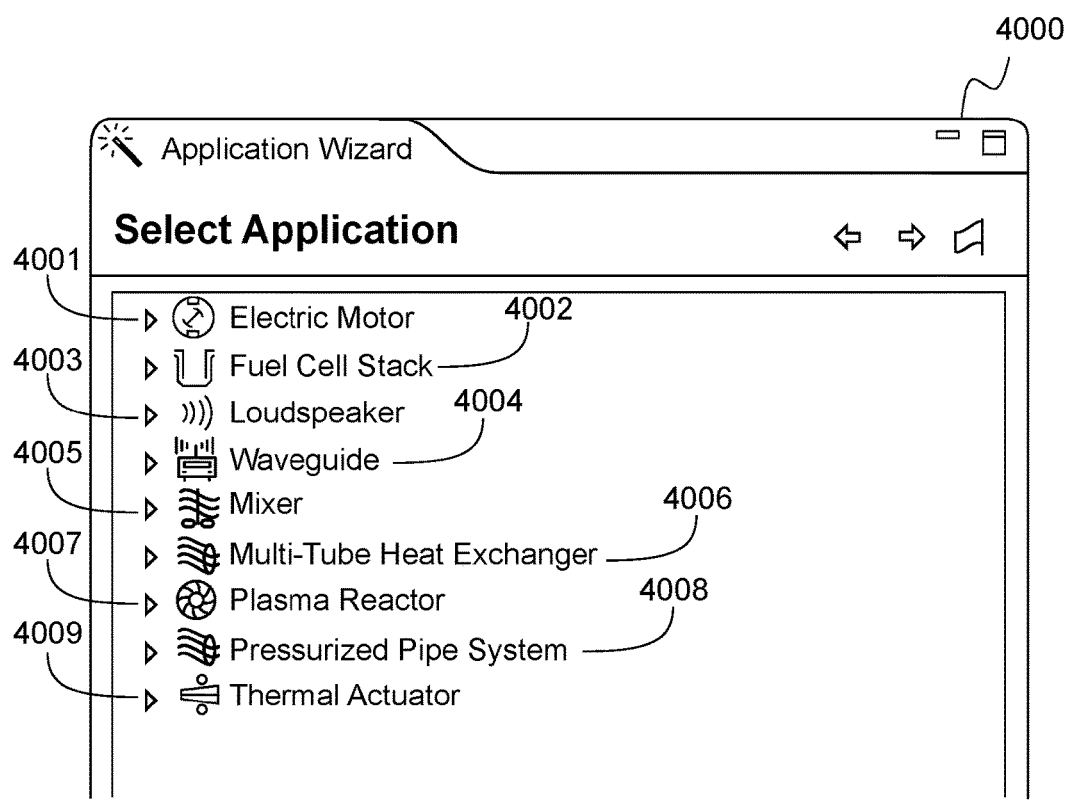
FIG. 40 illustrates an exemplary aspect of a selection window, according to aspects of the present disclosure.

Referring now to FIG. 40, an exemplary selection window 4000 for displaying a menu of applications is illustrating according to some aspects for interpreting an application data structure. Selecting an application, such as a thermal actuator application 4009, creates a first version of an application model data structure. The application model data structure can be edited by a user of an application through the application user interface.

Different applications can cover modeling and simulations over a wide range of fields. An application can cover the modeling and simulation of a specific type of electric motor 4001, fuel cell stack 4002, loudspeaker 4003, waveguide 4004, mixer 4005 for fine chemicals and food industries, multi-tube heat exchanger 4006, plasma reactor 4007, and pressurized pipe systems 4008, which just names a few of many examples for which an application data structure and application model structure can be formed or created by applying the processes and using the systems disclosed herein.

Figure 41A:
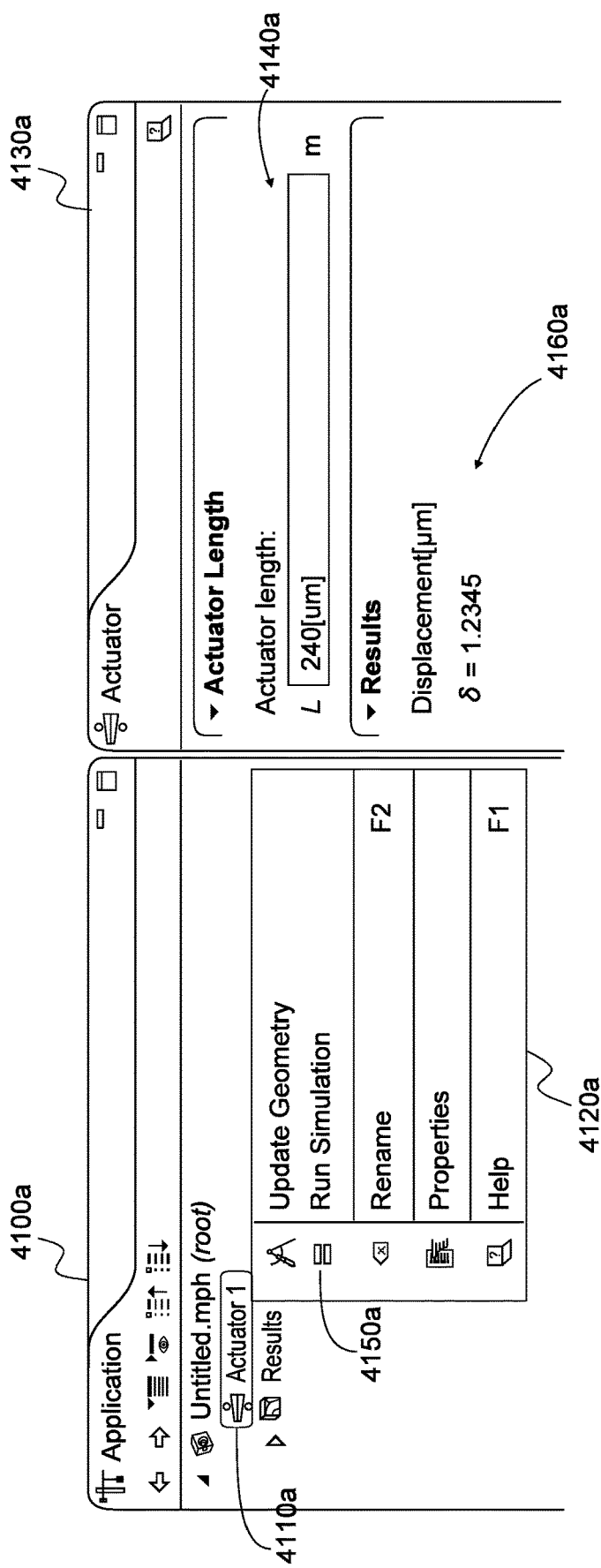
FIGS. 41A-41B illustrate exemplary aspects of an application model tree window and selection options created upon execution of exemplary actuator and mixer applications including geometry sequence operations, according to aspects of the present disclosure.

Referring now to FIG. 41A, an exemplary application model tree window 4100a is illustrated including display menus of application model features, such as a thermal actuator feature 4110a in a thermal actuator application, with a corresponding context menu 4120a according to some aspects of interpreting an application data structure. Selecting the thermal actuator feature 4110a can display a settings window 4130a where a user of the application can edit the settings for the thermal actuator, such as its length 4140a. Selecting a Run Simulation option 4150a in the context menu 4120a for the thermal actuator feature can create a final application model data structure, interpret the final model data structure in a multiphysics modeling system, and execute the simulation. It is contemplated that the application model data structure can be interpreted (e.g., executed) in a multiphysics modeling system to generate the simulation results. The simulation results can be displayed in an output form. For example, a result 4160a of the displacement of the thermal actuator can be displayed in the settings window 4130a.

Figure 41B:
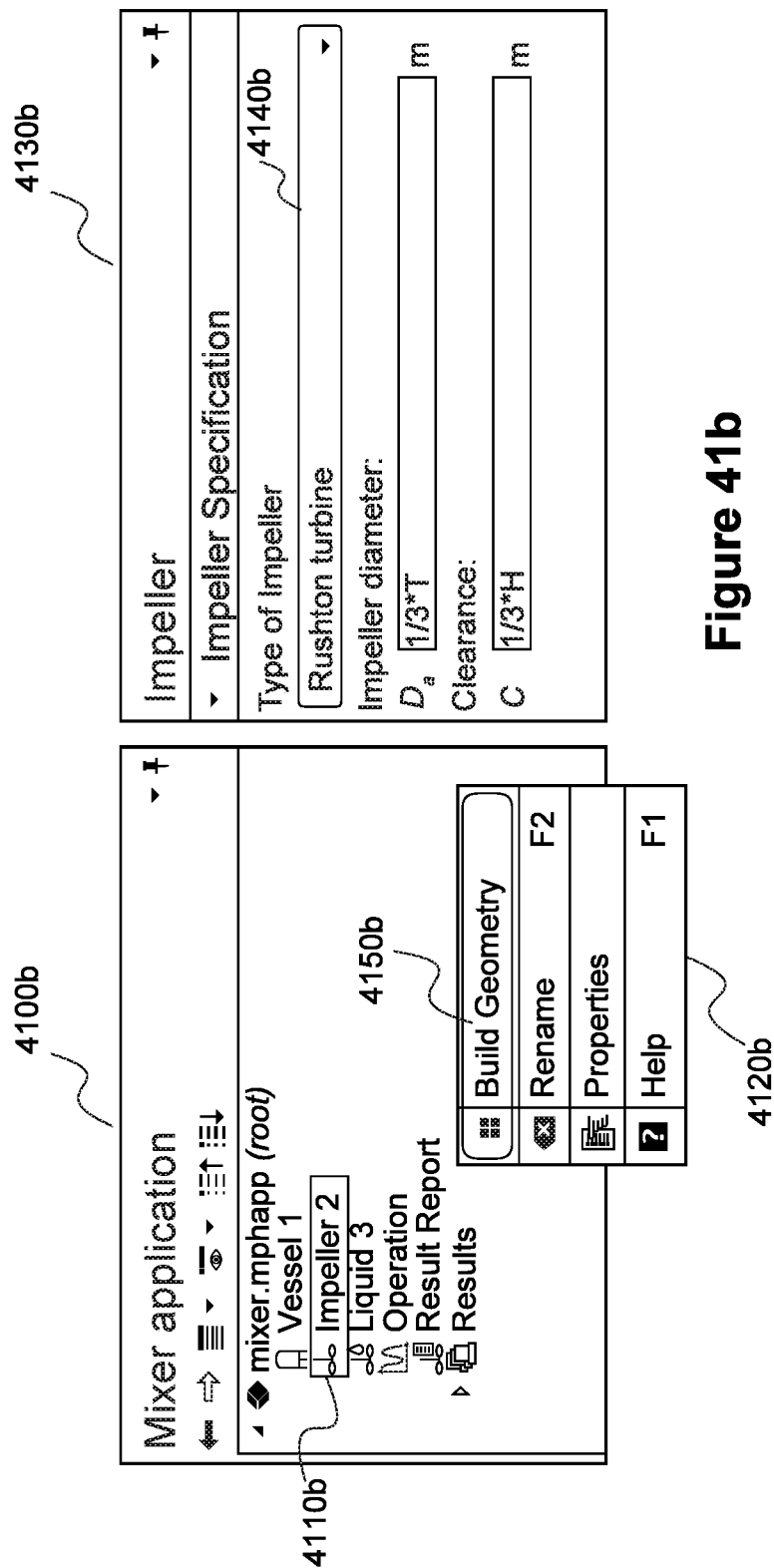

Referring now to FIG. 41B, an exemplary application model tree window 4100b is illustrated that includes display menus of application model features, such as an impeller feature 4110b in a mixer application, with its corresponding context menu 4120b, according to some aspects of a method for interpreting an application data structure. Selecting the impeller feature 4110b can display a settings window 4130b where the user of the application can edit the settings for the impeller. For example, the type can be edited in the corresponding combo box 4140b, which was previously defined in FIG. 34 at element 3426 along with setting the value of the parameter impeller type 3405. In some aspects, selection of "Build Geometry" 4150b in the context menu 4120b for the exemplary impeller feature can implement an action, such as the build impeller action of element 3409 from FIG. 34, for the geometry sequence in the embedded model. For example, the action can implement an if-statement (e.g., if impeller type=Rushton then refer to the Rushton geometry subroutine when building the geometry, when the application is run) for building the selected impeller type (e.g., element 3524 in FIG. 35B), call the corresponding geometry subroutine (e.g., 3523 in FIG. 35B), and add the geometry description and its cumulative selections to the application model data structure (e.g., the instantiation of the application data structure, including the instantiation of the embedded model data structure).

Figure 42:
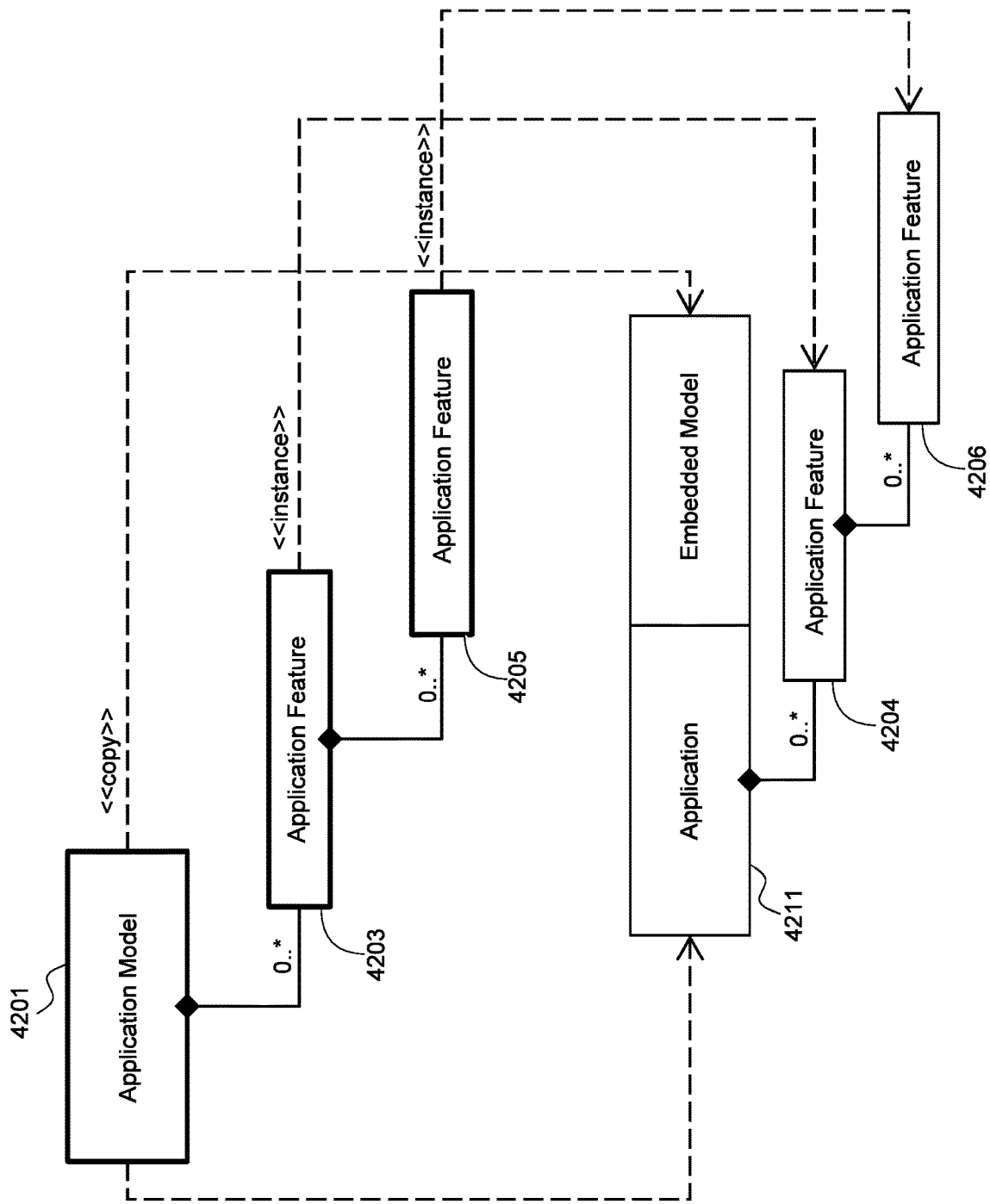
FIG. 42 illustrates an exemplary unified modeling language object diagram of instance level relationships between features of an application model data structure, according to aspects of the present disclosure.

Referring now to FIG. 42, an exemplary unified modeling language (UML) object diagram is illustrated of instance level relationships between features according to some aspects of an application model data structure created by the method steps in FIG. 39. The application model data structure 4201 can include an entire multiphysics model data structure, on which the application is based, together with a reference to the application data structure 4211. In addition, the application model data structure can also include a hierarchy to represent the application model features added by the user 4203. Each node can include a reference to the application feature in the application data structure 4204. An application model feature can include other application model features as children 4205 if this is allowed by the application data structure 4206.

Figure 43:
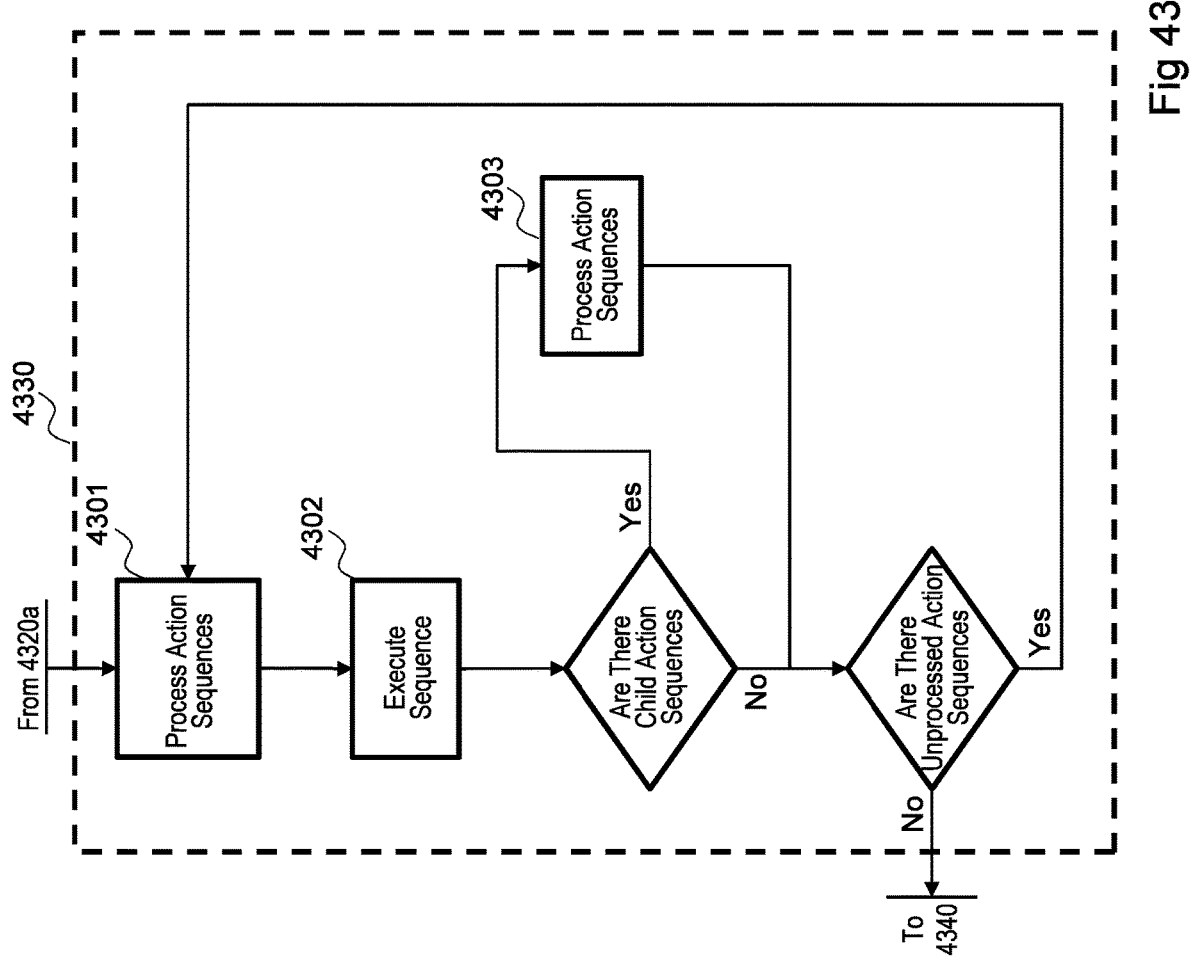
FIG. 43 illustrates an exemplary flowchart of method steps for interpreting (e.g., executing) an application model data structure, according to aspects of the present disclosure.
Figure 43:
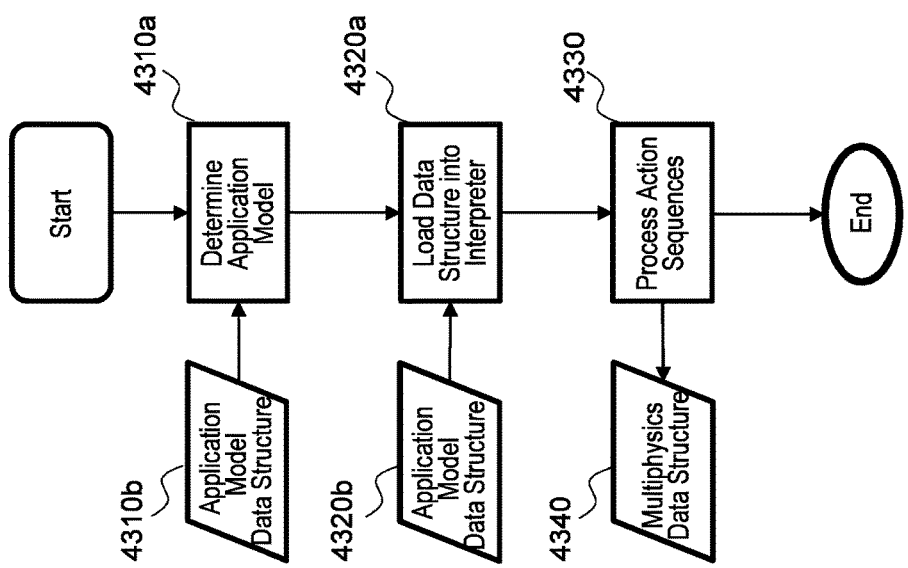

Referring now to FIG. 43, an exemplary flowchart of a method is illustrated according to some aspects for interpreting an application model data structure and generating a multiphysics model data structure that includes a model object. The method illustrated is for the steps prior to discretizing and solving the equations in a multiphysics modeling system. At step 4310a, an application model can be determined from an application model data structure 4310b. Next, at step 4320b, the application model data structure 4320b is loaded to the interpreter. Then, at step 4330, execution sequences from the application model data structure are processed. At steps 4301 and 4302, an execution sequence can be processed and executed. In addition, child execution sequences can also be processed at step 4303. When all execution sequences have been processed, a multiphysics model data structure may be generated at step 4340.

In some aspects, an apparatus for generating an application data structure includes a physical computing system comprising one or more processors, one or more user input devices, a display device, and one or more memory devices. At least one of the one or more memory devices includes executable instructions for generating an application data structure. The executable instructions cause at least one of the one or more processors to perform, upon execution, the acts of embedding a multiphysics model data structure for a physical system in an application data structure. The embedded multiphysics model data structure includes at least one modeling operation for the physical system. One or more application features are determined, via at least one of said one or more processors, to add to the application data structure. The one or more application features are associated with a model of the physical system. First data is added, via at least one of the one or more input devices, representing at least one form feature for at least one of the one or more application features for the model of the physical system. Second data is added, via at least one of the one or more input devices, representing at least one action feature for at least one of the one or more application features for the model of the physical system. The second data representing the at least one action feature is associated with the least one modeling operation for the physical system to define a sequence of operations for modeling the physical system. The application data structure is updated. The updated application data structure includes the added first data, the added second data, and the associating defining the sequence of operations. The updated application data structure is stored on at least one of the one or more memory devices.

In some aspects, a method executed in a computer system with one or more physical computing devices is configured to generate a modified application data structure to model a physical system. The method comprises the acts of embedding, via one or more physical computing devices, a multiphysics model data structure in an application data structure stored in one or more memory devices. The embedded multiphysics model data structure includes at least one multiphysics modeling operation for the physical system being modeled. One or more application features are determined, via at least one of the one or more physical computing devices, to add to the application data structure. The one or more application features are associated with the physical system. Application data is acquired, via at least one of the one or more physical computing devices, representing the one or more determined application features. The application data include form data representing at least one form feature and action data representing at least one action feature for modeling the physical system. A modified application data structure is formed including the acquired application data. The modified application data structure is stored on at least one of the one or more memory devices. The action data representing the at least one action feature is associated with the least one modeling operation for the physical system defined in the embedded multiphysics model data structure. The association between the action data and the at least one modeling operation defines a sequence of operations for modeling said physical system.

It is contemplated that the apparatus for generating an application data structure and the method for generating a modified application data structure to model a physical system that are described above can further include in some aspects one or more of the following features. Determining one or more application features can include one or more application feature selections received via one or more input devices associated with a graphical user interface displaying the application features. Acquiring of application data can include application data received via one or more input devices associated with a graphical user interface displaying options for the application features where the options include form features and action features. A defined sequence of operations can be configured to generate a geometry for the physical system. The forming of the modified or updated application data structure can further include the embedded multiphysics model data structure. The apparatus and method can further include outputting the modified or updated application structure as an input data structure configured to be received and executed in a multiphysics modeling system. The application data representing the one or more application features can further include declaration data defining input declarations for the physical system being modeled where the declaration data includes inputs of parameters to control settings for a physical component of the physical system of the model embedded in the multiphysics data structure.

It is further contemplated that the apparatus for generating an application data structure and the method for generating a modified application data structure to model a physical system that are described above can also include in some aspects one or more of the following additional features. The form data representing at least one form feature can include data defining an input form for collecting inputs of the parameters for the input declaration. The form data representing at least one form feature can further include additional data defining an activation condition for collecting the inputs of the parameters. The application data representing the one or more application features can include data defining an output declaration for declaring results to be displayed following implementation of a simulation of a model embedded in the multiphysics data structure. The form data representing the at least one form feature can include data defining an output form for displaying results declared in the output declaration. The form data representing the at least one form feature can further include additional data defining an activation condition for outputting the output form. The apparatus and method can also include the act of representing the modified or updated application data structure in an application tree.

In some aspects, a system generates a modified application data structure. The system comprises one or more physical memory devices, one or more display devices, one or more user input devices, and one or more processors configured to execute instructions stored on at least one of the one or more physical memory devices. The instructions cause at least one of the one or more processors to perform the acts comprising embedding, via one or more physical computing devices, a multiphysics model data structure in an application data structure stored in one or more memory devices. The embedded multiphysics model data structure includes at least one multiphysics modeling operation for the physical system being modeled. One or more application features are determined, via at least one of the one or more physical computing devices, to add to the application data structure. The one or more application features are associated with the physical system. Application data representing the one or more determined application features is acquired, via at least one of the one or more physical computing devices. The application data includes form data representing at least one form feature and action data representing at least one action feature for modeling the physical system. A modified application data structure is formed including the acquired application data. The modified application data structure is stored on at least one of the one or more memory devices. The action data representing the at least one action feature is associated with the least one modeling operation for the physical system defined in the embedded multiphysics model data structure. The association between the action data and the at least one modeling operation defines a sequence of operations for modeling the physical system.

It is contemplated that the system for generating a modified application data structure that is described above can further include in some aspects one or more of the following features. The acquiring of application data can include application data received via one or more input devices associated with a graphical user interface displaying options for the application features. The options can include form features and the action features. The defined sequence of operations can be configured to generate a geometry for the physical system. The system can also include performing the act of outputting the modified application structure as an input data structure configured to be received and executed in a multiphysics modeling system. The application data representing the one or more application features can further include declaration data defining input declarations for the physical system being modeled where the declaration data includes inputs of parameters to control settings for a physical component of the physical system of the model embedded in the multiphysics data structure.

In some aspects, a method executed in a computer system includes one or more processors configured to generate an application model data structure to model a physical system. The method comprises the acts of determining, via one or more processors, a plurality of applications for modeling one or more physical systems. The plurality of applications are defined by application data stored in one or more application data structures. A list of the plurality of applications is displayed in one or more graphical user interfaces. A first input indicative of a selection of at least one of the plurality of applications is received. One or more application features are determined, via at least one of the one or more processors, for the selection of at least one of the plurality of applications. The one or more application features are represented as application data defined in and retrieved from at least one of the one or more application data structures. The determined application feature is displayed in at least one of the one or more graphical user interfaces. A second input indicative of a selection of at least one of the application features is received. One or more settings for the selection of at least one of the application features is determined via at least one of the one or more processors. The one or more settings are associated with parameters for the modeling of the one or more physical systems. Edit fields including at least one of the one or more settings are displayed via at least one of the one or more graphical user interfaces. At least one of the edit fields is selected. Edits to said one or more setting included in the selected at least one edit field are receiving via one or more user input devices. An application model data structure is generated, via at least one of said one or more processors, that includes the received edits to the at least one or more settings to the at least one or more application features retrieved from the one or more application data structures.

It is contemplated that the method for generating an application model data structure to model a physical system that is described above can further include in some aspects one or more of the following features. The method can further include the acts of determining, via at least one of said one or more processors, a sequence of actions defined in the generated application model data structures, and executing, via at least one of said one or more processors, the sequence of actions. The method can also include the act of calling a geometry subroutine as part of an action of executing a geometry sequence.

It is contemplated that the methods for generating an application data structure, a modified application data structure, or an application model data structure, or the systems for modifying an application data structure that are described above can further include one or more of the following exemplary features: (i) application features and application data for setting a frequency for a time harmonic electromagnetic field (input), running a simulation (action), and displaying the S-parameters (output) by executing a model defined in an embedded model; (ii) application features and application data for receiving an input for updating a reference pressure, running a simulation, and displaying the resulting wave propagation by executing an embedded model of an acoustics simulation; (iii) application features and application data for receiving an inlet flow rate, running a fluid flow simulation, and displaying an average flow rate at a pipe outlet from a fluid flow model for a tank defined in an embedded model; (iv) application features and application data for determining the size of a heat sink (activation condition, output) for keeping a temperature below a given input value (input), for a given input load (input), by executing a simulation (action) of a model of an electronic device defined in an embedded model; (v) application features and application data for receiving the values of a parameterized plasma reactor, updating the geometry (action, activation condition), and executing a simulation in order to determine a deposit thickness of semiconductor materials on a surface of a wafer, by executing a plasma reactor model defined in an embedded model.

Certain aspects of the present disclosure contemplate methods, systems, or apparatus based on any and all combinations of any two or more of the steps, acts, or features, individually or collectively, that are disclosed or referred to or otherwise indicated herein.

The exemplary aspects for generating an application data structure, for generating an application model data structure, for interpreting an application model data structure, and for generating a multiphysics model data structure presented in FIGS. 16-43 are merely examples and are understood to apply to broader applications and physic phenomena, not just the application phenomena described in more detail or illustrated in the figures. For example, it would be understood that many different applications data structures can be generated using the present disclosures. The illustrated aspects are merely examples of the broader operations that may be performed by an application builder system or module and a multiphysics modeling system. Furthermore, the illustrated interfaces are representative of a small number of interfaces that may be used in an application builder module and a multiphysics modeling system. Other types of graphical, user, or alternative input-type interfaces are contemplated.

The above concepts are further described via the various alternatives detailed below in Alternatives A through AB, and can include various combinations and subcombinations of these alternatives.

Alternative A

According to one aspect of the present disclosure, a system is adapted to generate a customized application data structure for modeling physical systems. The system comprises one or more processors, one or more user input devices, optionally a display device, and one or more memory devices. The one or more processors are adapted, during use, to embed a pre-determined or selected multiphysics model data structure in an application data structure. The multiphysics model data structure comprises a representation of one or more models of physical systems. Each model of a physical system represents physical phenomena and/or physical processes. The multiphysics model data structure comprises data representing at least one modeling operation determining how to model or simulate the one or more models of physical systems. Data representing one or more application features are added to the application data structure. Each application feature comprises one or more of first data representing at least one form feature, and/or second data representing at least one action feature. A form feature comprises data specifying input data and/or output data and/or presentation format of input and/or output data. An action feature comprises data specifying a sequence of operations to be carried out, when executing the application data structure. At least one of the sequence of operations to be carried out comprises the at least one modeling operation. At least one of the sequence of operations to be carried out comprises an operation providing data for generating at least one geometry of at least a part of the one or more models of physical systems. A customized application data structure is then generated providing, when executed, a customized modeling of the physical systems using the at least one modeling operation, the at least one geometry of at least a part of the one or more models of physical systems, and at least one of the one or more application features.

Alternative B

According to one aspect of the present disclosure, a system is adapted to generate a customized application data structure for modeling physical systems. The system comprises one or more processors, one or more user input devices, optionally a display device, and one or more memory devices. The one or more processors are adapted, during use, to embed a pre-determined or selected multiphysics model data structure in an application data structure. The multiphysics model data structure comprises a representation of one or more models of physical systems. Each model of a physical system represents physical phenomena and/or physical processes. The multiphysics model data structure comprises data representing at least one modeling operation determining how to model or simulate the one or more models of physical systems. Data representing one or more application features are added to the application data structure to generate, upon execution, a customized application data structure. Each application feature comprises one or more of first data representing at least one form feature, and/or second data representing at least one action feature. A form feature comprises data specifying input data and/or output data and/or presentation format of input and/or output data. An action feature comprises data specifying a sequence of operations to be carried out, when executing the application data structure. At least one of the sequence of operations to be carried out comprises the at least one modeling operation. At least one of the sequence of operations to be carried out comprises an operation providing data for generating at least one geometry of at least a part of the one or more models of physical systems. The customized application data structure, when executed, provides a customized modeling of the physical systems using the at least one modeling operation, the at least one geometry of at least a part of the one or more models of physical systems, and at least one of the one or more application features.

Alternative C

According to one aspect of the present disclosure, a system is adapted to generate an application data structure for modeling physical systems. The system comprises one or more processors, one or more user input devices, optionally a display device, and one or more memory devices. The one or more processors are adapted, during use, to embed a pre-determined or selected multiphysics model data structure in the application data structure. The multiphysics model data structure comprises a representation of one or more models of physical systems. Each model of a physical system represents physical phenomena and/or physical processes. The multiphysics model data structure comprises data representing at least one modeling operation determining how to model or simulate the one or more models of physical systems. Data representing one or more application features are added to the application data structure. Each application feature comprises one or more of first data representing at least one form feature, and/or second data representing at least one action feature. A form feature comprises data specifying input data and/or output data and/or presentation format of input and/or output data. An action feature comprises data specifying a sequence of operations to be carried out, when executing the application data structure. At least one of the sequence of operations to be carried out comprises the at least one modeling operation. At least one of the sequence of operations to be carried out comprises an operation providing data for generating at least one geometry of at least a part of the one or more models of physical systems. An application data structure is then generated providing, when executed, a customized modeling of the physical systems using the at least one modeling operation, the at least one geometry of at least a part of the one or more models of physical systems, and at least one form feature.

Alternative D

The system according to any one of alternatives A or B can include that the customized application data structure is generated using at least one form feature.

Alternative E

The system according to any one of alternatives A to D can include the system further being adapted to model or simulate one or more physical systems by executing the application data structure (e.g., the customized application data structure), presenting output data and/or receiving input data from a user according to at least one form feature, and executing the at least one modeling operation using at least one generated geometry.

Alternative F

The system according to any one of alternatives A to E can be further adapted to modify or update the application data structure according to one or more of: (i) presenting via a graphical user interface one or more pre-selected multiphysics model data structures to a user and adding data representing one or more user-selected and optionally user-modified multiphysics model data structures to the application data structure, (ii) presenting via a graphical user interface one or more pre-selected application features to a user and adding data representing one or more user-selected and optionally user-modified application features to the application data structure, and (iii) for at least one user-selected application feature, presenting via a graphical user interface one or more pre-selected form features and/or one or more action features, and adding data representing one or more user-selected and optionally user-modified form features and/or action features to the application data structure.

Alternative G

The system according to any one of alternatives A to F can include the one or more application features further comprising data representing one or more of: (i) one or more of input declarations, each input declaration controlling inputs of parameters controlling settings for a physical component of at least one of the one or more models of physical systems, (ii) one or more activation conditions, each activation condition specifying one or more logical conditions checking the value of an input declaration, (iii) one or more output declarations, each output declaration specifying results to be displayed following simulation of the one or more models of physical systems, (iv) one or more input forms controlling the displaying and collecting of inputs, and (v) one or more output forms controlling the displaying of results declared in an output declaration.

Alternative H

The system according to any one of alternative A to G can include at least one form feature enabling, when the application feature comprising the form feature is executed, receiving input from a user to modify and/or pre-select the sequence of operations.

Alternative I

The system according to any one of alternatives A to H can include at least one form feature enabling, when the application feature comprising the form feature is executed, receiving input from a user to modify and/or pre-select the at least one geometry and/or the at least one modeling operation Alternative J The system according to any one of alternatives A to I can include that the geometries of the at least one geometry, each can be one of zero dimensional, one dimensional, two dimensional, or three dimensional. The system according to any one of alternatives A to I can also include that the geometries of the at least one geometry, each can be either one of zero dimensional, two dimensional, or three dimensional.

Alternative K

The system according to any one of alternatives A to J can include the least one modeling operation comprising one or more partial differential equations for solving coupled systems or representations.

Alternative L

The system according to any one of alternatives A to K can include: (i) application features comprising an input declaration, an output declaration, and an action feature for setting a frequency for a time harmonic electromagnetic field, executing a simulation, and displaying S-parameters; (ii) the embedded multiphysics model data structure being for an acoustic simulation, and wherein application features comprise an input declaration, an output declaration, and an action feature for receiving an input for updating a reference pressure, executing a simulation, and displaying a resulting wave propagation; (iii) the embedded multiphysics model data structure being for a fluid flow simulation in a tank, and wherein application features comprise an input declaration, an output declaration, and an action feature for receiving an inlet flow rate, executing a fluid flow simulation, and displaying an average flow rate at a pipe outlet; (iv) the embedded multiphysics model data structure being for an electronic device, and wherein application features include an input declaration, an output declaration, a form feature, an activation condition, and an action feature for determining a size of a heat sink and for maintaining a temperature below a given input value at a given input load; and/or (v) application features comprising an input declaration, an output declaration, a form feature, an activation condition, and an action feature for receiving values of a parameterized plasma reactor, updating a geometry, and executing a simulation for determining a deposit thickness of semiconductor materials on a surface of a wafer.

Alternative M

The system according to any one of alternatives A to L can include that the application data structure is an initial application data structure that is used in generating the customized application data structure. The initial application data structure includes at least one previously embedded application feature and/or at least one previously embedded multiphysics model data structure.

Alternative N

According to another aspect of the present disclosure, a method generates an application data structure for modeling physical systems. The method comprises embedding a predetermined or selected multiphysics model data structure in the application data structure. The multiphysics model data structure comprises a representation of one or more models of physical systems. Each model of a physical system represents physical phenomena and/or physical processes. The multiphysics model data structure comprises data representing at least one modeling operation determining how to model or simulate the one or more models of physical systems. Data representing one or more application features are added to the application data structure. Each application feature comprises one or more of first data representing at least one form feature, and/or second data representing at least one action feature. A form feature comprises data specifying input data and/or output data and/or presentation format of input and/or output data. An action feature comprises data specifying a sequence of operations to be carried out, when executing the application data structure. At least one of the sequence of operations to be carried out comprises the at least one modeling operation. At least one of the sequence of operations to be carried out comprises an operation providing data for generating at least one geometry of at least a part of the one or more models of physical systems. An application data structure is generated providing, when executed, a customized modeling of the physical systems using the at least one modeling operation, the at least one geometry of at least a part of the one or more models of physical systems, and at least one form feature.

Alternative O

According to another aspect of the present disclosure, a method generates a customized application data structure for modeling physical systems. The method comprises embedding a pre-determined or selected multiphysics model data structure in an application data structure. The multiphysics model data structure comprises a representation of one or more models of physical systems. Each model of a physical system represents physical phenomena and/or physical processes. The multiphysics model data structure comprises data representing at least one modeling operation determining how to model or simulate the one or more models of physical systems. Data representing one or more application features are added to the application data structure. Each application feature comprises one or more of first data representing at least one form feature, and/or second data representing at least one action feature. A form feature comprises data specifying input data and/or output data and/or presentation format of input and/or output data. An action feature comprises data specifying a sequence of operations to be carried out, when executing the application data structure. At least one of the sequence of operations to be carried out comprises the at least one modeling operation. At least one of the sequence of operations to be carried out comprises an operation providing data for generating at least one geometry of at least a part of the one or more models of physical systems. A customized application data structure is then generated from the embedding and adding operations. The customized application data structure provides, when executed, a customized modeling of the physical systems using the at least one modeling operation, the at least one geometry of at least a part of the one or more models of physical systems, and at least one of the one or more application features.

Alternative P

According to another aspect of the present disclosure, a method generates a customized application data structure for modeling physical systems. The method comprises embedding, by one or more processors, a pre-determined or selected multiphysics model data structure in an application data structure. The multiphysics model data structure comprises a representation of one or more models of physical systems. Each model of a physical system represents physical phenomena and/or physical processes. The multiphysics model data structure comprises data representing at least one modeling operation determining how to model or simulate the one or more models of physical systems. Data representing one or more application features are added to the application data structure by at least one of the one or more processors and/or by one or more input devices. Each application feature comprises one or more of first data representing at least one form feature, and/or second data representing at least one action feature. A form feature comprises data specifying input data and/or output data and/or presentation format of input and/or output data. An action feature comprises data specifying a sequence of operations to be carried out, when executing the application data structure. At least one of the sequence of operations to be carried out comprises the at least one modeling operation. At least one of the sequence of operations to be carried out comprises an operation providing data for generating at least one geometry of at least a part of the one or more models of physical systems. Using at least one of the one or more processors, an application data structure is generated providing, when executed, a customized modeling of the physical systems using the at least one modeling operation, the at least one geometry of at least a part of the one or more models of physical systems, and at least one of the one or more application features.

Alternative Q

According to another aspect of the present disclosure, a method generates a customized application data structure for modeling physical systems. The method comprises embedding a pre-determined or selected multiphysics model data structure in an application data structure. The multiphysics model data structure comprises a representation of one or more models of physical systems. Each model of a physical system represents physical phenomena and/or physical processes. The multiphysics model data structure comprises data representing at least one modeling operation determining how to model or simulate the one or more models of physical systems. Data representing one or more application features are added to the application data structure to generate a customized application data structure. Each application feature comprises one or more of first data representing at least one form feature, and/or second data representing at least one action feature. A form feature comprises data specifying input data and/or output data and/or presentation format of input and/or output data. An action feature comprises data specifying a sequence of operations to be carried out, when executing the application data structure. At least one of the sequence of operations to be carried out comprises the at least one modeling operation. At least one of the sequence of operations to be carried out comprises an operation providing data for generating at least one geometry of at least a part of the one or more models of physical systems. The customized application data structure, when executed, provides a customized modeling of the physical systems using the at least one modeling operation, the at least one geometry of at least a part of the one or more models of physical systems, and at least one of the one or more application features.

Alternative R

The method according to any one of alternatives O to Q can include that the customized application data structure is generated using at least one form feature.

Alternative S

The method according to any one of alternatives N to R can include modeling or simulating one or more physical systems by executing the customized application data structure, presenting output data and/or receiving input data from a user according to at least one form feature, and executing the at least one modeling operation using at least one generated geometry.

Alternative T

The method according to any one of alternatives N to S can be further adapted to modify or update the application data structure according to one or more of: (i) resenting via a graphical user interface one or more pre-selected multiphysics model data structures to a user and adding data representing one or more user-selected and optionally user-modified multiphysics model data structures to the application data structure, (ii) presenting via a graphical user interface one or more pre-selected application features to a user and adding data representing one or more user-selected and optionally user-modified application features to the application data structure, and (iii) for at least one user-selected application feature, presenting via a graphical user interface one or more pre-selected form features and/or one or more action features, and adding data representing one or more user-selected and optionally user-modified form features and/or action features to the application data structure.

Alternative U

The method according to any one of alternatives N to T can include at least one form feature enabling, when the application feature comprising the form feature is executed, receiving input from a user to modify and/or pre-select the sequence of operations.

Alternative V

The method according to any one of alternatives N to U can include at least one form feature enabling, when the application feature comprising the form feature is executed, receiving input from a user to modify and/or pre-select the at least one geometry and/or the at least one modeling operation Alternative W The method according to any one of alternatives N to V can include that the geometries of the at least one geometry, each can be one of zero dimensional, one dimensional, two dimensional, or three dimensional. The method according to any one of alternatives N to V can also include that the geometries of the at least one geometry, each can be one of zero dimensional, two dimensional, or three dimensional.

Alternative X

The method according to any one of alternatives N to W can include the least one modeling operation comprising one or more partial differential equations for solving coupled systems or representations.

Alternative Y

The method according to any one of alternatives N to X can include: (i) application features comprising an input declaration, an output declaration, and an action feature for setting a frequency for a time harmonic electromagnetic field, executing a simulation, and displaying S-parameters; (ii) the embedded multiphysics model data structure being for an acoustic simulation, and wherein application features comprise an input declaration, an output declaration, and an action feature for receiving an input for updating a reference pressure, executing a simulation, and displaying a resulting wave propagation; (iii) the embedded multiphysics model data structure being for a fluid flow simulation in a tank, and wherein application features comprise an input declaration, an output declaration, and an action feature for receiving an inlet flow rate, executing a fluid flow simulation, and displaying an average flow rate at a pipe outlet; (iv) the embedded multiphysics model data structure being for an electronic device, and wherein application features include an input declaration, an output declaration, a form feature, an activation condition, and an action feature for determining a size of a heat sink and for maintaining a temperature below a given input value at a given input load; and/or (v) application features comprising an input declaration, an output declaration, a form feature, an activation condition, and an action feature for receiving values of a parameterized plasma reactor, updating a geometry, and executing a simulation for determining a deposit thickness of semiconductor materials on a surface of a wafer.

Alternative Z

The method according to any one of alternatives N to Y can include that the application data structure is an initial application data structure that is used in generating the customized application data structure. The initial application data structure includes at least one previously embedded application feature and/or at least one previously embedded multiphysics model data structure.

Alternative AA

Uses of a customized application data structure for modeling physical systems generated and/or modified by a system according to any one of alternatives A to M or by a method according to any one of alternatives N to Z by a user in the system according to any one of alternatives A to M or in another system can include one or more processors, one or more user input devices, optionally a display device, and one or more memory devices.

Alternative AB

A customized application data structure for modeling physical systems, stored on a physical medium or in a system comprising one or more processors and one or more memory devices, can include the customized application data structure being generated and/or modified by a system according to any one of alternatives A to M and/or by a method according to any one of alternatives N to Z.

It is further contemplated that application data structure(s), including the ones described by one or more of alternatives A to AB, can comprise earlier created customized application data structure(s) that may be stored and retrieved. For example, an earlier customized application data structure may be retrieved and embedded into a memory where the application data structure is then further customized and/or modified thereby creating an updated and/or revised application data structure with different application features and/or multiphysics model data structure(s).

Additional aspects of above concepts are further described via the various additional alternatives detailed below in Alternatives AA1 through AA47, and can include various combinations and subcombinations of these alternatives.

Alternative AA1

According to another aspect of the present disclosure, a method is executed in a computer system for generating an application data structure in a graphical user interface. The method comprises the steps of embedding a multiphysics model data structure in an application data structure. One or more application features are added to the application data structure. At least one form feature is added to the application feature. At least one action feature is added to the application feature. The action feature is linked with at least one operation defined in the embedded multiphysics model data structure.

Alternative AA2

The method according to alternative AA1 can further include representing the application data structure in an application tree.

Alternative AA3

The method according to any one of alternatives AA1 to AA2 can further include adding a geometry subroutine in the embedded multiphysics model data structure, and adding a geometry subroutine call feature to the embedded multiphysics model data structure.

Alternative AA4

The method according to any one of alternatives AA1 to AA3 can further include receiving input selections in the geometry subroutine for a set of geometry operations in the embedded multiphysics model data structure. Output selections are generated in the geometry subroutine in the embedded multiphysics model data structure. Contributions are generated to a cumulative selection in the embedded multiphysics model data structure.

Alternative AA5

The method according to any one of alternatives AA1 to AA4 can further include receiving position and orientation of matching work planes for a set of geometry operations in the geometry subroutine in the embedded multiphysics model data structure. Position(s) and orientation(s) are generated for matching work planes in the geometry subroutine in the embedded multiphysics model data structure.

Alternative AA6

The method according to any one of alternatives AA1 to AA5 can further include linking the geometry subroutine call to an external multiphysics model data structure in the embedded multiphysics model data structure.

Alternative AA7

The method according to any one of alternatives AA1 to AA6 can further comprise including the geometry call in an if, else-if, or else-statement in the embedded multiphysics model data structure.

Alternative AA8

According to another aspect of the present disclosure, a method is executed in a computer system for generating an application model data structure in a graphical user interface. The method comprises the steps of determining and displaying a set of applications defined in a set of application data structures. At least one application is selected. Application features are determined and displayed for the selected application defined in an application data structure. Application features are then selected. Settings for the selected application features defined in the application data structure are determined and displayed. Settings for the selected application features are then edited.

Alternative AA9

The method according to alternative AA8 can further include selecting the application feature for a geometry operation that calls a geometry subroutine, and adding the geometry operation to the application model data structure.

Alternative AA10

The method according to any one of alternatives AA8 to AA9 can further include adding output selections in the application model data structure, and adding contributions to cumulative selections in the application model data structure.

Alternative AA11

According to another aspect of the present disclosure, a method is executed in a computer system for generating an application model data structure. The method comprises determining an application model defined in an application model data structure. At least one application model data structure is loaded. A sequence of actions defined in the one or more application model data structures is processed, and action sequences are executed.

Alternative AA12

The method according to alternative AA11 can further include processing a geometry sequence including a geometry subroutine call, and executing the geometry sequence actions.

Alternative AA13

According to another aspect of the present disclosure, a system is adapted to generate a customized application data structure for modeling physical systems. The system comprises one or more processors, one or more user input devices, optionally a display device, and one or more memory devices. The one or more processors are adapted, during use, to embed a pre-determined or selected multiphysics model data structure in an application data structure. The multiphysics model data structure comprises a representation of one or more models of physical systems. Each model of a physical system represents physical phenomena and/or physical processes. The multiphysics model data structure comprises data representing at least one modeling operation determining how to model or simulate the one or more models of physical systems. Geometry data representing one or more geometry subroutines is added to the embedded multiphysics model data structure. The added geometry data comprises parameter definitions for the one or more models of physical systems. Call data representing one or more geometry subroutine calls for implementing at least one of the one or more geometry subroutines is added to the embedded multiphysics model data structure. Application data representing one or more application features are added to the application data structure. Each application feature comprises one or more of first data representing at least one form feature, and/or second data representing at least one action feature. A form feature comprises data specifying input data and/or output data and/or presentation format of input and/or output data. An action feature comprises data specifying a sequence of operations to be carried out, when executing the application data structure. At least one of the sequence of operations to be carried out comprises the at least one modeling operation. At least one of the sequences of operations to be carried out comprises an operation providing data for generating at least one geometry of at least a part of the one or more models of physical systems. A customized application data structure is then generated providing, when executed, a customized modeling of the physical systems using the at least one modeling operation, the at least one geometry of at least a part of the one or more models of physical systems, and at least one of the one or more application features (e.g., including at least one form feature), and at least one of the one or more geometry subroutines.

Alternative AA14

The method according to alternative AA13 can further include that the geometry data representing the one or more geometry subroutines includes argument data for at least a portion of the parameter definitions. The argument data includes parameters for controlling geometry operations and geometrical dimensions of objects in geometry modeling operations associated with the one or more models of physical systems.

Alternative AA15

The method according to any one of alternatives AA13 to AA14 can further include that the geometry data representing the one or more geometry subroutines includes instruction data for generating output selections referring to the at least one modeling operations in the embedded multiphysics model data structure.

Alternative AA16

The method according to any one of alternatives AA13 to AA15 can further include that the customized application data structure is generated using at least one form feature.

Alternative AA17

The method according to any one of alternatives AA13 to AA16 can further include that the system is further adapted to model or simulate one or more physical systems by executing the customized application data structure, presenting output data and/or receiving input data from a user according to at least one form feature, and executing the at least one modeling operation using at least one generated geometry resulting from execution of at least one of the one or more geometry subroutines.

Alternative AA18

The method according to any one of alternatives AA13 to AA17 can further include that the system is further adapted to modify or update the application data structure according to one or more of: (i) presenting via a graphical user interface one or more pre-selected multiphysics model data structures to a user and adding data representing one or more user-selected and optionally user-modified multiphysics model data structures to the application data structure, (ii) presenting via a graphical user interface one or more pre-selected application features to a user and adding data representing one or more user-selected and optionally user-modified application features to the application data structure, and (iii) for at least one user-selected application feature, presenting via a graphical user interface one or more pre-selected form features and/or one or more action features, and adding data representing one or more user-selected and optionally user-modified form features and/or action features to the application data structure.

Alternative AA19

The method according to any one of alternatives AA13 to AA18 can further include that at least one form feature enables, when the application feature comprising the form feature is executed, receiving input from a user to modify and/or pre-select the at least one geometry and/or the at least one modeling operation.

Alternative AA20

The method according to any one of alternatives AA13 to AA19 can further include that the application data structure is an initial application data structure that is used in generating the customized application data structure. The initial application data structure includes at least one previously embedded application feature and/or at least one previously embedded multiphysics model data structure.

Alternative AA21

According to another aspect of the present disclosure, a method generates a customized application data structure for modeling physical systems. The method comprises embedding a pre-determined or selected multiphysics model data structure in an application data structure. The multiphysics model data structure comprises a representation of one or more models of physical systems. Each model of a physical system represents physical phenomena and/or physical processes. The multiphysics model data structure comprises data representing at least one modeling operation determining how to model or simulate the one or more models of physical systems. Geometry data representing one or more geometry subroutines is added to the embedded multiphysics model data structure. The added geometry data comprises parameter definitions for the one or more models of physical systems. Call data representing one or more geometry subroutine calls for implementing at least one of the one or more geometry subroutines is added to the embedded multiphysics model data structure. Data representing one or more application features are added to the application data structure. Each application feature comprises one or more of first data representing at least one form feature, and/or second data representing at least one action feature. A form feature comprises data specifying input data and/or output data and/or presentation format of input and/or output data. An action feature comprises data specifying a sequence of operations to be carried out, when executing the application data structure. At least one of the sequence of operations to be carried out comprises the at least one modeling operation. At least one of the sequence of operations to be carried out comprises an operation providing data for generating at least one geometry of at least a part of the one or more models of physical systems. A customized application data structure is generated from the embedding and adding operations. The customized application data structure provides, when executed, a customized modeling of the physical systems using the at least one modeling operation, the at least one geometry of at least a part of the one or more models of physical systems, and at least one of the one or more application features (e.g., including at least one form feature).

Alternative AA22

The method according to alternative AA21 can further include that the geometry data representing the one or more geometry subroutines includes argument data for at least a portion of the parameter definitions. The argument data includes parameters for controlling geometry operations and geometrical dimensions of objects in geometry modeling operations associated with the one or more models of physical systems.

Alternative AA23

The method according to any one of alternatives AA21 to AA22 can further include that the geometry data representing the one or more geometry subroutines includes instruction data for generating output selections referring to the at least one modeling operations in the embedded multiphysics model data structure.

Alternative AA24

The method according to any one of alternatives AA21 to AA23 can further include receiving input selection data for the one or more geometry subroutines. The input selection data includes geometry operation data for the embedded multiphysics model data structure. Output selection data is generated from the geometry data for geometry entities in the embedded multiphysics model data structure. Contribution data is generated for a cumulative geometry entity selection in the embedded multiphysics model data structure. The contribution data are associated with geometry entity selections for model operations in the one or more models of the physical system.

Alternative AA25

The method according to any one of alternatives AA21 to AA24 can further include receiving first position and orientation data for matching an end plane of an existing work plane defined in a geometry sequence of the geometry subroutine in the embedded multiphysics model data structure. Second position and orientation data is generated for a start plane matched with the end plane of the existing work plane. The generated second position and orientation data are accessible in the geometry sequence of the geometry subroutine in the embedded multiphysics model data structure.

Alternative AA26

The method according to any one of alternatives AA21 to AA25 can further include linking the call data representing at least one of the one or more geometry subroutine calls to a second external multiphysics model data structure in the embedded multiphysics model data structure.

Alternative AA27

The method according to any one of alternatives AA21 to AA26 can further include that the call data representing at least one of the geometry subroutine calls includes representations for an if, else-if, and/or else-statement in the embedded multiphysics model data structure.

Alternative AA28

The method according to any one of alternatives AA21 to AA27 can further include modeling or simulating one or more physical systems by executing the customized application data structure, presenting output data and/or receiving input data from a user according to at least one form feature, and executing the at least one modeling operation using at least one generated geometry.

Alternative AA29

The method according to any one of alternatives AA21 to AA28 can further include that the method is further adapted to modify or update the application data structure according to one or more of: (i) presenting via a graphical user interface one or more pre-selected multiphysics model data structures to a user and adding data representing one or more user-selected and optionally user-modified multiphysics model data structures to the application data structure, (ii) presenting via a graphical user interface one or more pre-selected application features to a user and adding data representing one or more user-selected and optionally user-modified application features to the application data structure, and (iii) for at least one user-selected application feature, presenting via a graphical user interface one or more pre-selected form features and/or one or more action features, and adding data representing one or more user-selected and optionally user-modified form features and/or action features to the application data structure.

Alternative AA30

The method according to any one of alternatives AA21 to AA30 can further include that at least one form feature enables, when the application feature comprising the form feature is executed, receiving input from a user to modify and/or pre-select the at least one geometry and/or the at least one modeling operation.

Alternative AA31

The method according to any one of alternatives AA21 to AA31 can further include that the application data structure is an initial application data structure that is used in generating the customized application data structure. The initial application data structure includes at least one previously embedded application feature and/or at least one previously embedded multiphysics model data structure.

Alternative AA32

According to another aspect of the present disclosure, an apparatus for generating an application data structure includes a physical computing system comprising one or more processing units, one or more user input devices, a display device, and one or more memory devices. At least one of the one or more memory devices includes executable instructions for generating an application data structure. The executable instructions cause at least one of the one or more processing units to perform, upon execution, the acts of embedding a multiphysics model data structure for a physical system in an application data structure. The embedded multiphysics model data structure includes at least one modeling operation for the physical system. One or more geometry subroutines are added to the embedded multiphysics model data structure via at least one of the one or more input devices. At least one of the one or more geometry subroutines includes parameter definitions associated with the physical system. One or more call features are added to the embedded multiphysics data structure via at least one of the one or more input devices. The call features allow implementation of the geometry subroutines. One or more application features are determined, via at least one of said one or more processing units, to add to the application data structure. The one or more application features are associated with a model of the physical system. First data is added, via at least one of the one or more input devices, representing at least one form feature for at least one of the one or more application features for the model of the physical system. Second data is added, via at least one of the one or more input devices, representing at least one action feature for at least one of the one or more application features for the model of the physical system. The second data representing the at least one action feature is associated with the least one modeling operation for the physical system to define a sequence of operations for modeling the physical system.

Alternative AA33

The apparatus according to alternative AA32 can further include that at least one of the one or more memory devices includes executable instructions for generating an application data structure. The executable instructions cause at least one of the one or more processing units to perform, upon execution, further acts including updating the application data structure, the updated application data structure including the added first data, the added second data, the defined sequence of operations, the one or more geometry subroutines, and the one or more call features. The updated application data structure is stored on at least one of the one or more memory devices.

Alternative AA34

The apparatus according to any one of alternatives AA32 to AA33 can further include that the one or more geometry subroutines includes arguments for at least a portion of the parameter definitions. The arguments control geometry operations and geometrical dimensions of objects in the geometry modeling operation associated with the physical system.

Alternative AA35

The apparatus according to any one of alternatives AA32 to AA34 can further include that the one or more geometry subroutines include generating output selections referring to modeling operations in said embedded multiphysics model data structure.

Alternative AA36

According to yet another aspect of the present disclosure, a method executed in a computer system with one or more physical computing devices is configured to generate a modified application data structure to model a physical system. The method comprises the acts of embedding, via one or more physical computing devices, a multiphysics model data structure in an application data structure stored in one or more memory devices. The embedded multiphysics model data structure includes at least one multiphysics modeling operation for the physical system being modeled. One or more geometry subroutines are added to the embedded multiphysics data structure via one or more input devices. At least one of the one or more geometry subroutines include parameter definitions associated with the physical system. One or more geometry subroutine calls are added to the embedded multiphysics data structure via at least one of the one or more input devices. The one or more geometry subroutine call allow a respective geometry subroutine to be implemented. One or more application features are determined, via at least one of the one or more physical computing devices, to add to the application data structure. The one or more application features are associated with the physical system. Application data is acquired, via at least one of the one or more physical computing devices, representing the one or more determined application features. The application data include form data representing at least one form feature and action data representing at least one action feature for modeling the physical system. The action data representing the at least one action feature is associated with the least one modeling operation for the physical system defined in the embedded multiphysics model data structure. The association between the action data and the at least one modeling operation defines a sequence of operations for modeling said physical system.

Alternative AA37

The method according to alternative AA36 can further include the act of forming a modified application data structure including the acquired application data, the one or more geometry subroutines, and the one or more call features. The modified application data structure is stored on at least one of the one or more memory devices.

Alternative AA38

The method according to any one of alternatives AA36 to AA37 can further include receiving, via at least one of the one of more input devices, one or more input selections including geometry entities for the geometry subroutine. At least one of the input selections is associated with a set of geometry operations for the embedded multiphysics model data structure. One or more geometry entity output selections are generated in the embedded multiphysics model data structure via at least one of said one or more physical computing devices implementing said geometry subroutine. Contributions are generated to a cumulative geometry entity selection in the embedded multiphysics model data structure associated with geometry entity selections for model operations in the model of the physical system.

Alternative AA39

The method according to any one of alternatives AA36 to AA38 can further include receiving first position and orientation data of a previous end plane for matching to an existing work plane defined in a geometry sequence in the geometry subroutine embedded in a multiphysics model data structure. Second position and orientation data can be generated for matching the previous end plane with a new work plane. The generated second position and orientation data is accessible in the geometry sequence of the geometry subroutine in the embedded multiphysics model data structure.

Alternative AA40

The method according to any one of alternatives AA36 to AA39 can further include linking at least one of the one or more geometry subroutine calls to a second external multiphysics model data structure in the embedded multiphysics model data structure.

Alternative AA41

The method according to any one of alternatives AA36 to AA40 can further include that at least one of the one or more geometry subroutine calls is included in an if, else-if, and/or else-statement in the embedded multiphysics model data structure.

Alternative AA42

According to another aspect of the present disclosure, a method executed in a computer system includes one or more processing units configured to generate an application model data structure to model a physical system. The method comprises the acts of determining, via one or more processing units, a plurality of applications for modeling one or more physical systems. The plurality of applications are defined by application data stored in one or more application data structures. A list of the plurality of applications is displayed in one or more graphical user interfaces. A first input indicative of a first selection of at least one of the plurality of applications is received. One or more application features are determined, via at least one of the one or more processing units, for the selection of at least one of the plurality of applications. At least one of the one or more application feature include a geometry operation represented as application data defined in and retrieved from at least one of the one or more application data structures. The determined application feature are displayed in at least one of the one or more graphical user interfaces. A second input indicative of a second selection of at least one of the application features is received. The second selection includes an application feature for a geometry operation that calls a geometry subroutine. One or more settings for the selection of at least one of the application features is determined via at least one of the one or more processing units. The one or more settings are associated with parameters for the modeling of the one or more physical systems. Edit fields including at least one of the one or more settings are displayed via at least one of the one or more graphical user interfaces. At least one of the edit fields is selected. Edits to said one or more setting included in the selected at least one edit field are receiving via one or more user input devices.

Alternative AA43

The method according to alternative AA42 can further include generating, via at least one of the one or more processing units, an application model data structure that includes the received edits to the at least one or more settings to the at least one or more application features retrieved from the one or more application data structures.

Alternative AA44

The method according to any one of alternatives AA42 to AA43 can further include determining, via at least one of the one or more processing units, a sequence of actions defined in the generated application model data structure. The sequence of action is executed via at least one of the one or more processing units.

Alternative AA45

The method according to any one of alternatives AA42 to AA44 can further include the act of calling a geometry subroutine as part of an action of executing a geometry sequence.

Alternative AA46

The method according to any one of alternatives AA42 to AA45 can further include receiving, via at least one of the one of more input devices, one or more input selections including geometry entities for the geometry subroutine. At least one of the input selections is associated with a set of geometry operations for the embedded multiphysics model data structure. One or more geometry entity output selections in the embedded multiphysics model data structure are generated via at least one of the one or more processing units implementing the geometry subroutine. Contributions are generated to a cumulative geometry entity selection in the embedded multiphysics model data structure associated with geometry entity selections for model operations in the model of the physical system.

Alternative AA47

A customized application data structure for modeling physical systems, stored on a physical medium or in a system comprising one or more processors and one or more memory devices, can include the customized application data structure being generated and/or modified by a system according to any one of alternatives AA13 to AA19, by a method according to any one of alternatives AA21 to AA31 and AA36 to AA46, and/or by an apparatus according to any one of alternatives AA32 to AA35.

A user of an application builder system (e.g., the application builder systems described herein) who creates applications with an application builder may be referred to as an application creator. It would be desirable for an application builder system to allow for the creation of customized modeling applications that read from or write to one or more different sources. For example, a customized application can be created with the application builder reads from or writes to: (i) a location on a storage device on a computing system, (ii) a storage device on a local area network, (iii) an internet location, (iv) a file-transfer-protocol storage device, (v) a command line, and/or (vi) a cloud storage device, such as through a cloud storage service such as Dropbox, Google Drive, or iCloud. It is further contemplated that it may be desirable for an application builder system to allow for the creation of customized modeling applications that handle inter process communication. In some aspects, it would be desirable for customized application created with an application builder system to read from or write to a named pipe. In some aspect, it would be desirable for customized application created with an application builder system to read from or write to a web socket server or gateway.

It would further be desirable to create customized applications with an application builder system that assigns read data to a target for input and that associates a source for output of written data. A target for input can include, for example, one or more variables or parameters. In some aspects, a variable can be an array including a specific dimensionality with specific data types assigned to array members to at least partially define the one or more variables or parameters.

Read data and output data in the contemplated customized application is declared, where a data type is assigned to the read data and output data. Input data may be checked to confirm the read data is consistent with the declaration, and if not, either convert the read data to comply with the declaration or show an error message when the read data is inconsistent with the declaration.

It would further be desirable to create customized applications with an application builder system that include one or more methods where at least one or more of the methods are configured to respond to method calls using, for example, command line method calls. Method calls can allow an end user of the created customized application to provide method input values for the methods. In some aspects, specific methods for reading data or writing data can be used to allow file schemes to read data or write data that is in a format unsuitable for declarations. In some aspects, the methods may be in the form of one or more classes, that is in the form of computer code. In some aspects, it can be desirable to not allow at least some of the methods to be available for method calls.

Creation of customized applications with an application builder that provides more efficient systems for adding functionality for reading or writing data from a variety of sources overcomes complexities in typical modeling systems and can increase an application creators experience with creating the customized application, including decreasing errors in the customized application. The systems and method described herein for generating a customized application data structure for modeling physical systems provide improvements over current systems. The systems and methods described herein provide for assigning read and write data to one or more variables or parameters along with outputting data from application methods or variables from a physics or multiphysics modeling application. The systems and methods offer application creators an improved ability to maintain an overview over the data sources and data targets available for use by the application together with an overview of available and associated declarations for the data from said sources or to said targets, as well as over what method calls are available from command line.

Referring now to FIGS. 44-50, exemplary graphical user interfaces are illustrated that include user-selectable options for an exemplary system for creating customized application data structures.

Figure 44:
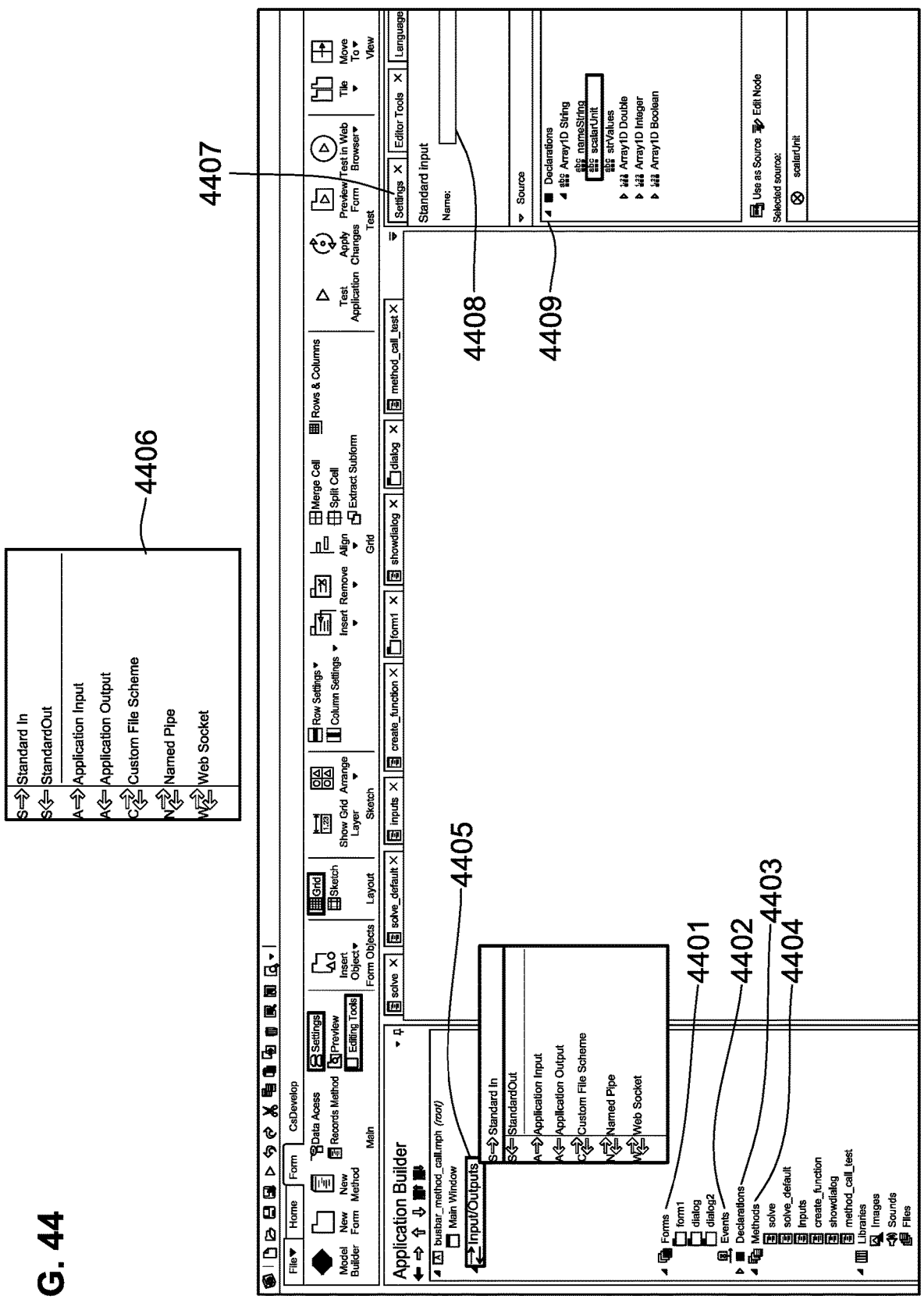
FIG. 44-52 illustrate exemplary graphical user interfaces for an application builder system including several user-selectable options for adding various capabilities for creating an end-user application, according to aspects of the present disclosure.

Turning to FIG. 44, an exemplary graphical user interface is illustrated for an application builder system that includes indicia for several selection options associated with creating a customized application. The exemplary selectable indicia for the several selection options include a forms indicia 4401, a events indicia 4402, a declarations indicia 4403, a methods indicia 4404, and an inputs/outputs indicia 4405.

Selection of the forms indicia 4401 displays additional indicia associated with forms, such as forms for identifying labels. The term forms refers to GUI components for inputting or outputting information. For example, an end user of form included in a created customized application may, for example, enter data or make selections in the form(s) using, among other things, text fields, input fields, edit fields, tables, combo boxes, check boxes, or combinations thereof. Selection of the events indicia 4402 displays additional indicia for events associated with identifying labels. The term events in this context refers to, for example, changes to variable values and declaration values. Selection of the declarations indicia 4403 displays additional indicia for declarations associated with identifying labels. Selection of the methods indicia 4404 displays additional indicia for methods implementable within a created customized application that are associated with the identifying labels. Selection of the inputs/outputs indicia 4405 displays additional indicia for inputs and outputs used within a created customized application that are associated with the identifying labels.

In an exemplary aspect of adding an input or output to a customized application being created in the application builder system, a selection may be received from the application creator of the inputs/outputs selection indicia 4405 in the graphical user interface illustrated in FIG. 44. In response, an input/output GUI element 4406 may be displayed, including, for example, a selection menu with GUI indicators corresponding to the type of input or output. Exemplary types of input and output options for creating an executable end-user application include the following options: standard in, standard out, file scheme, named pipe, web socket, application input, and application output. In some aspects, more or fewer selection options may be display or otherwise available in input/output GUI element 4406. In some aspects, the GUI element 4406 may only include an option to create an input or an option to create an output. In further aspects, the option can then be further customized into a desired type of input or output using settings in an associated settings window.

In some aspects, a settings window 4407 associated with a selected input or output may be displayed, such as in response to an application creator interacting with one of said inputs and outputs by clicking or otherwise selecting (e.g., via touchscreen) the inputs/outputs indicia 4405 and in some instances selecting a specific kind of input or output (e.g., standard in, standard out). The associated settings window 4407 may in some cases be configured to allow a name to be assigned to the input or output. For example, an input into a name field 4408 in the settings window may be associated with a variable or method such that the variable or method becomes a target for the input data or the source for output data. In another aspect, a name input into the name field 4408 may be a name used on a command line to identify specific application inputs. Another section of the settings window 4407 may be populated by declarations 4409 available within the application. An application creator may select a declaration, and the declaration may then be used to control the type of a variable. In some aspects, the selected declaration may be a data type and/or a variable, where for example, a declaration name is also a variable name. In addition, in some aspects, the declaration may include optional initial values and/or data types for data values of the variable. It is further contemplated that a section for selecting an application method to be associated with the name input into the name field 4408 may also be available. In such instance, the name input into the name field 4408 may be associated with a custom file scheme, such that the selected application method is used to read or write data and possibly process data when a file scheme using the name 4408 is used.

In an exemplary aspect of a creating an application for modeling busbars, modeling parameters are specified using the application graphical user interface. An application creator may allow for modeling variable to be read from a standard input in any of various ways and such input modeling variables may include the voltage(s) applied over the bulbar. Additionally, in this non-limiting example the application creator may further create the application to allow the end user to be able to identify themselves by inputting their name and company name to the end-user application being created. The standard input may be used for inputting voltage values. Such input may include an input of, for example, a real number and a corresponding unit (e.g., volts, millivolts etc.). It is contemplated that multiple input values may also be provided. In some aspects, the end user name and company name include character and are received as an optional input.

Figure 45:
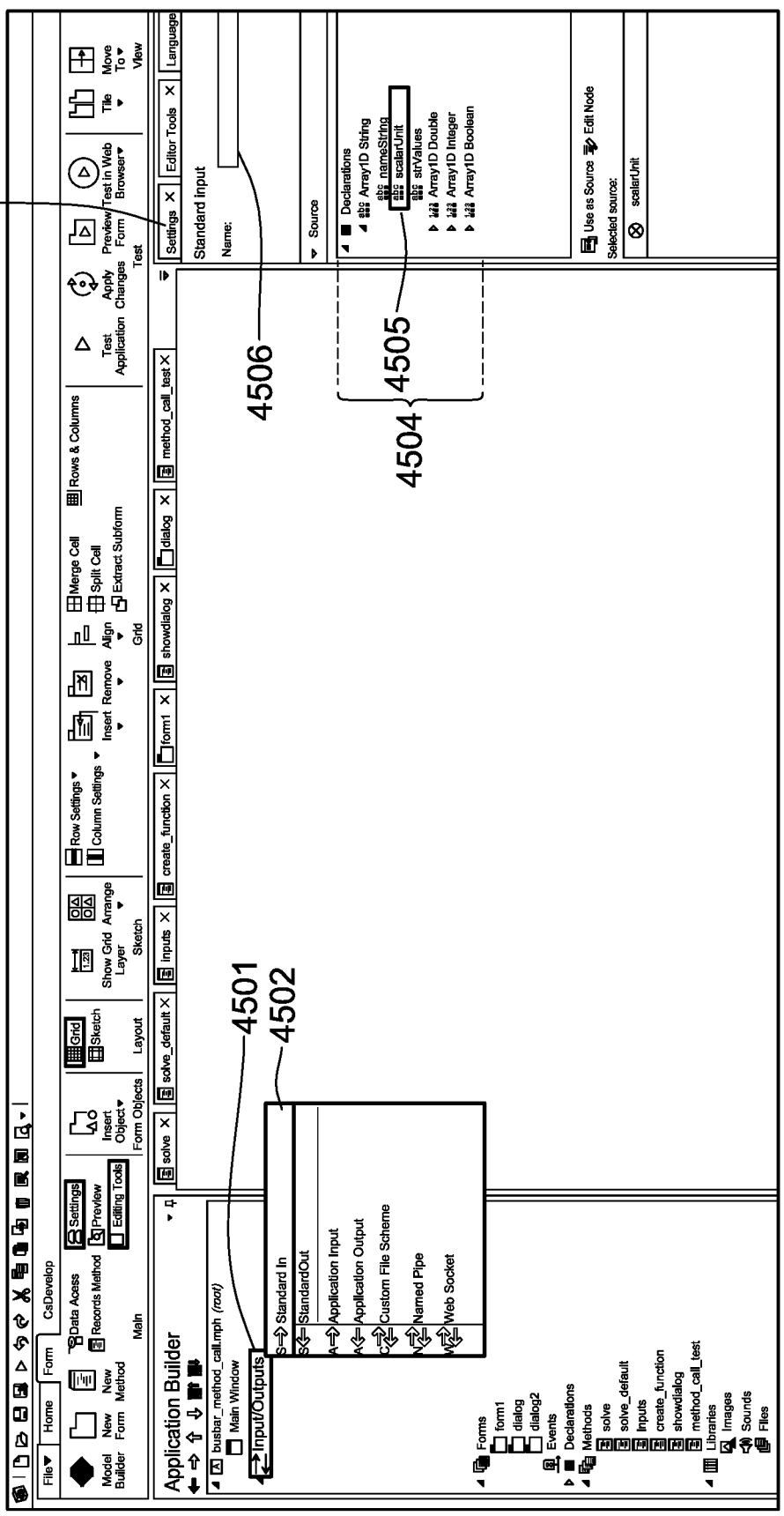

Turning to FIG. 45, an exemplary graphical user interface is illustrated for an application builder system for adding a standard input capability to an end-user application being created by an application creator. In some aspects, a selection input is received by the system after an application creator selects (e.g., via a mouse, touchscreen) an inputs/outputs indicia 4501, which may be a node as part of an application builder tree. Next, an input/output GUI element 4502 may be displayed, including, for example, a selection menu with GUI indicators corresponding to the type of input or output, similar to what is described for FIG. 44. A selection may be received from any of the options displayed in the exemplary menu bar or in a ribbon or other types of selectable display windows. For illustrative purposes, an exemplary selection of the "Standard In" indicia is received by the system via input/output GUI element 4502. In response to the selection(s), an exemplary standard input settings window 4503 can be displayed, such as within the GUI. In some aspects, the settings window 4503 has a section including declaration indicators in the form of GUI elements that may be organized for instance as nodes in a tree-like structure 4504. In this illustration, the received input is a standard input and in some aspects inputting a name may not be allowed, such as when the name field 4506 is greyed out. The application creator may select from declaration options, such as selecting the scalarUnit declaration indicia 4505, which may be suitable for reading numerical input values. The exemplary GUI of FIG. 45 thus allows an application creator to create an end-user application where the standard input given to the application (shown elsewhere) is tied to the variable scalarUnit. The data type declaration assigned for scalarUnit is described in more detail elsewhere in this disclosure.

Figure 46:
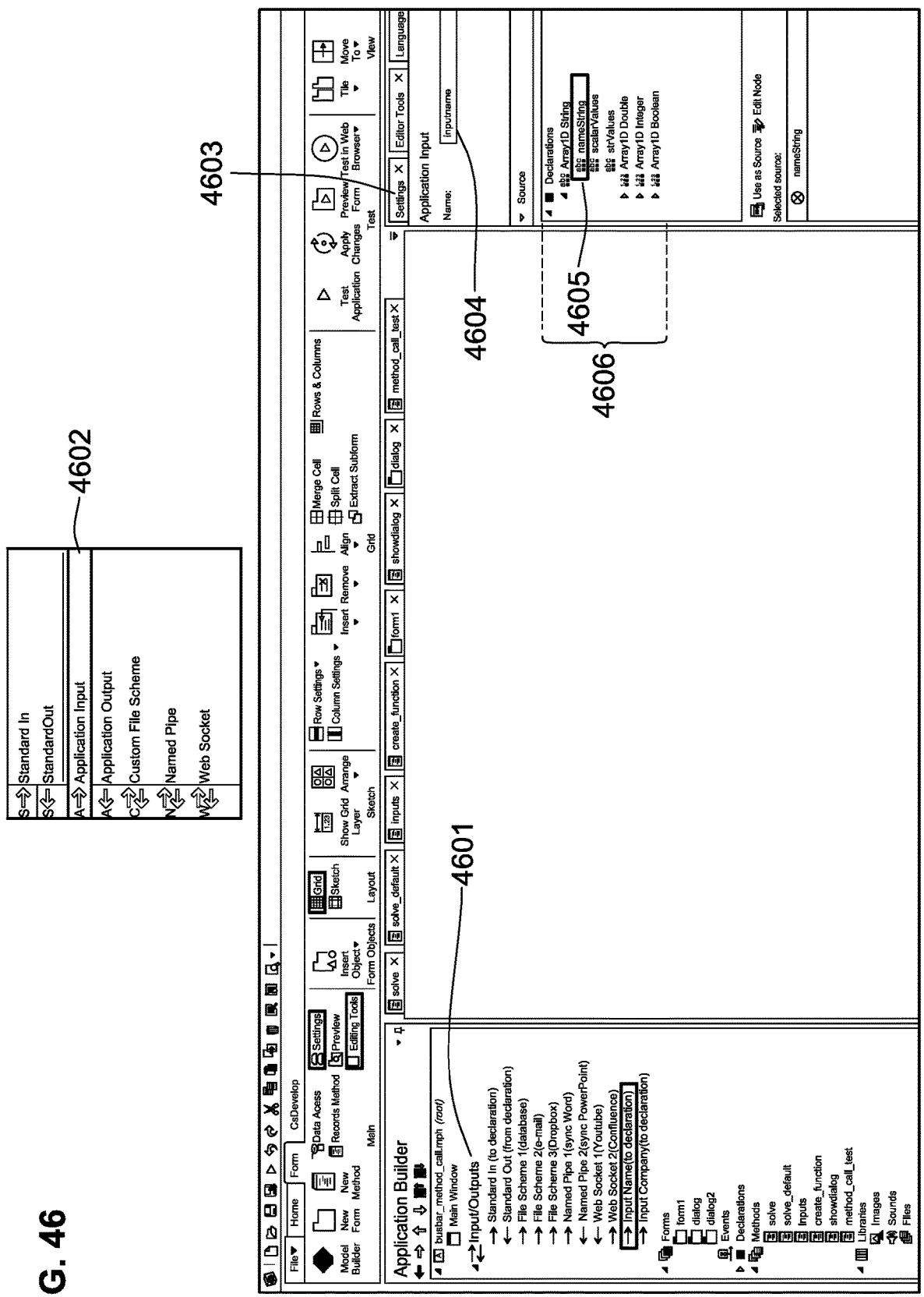
Figure 47:
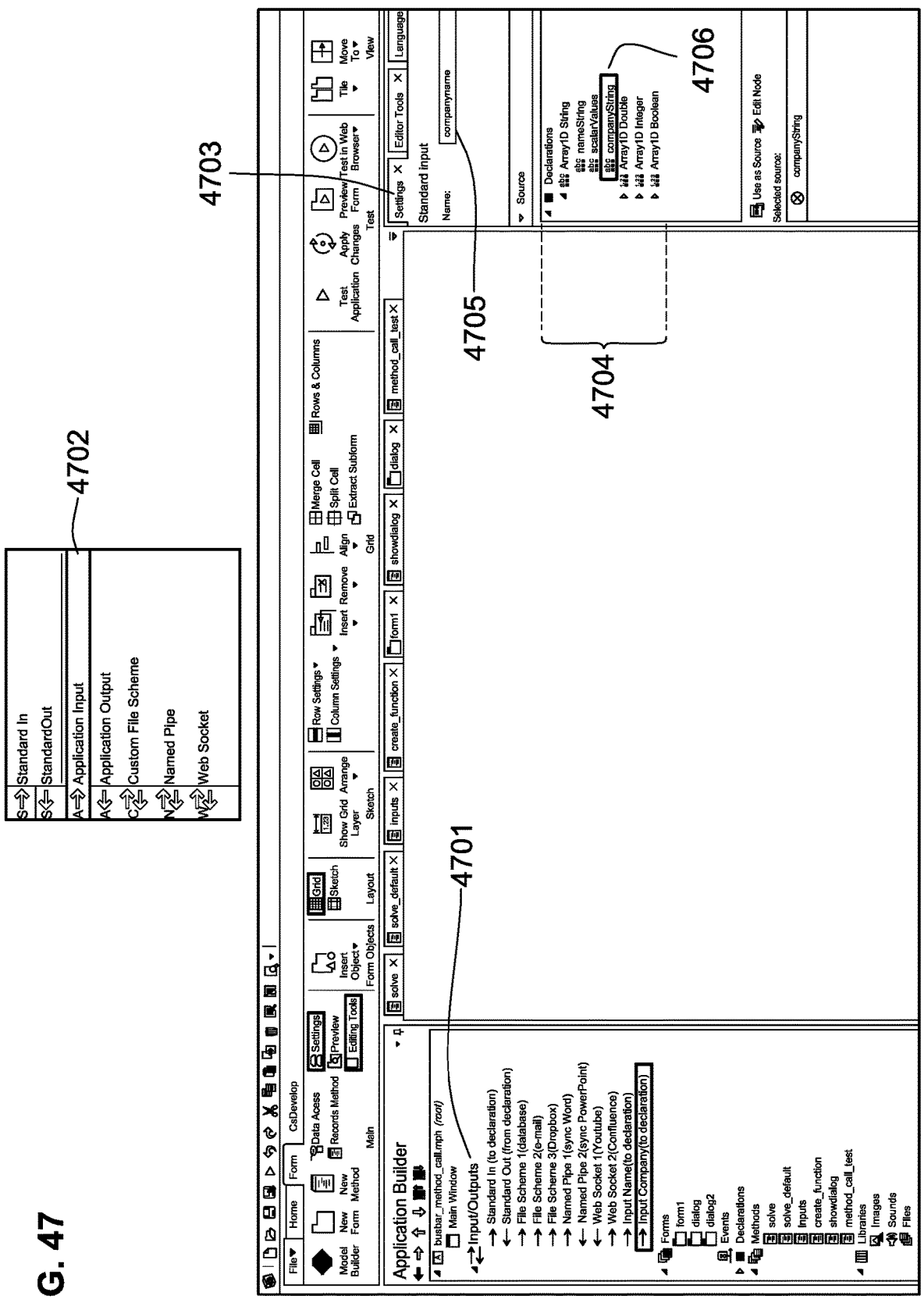

Turning now to FIGS. 46 and 47, exemplary graphical user interfaces are illustrated for an application builder system for adding an application input capability to an end-user application being created by an application creator. The added application input is configured to allow an end-user of an application to enter an application input, such as a named input for the application. In this non-limiting example, the named input may be in the form of the application user's personal name. To create the added application input, a selection is received from the application creator of the inputs/outputs node 4601 in the application builder tree, followed by receiving a selection of the application input indicia 4602 from the resulting displayed selection GUI element. In some aspects, it is contemplated that the exemplary graphical user interface allows an application creator to select or click an Inputs/Outputs icon in a menu bar or ribbon.

In response to the selection of the application input indicia 4602, an application input settings window 4603 can be displayed or opened in the graphical user interface or other connected system. The settings window 4603 can have a section including declaration indicators 4606 in the form of GUI elements that may, for example, be organized as nodes in a tree-like structure. A name for the application input may be received from the application creator by typical input operations, such as by a user typing or otherwise inputting the name (e.g., "inputname") into an input field 4604 in the settings window 4603. The name may be used to differentiate a particular application input from other application inputs. For example, an application creator may desire to create other application inputs for the end-user application being created, such as but not limited to, a company name application input as described elsewhere in this disclosure. It is further contemplated that the application creator may further select a nameString declaration 4605 from the list of available declaration indicators 4606. The exemplary nameString declaration 4605 corresponds to a variable with a character string data type. From the exemplary activities described in FIG. 46, the application input, inputname, that is received for the end-user application being created will be tied to the variable nameString.

Referring now to FIG. 47, an application input to be added to an end-user application is created beginning with a selection being received from the application creator of the inputs/outputs node 4701 in the application builder tree, followed by receiving a selection of the application input indicia 4702 from the resulting displayed selection GUI element. In some aspects, it is contemplated that the exemplary graphical user interface allows an application creator to select or click an Inputs/Outputs icon in a menu bar or ribbon. In response to the selection of the application input indicia 4702, an application input settings window 4703 can be displayed or opened in the graphical user interface or other connected system. The settings window 4703 can have a section including declaration indicators 4704 in the form of GUI elements that may, for example, be organized as nodes in a tree-like structure. A name for the application input may be received from the application creator by typical input operations, such as by a user typing or otherwise inputting the name (e.g., "companyname") into an input field 4705 in the settings window 4703. The name may be used to differentiate a particular application input from other application inputs. It is further contemplated that the application creator may further select a companyString declaration 4706 from the list of available declaration indicators 4704. The exemplary companyString declaration 4706 corresponds to a variable with a character string data type. From the exemplary activities described in FIG. 47, the application input, companyname, that is received for the end-user application being created will be tied to the variable companyString.

Figure 48:
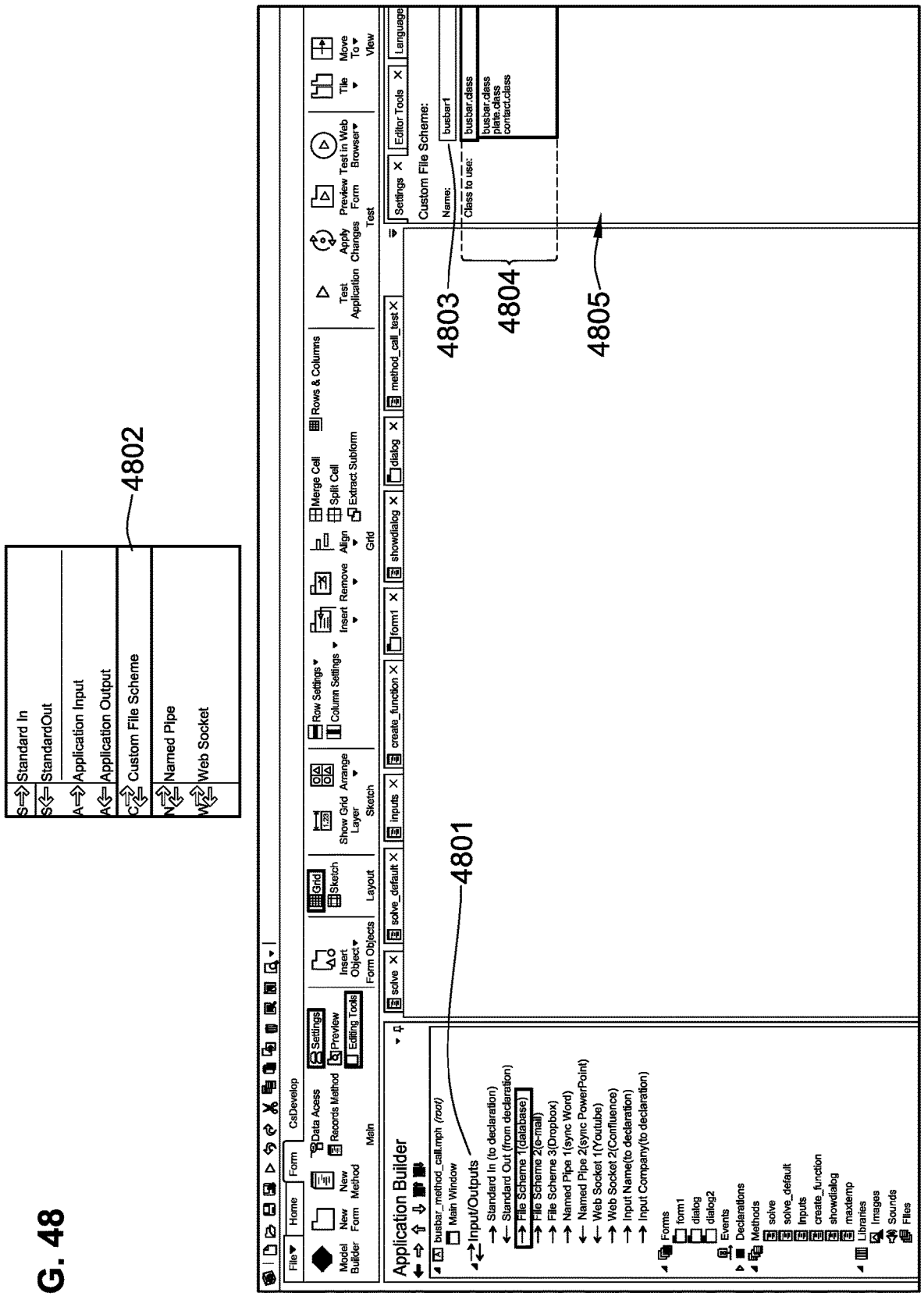

Turning now to FIG. 48, an exemplary graphical user interface is illustrated for an application builder system for adding a custom file scheme to an end-user application being created by an application creator, along with associating the custom file scheme to a specific class (e.g., a specific program-code template) for handling the data at the location indicated by the path in the custom file scheme. An application input to be added to an end-user application is created beginning with a selection being received from the application creator of the inputs/outputs node 4801 in the application builder tree, followed by receiving a selection of the a custom file scheme indicia 4802 from the resulting displayed selection GUI element. In some aspects, it is contemplated that the exemplary graphical user interface allows an application creator to select or click an Inputs/Outputs icon in a menu bar or ribbon. In response to the selection of the custom file scheme indicia 4802, a custom file scheme settings window 4805 can be displayed or opened in the graphical user interface or other connected system. The settings window 4805 can have a section including a name input field 4803 to allow the naming of an application file scheme by an application creator. The name may be used to differentiate this particular exemplary application file scheme from other application inputs, such as those described elsewhere in this disclosure. An exemplary name, busbar1, is received as an input into input field 4803 by the application creator for the illustrative example of FIG. 48.

It is contemplated that the data associated with the named custom file scheme can include data from one or more database records. For example, for the illustrated busbar, the busbar data may include a busbar geometry or mesh and may further include data defining the materials used in the busbar. Rather than having to declare the data using typical declaration steps, it is desirable for a system to allow an application creator to use method(s), such as pre-defined methods in an application builder system, methods created by the application creator, or methods created by a third-party, to read from one or more database records and assigning types to various data read from or written to a custom file path. To assign a method, for example, in the form of a class (for example, a Java class, a C++ class, an object-oriented program class), a selection of a class may be received by an application builder system associated with an input selection received via a combo-box or other GUI element from the application creator identifying a class or method. For the busbar example, class identifiers 4804 provide non-limiting examples in a GUI that allow the selection of available classes and methods for input/output handling. In some aspects, the classes that are displayed in the setting window 4805 of the GUI are determined by the application builder system and may be limited to the classes available on the computer system, or alternatively in a particular folder on the computer system that may implement a custom file scheme interface. The class selected by the application creator is then added to the application be used for handling the busbar data such that the data may be used to construct a busbar model.

It is contemplated that the application creator may desire to create an application allowing an application end user to select one of several different bus bars to model the created end-user application. A database may contain the busbar data of several bus bars. An application creator may create a file scheme for each busbar to model, differentiating the file schemes by the file scheme name (e.g., calling file schemes for a first busbar busbar1, the filescheme for a second busbar busbar2, and so on). All the desired file schemes may use the same class for handling the data.

To allow access the file containing the desired physical systems being modeled in the end-user application being created, the application creator may associate a file scheme with the path to the source file with the filescheme beginning with the file scheme name or other naming conventions. For example, a particular file scheme may be associated with both a unique file scheme name and an appropriate class for allowing the application to properly process the data from the file the file scheme is associated with. The file schemes may further be associated with one or more GUI elements, which in response to being a selection of such element(s) being received in response to an end-user selection, loads the corresponding file from the path indicated in the file scheme. In the illustrative busbar example, busbar1:///path1/file1.data is an example that may be used for a first busbar path, and busbar2:///path2/file2.data is an example that may be used for a second busbar path.

In some aspects, the application creator may create an end-user application that includes an input field for the end-user to enter path and/or file information for the custom file scheme to be accessed by the end-user application. For example, in the non-limiting illustrative busbar application described above, a user of the end-user application could provide the application runtime engine one of the following commands or similar versions thereof.

An exemplary command to make a modeling and simulation system, named comsol for illustrative purposes, run the application busbarapp.mph using standard input 10 mV, may look as follows:

comsol -run busbarapp.mph 10[mV]

An exemplary command to make a modeling and simulation system, also named comsol for illustrative purposes, run the application busbarapp.mph using a file including voltage input may look as follows:

comsol -run busbarapp.mph -inputs voltagefile.txt

Yet a further exemplary command to make a modeling and simulation system, also named comsol for illustrative purposes, run the application busbarapp.mph using a file including voltage input, and adding the name of the end user and company of the end user as additional inputs, may look as follows:

comsol -run busbarapp.mph -inputs voltagefile.txt -appargs -inputname john -inputcompany mycompany Another exemplary command to make a modeling and simulation system, also named comsol for illustrative purposes, run the application busbarapp.mph using a method-call with methodinputs length (12), width (4), and voltage (30).

Non-limiting examples of the text file, voltagefile.txt, can include:

1. Several voltage variables in the file:
% voltage1
10 [mV]
% voltage2
15 [mV]
% voltage3
20 [mV]
2. An array with many voltages:
% voltages
10 [mV]
15 [mV]
20 [mV]

Assuming the above exemplary file, voltagefile.txt, include more than one input voltage, an event may be associated with reading from voltagefile.txt so that a simulation is run for each voltage value, or at least more than one voltage.

It is contemplated that the handling of inputs and outputs to and from an application would be desirable where a section of a graphical user interface for creating end-user applications is configured to provide such operations. In one non-limiting example, a folder node, inputs/outputs, similar to inputs/outputs node 4801 can be added to a tree structure of an application builder system and be associated with providing such operational aspects. Within that section different types of inputs and outputs can be added. Standard In and Standard Out can be two types of nodes and allow an application creator to create one of each. A settings window for these two types of nodes may have a declaration section containing scalar and array declarations that may be associated with the standard input or standard output. An application creator may select such a declaration. At startup, whatever is read from Standard In may be associated the selected declaration. Appropriate data type conversions will then be performed and if such conversions are not possible an error will be displayed. When coupling to an array type of declaration space, a comma can be used to split the input into tokens before assigning it to the elements of an array declaration. In some aspects, the type of token delimiters may also be explicitly specified that are used on a settings node for the input at least when associating it with a string array declaration. Similar to any other declarations, the data in the declaration associated with the input can then be used from a method or associated to a form, such as input forms.

In some aspects, a declaration associated with Standard Out may be written to Standard Out when the application exits. The settings window for the Stand Out node may also include a check box, Send To Standard Out Immediately that would send the value to Standard Out as soon as the value of the declaration changes.

In some aspects, it is contemplated to let a declaration associated with input continue updating after the application has started by reading one line at a time from Standard In and assign the corresponding data to the declaration. The application may then have an event associated with the declaration and take appropriate action as each line is read. An example of an event includes that one or more values within a declaration has changed.

It is further contemplated that systems would be desirable to allow an application creator to add command line arguments provided to the end-user application when it is executed. For example, a section of a settings window can be configured to allow for assigning values and types to such an input. For instance, the section may include GUI element(s), such as a tree with nodes, a drop down menu, or a combo box relating to declarations available in the application and allowing to specify that the command line inputs should correspond to values in a selected declaration, with a data type as described by the selected declaration. It is contemplated that a declaration is not necessarily only a declaration of data types for values in an array of some dimensionality but may also correspond to a variable of some dimensionality with defined data type(s) for array members. In some aspects, an array may include initial values.

The settings window for an input or output may include a Name input field and a source tree with all the declarations. The name would be the name that may be used on a command line input or elsewhere in an application to identify the input or output, and the name would then be associated with the declaration selected in the settings window. This has the advantage that the application specifies the names of all input arguments it accepts and also that an end-user can get help with the argument parsing and get it directly assigned to a declaration of the appropriate data type.

To differentiate standard input and standard output command line arguments from application specific arguments, a special application argument, such as -appargs may be used. As an example, such a special application argument may be beneficial if including application specific arguments in addition to general arguments. Input commands, that follow or are otherwise associated with the special application argument (-appargs), are then application arguments identified by a name set by the application creator. In some aspects, such as if only one argument identified as a file follows after -appargs, it may be considered to be a file with the application arguments.

In addition to associating a standard input or standard output with a declaration standard input or output, the standard input or standard output can be associated with a file scheme. For instance, a file scheme starting with, for example, input:/// may identify standard input, and a file scheme starting with output:/// may identify a standard output. One beneficial implementation of such file schemes is in a method.

To allow for more general input and output from unknown devices, custom file schemes are contemplated. Custom file schemes may be added to an input/output section of a graphical user interface for creating and end-user an application as, for example, one or more nodes in a tree structure. The following are four examples of types of custom input and output: binary input, text input, binary output, text output. The node may be associated with pre-defined or customized code for the method of reading or writing. The code can be supplied in an External Library by letting it include for instance a class that implements the corresponding interface from Java. In some aspects, the settings window for a custom file scheme may include a name text field labeled, for example, File Scheme Name, where the name of the file scheme may be entered. Additionally, an exemplary combo box labeled "Class to use" may be included in the input/output section of the GUI where the implementing class to use may be selected. In some aspects, the combo box may be populated automatically with available classes by scanning all external libraries or a particular kind of libraries, for example Java libraries for classes implementing the appropriate Java interface. Thus, a method for adding the ability for an application to read or write using any input or output format may be made easily accessible to a user of an application builder, such as an application creator. The custom file scheme may then be used anywhere a regular file scheme may be used by using the string fileschemename:/// followed by a sub path, where "fileschemename" corresponds to the name entered in the file scheme name text field.

With sub paths supported for custom file schemes, it is contemplated that custom file schemes may also be used to implement communication with, for instance FTP and cloud storage services. Exemplary file scheme paths may include ftp:///mydir/myfile.txt or dropbox:///data/report.docx, where ftp:/// and dropbox:///, or similar, are custom file schemes that have been implemented by the application developer.

It is further contemplated that file schemes for accessing data in a named pipe or from a web socket server or gateway are also options that can be added as custom file schemes. For example, nodes for named pipes may be added to an Inputs/Outputs section of a GUI as are further illustrated in FIGS. 49 and 50. It is contemplated that a settings window for each named pipe may include, for example, an input field, labeled Pipe name, and an optional check box, labeled Create named pipe, which may or may not be checked by default. The named pipe may then be accessed using a file scheme, pipe:///pipename, where pipename is the name the application creator has given the pipe in the settings window. If the check box associated with the label "Create named pipe" is checked, the named pipe may be created automatically the first time it is accessed. If it is not checked it is assumed that some other program that is interfacing with the application has already created the named pipe. The named pipe may be created by the application at runtime, in accordance with the instructions provided by the application creator using the input options available via the settings window when creating an end-user application.

Figure 49:
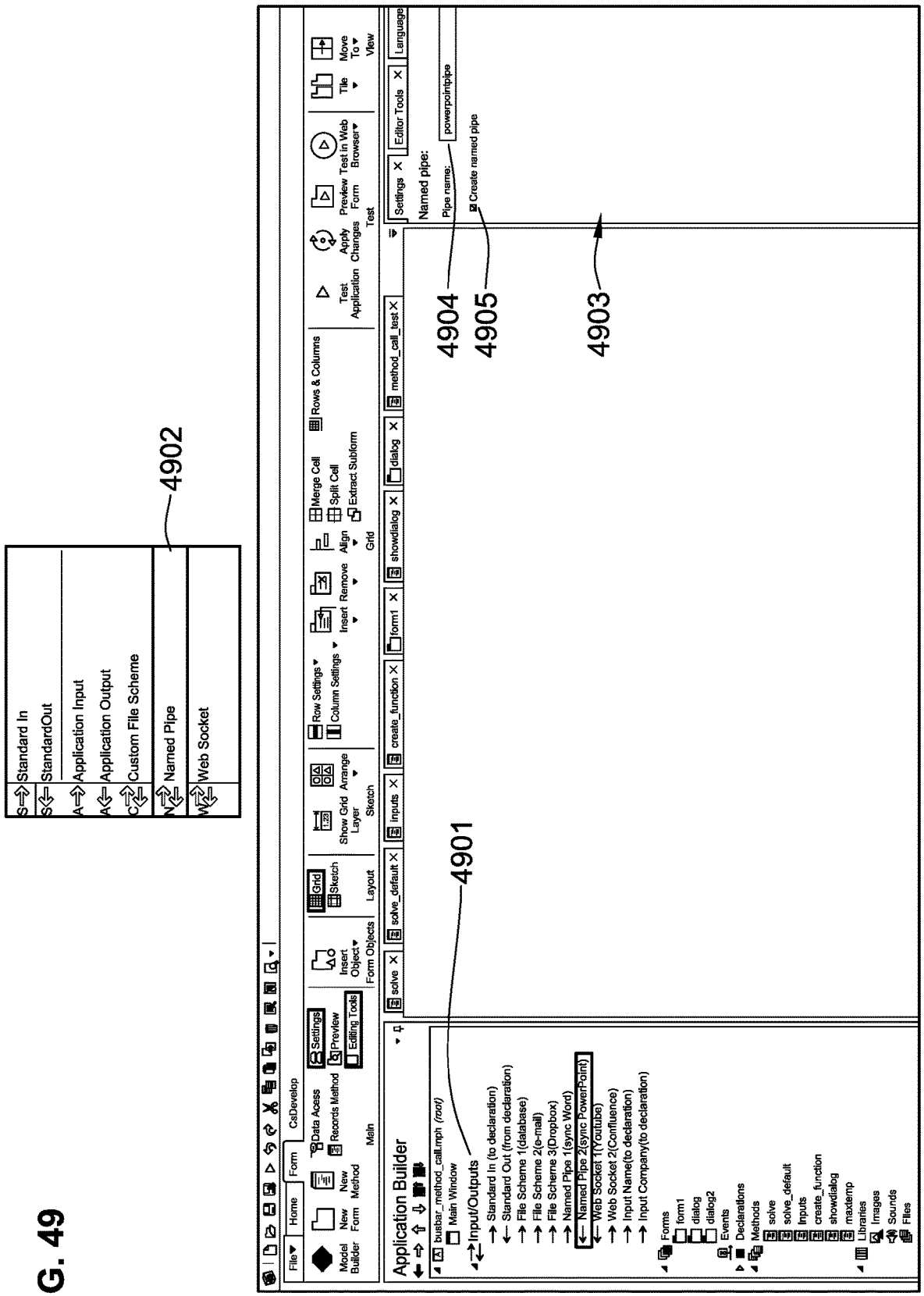

Turning now to FIG. 49, an exemplary graphical user interface is illustrated for an application builder system for adding a named pipe capability to an end-user application being created by an application creator. It is contemplated that an application builder system GUI, similar to what has been described elsewhere herein, may in response to receiving a selection (e.g., via a mouse click, touch screen selection) of a displayed input/output indicia 4901, further display a GUI element for receiving a selection of the kind of input or output. For example, an application creator may select Named pipe 4902, and in response, a settings window 4903 including an input field 4904 allowing the application creator to enter the pipe name may be displayed. The named pipe may then be accessed using a file scheme pipe:/// pipename where pipename is the name the application creator has given the pipe. In some aspects, the settings window 4903 may include GUI element means 4905 for the application creator to define that the named pipe be created automatically the first time the application is accessed. In this example this may be a checkbox, where the checkbox is selected by the application creator when creating the application. Where the checkbox is not selected or checked, the default will be that some other program that is interfacing with the application has already created the named pipe. The named pipe may be created by the application at runtime, in accordance with the instructions provided by the application creator using the settings window input means when constructing the application.

Figure 50:
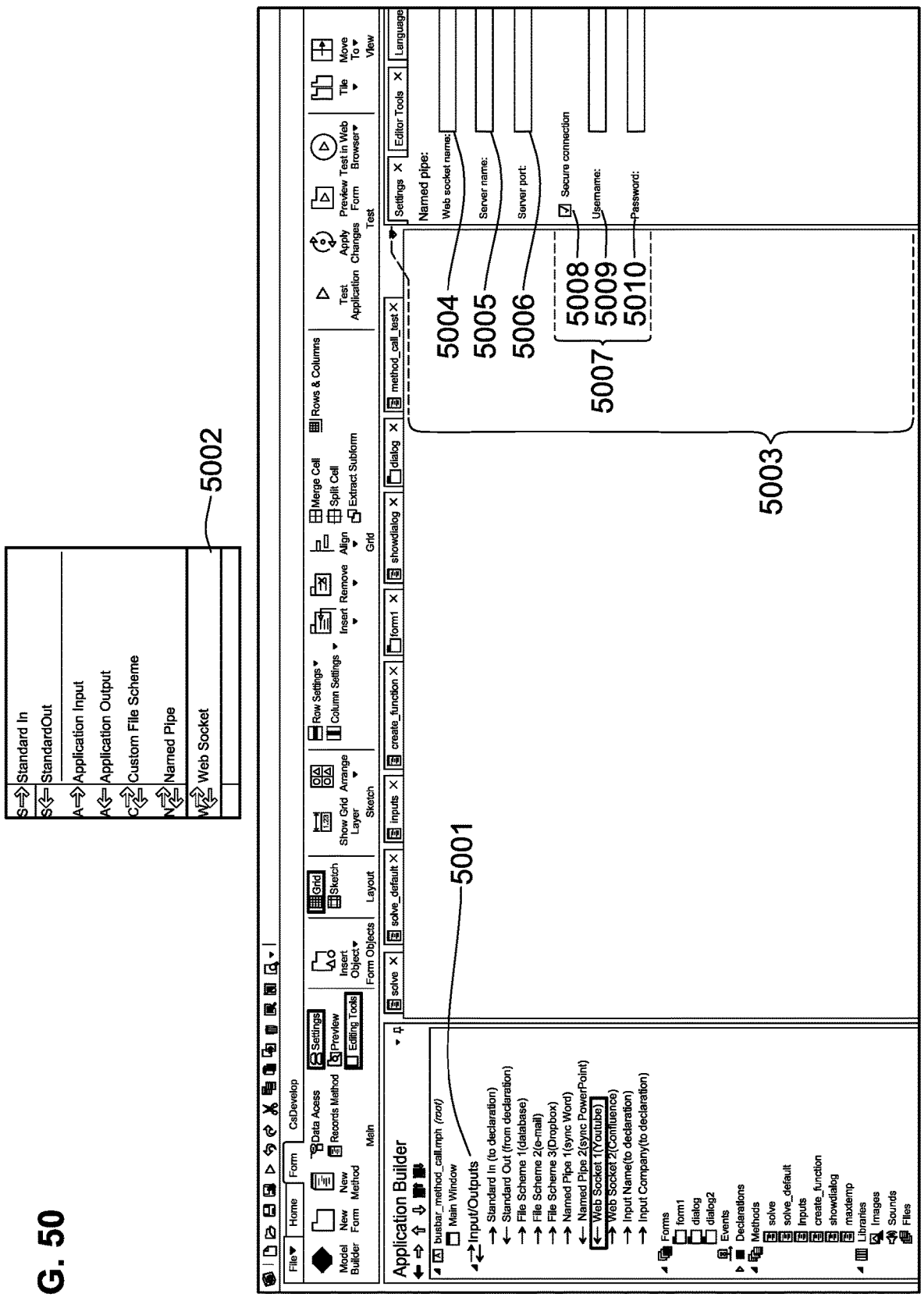

Turning now to FIG. 50, an exemplary graphical user interface is illustrated for an application builder system for adding a web socket capability to an end-user application being created by an application creator. In a similar way as discussed above for named pipes, nodes for web sockets to a server or gateway may be added to an Inputs/Outputs section of an application builder GUI. It is contemplated that an application builder system GUI, similar to what has been described elsewhere herein, may in response to receiving a selection (e.g., via a mouse click, touch screen selection) of a displayed input/output indicia 5001, further display a GUI element for receiving a selection of the kind of input or output. For example, an application creator may select Web Socket 5002, and in response, a settings window 5003 is displayed including an web socket name input field 5004, a server name input field 5005, and a sever port input field 5006. It is contemplated that the setting window 5003 can also include a check box or other GUI element(s), such as a secure connection check box 5008, username input field 5009, and password input field 5010 to allow setting up a secure web socket connection. The web socket may then be accessed using the file scheme websocket:///websocket-name, where websocketname is the name provided by an application creator in the web socket name input field 5004. The settings may also be available in the Application API to allow the end-user or application creator to provide the connection details in the application. A web socket connection object may be accessed using app.websocket(<web socket name>) and return an object with string properties "servername", "serverport", "username", "password" and a boolean property "secure". The web socket will connect automatically the first time it is accessed. Optionally connect and disconnect methods to the web socket object are contemplated that may allow for manual control over when it is connected and disconnected.

The creation of an end-user application is further contemplated to optionally include support for method calls in a command line input. Such an end-user application may be run in a normal fashion as described elsewhere herein, however the application may optionally be run to include additional command line arguments instructing the application to use one or more specific methods within the application and furthermore may be used to specify input valued for the specific methods.

It is also contemplated that at the time of creation of an application, an application creator may be provided with indicators of one or more method calls available within the application. Indicators of such method calls may for instance be shown in a GUI element such as drop down menus, combo boxes or lists of selectable method call indicators. In response to the application creator selecting one or more method call indicator(s) and after the application has been created using the application builder, the corresponding method calls may be made available to be run and receive input through the use of command line arguments provided by a user of said application.

Figure 51:
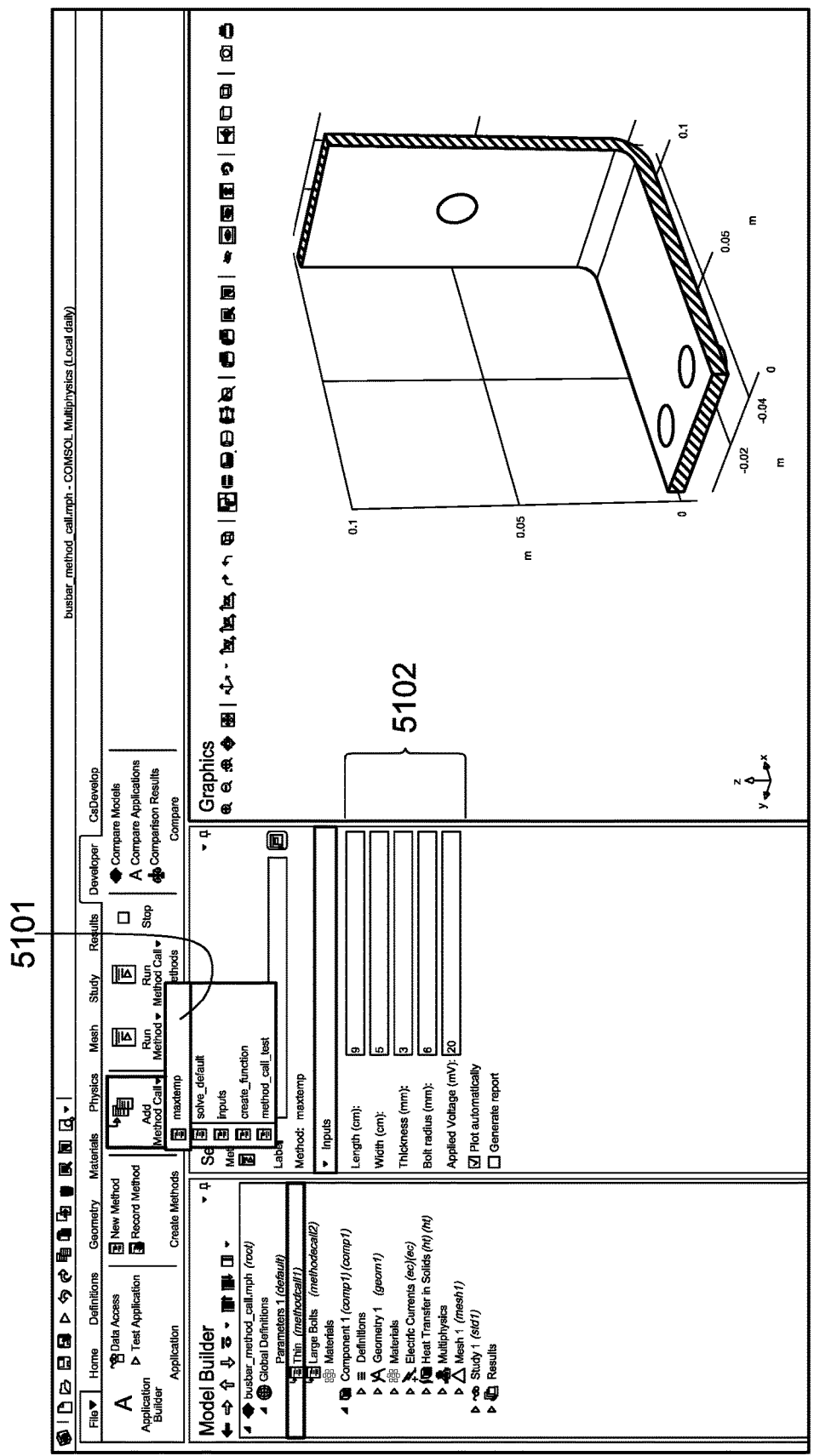

Turning now to FIG. 51, an exemplary graphical user interface is illustrated for an application builder system for adding input capabilities for method call(s) to an end-user application being created by an application creator. For example, a GUI element provides a selection of methods to allow the adding of a method for performing a certain operation for a physical system being modeled to a method call. The illustrative example of FIG. 51 demonstrates this operation where a GUI element, Add Method Call, provides a selection of methods to add the method maxtemp 5101 to a method call named Thin. The method maxtemp performs the operation of calculating a maximum temperature of the exemplary busbar physical system. In response to the selection, the method call (e.g., Thin) will use the method (e.g., maxtemp). It is contemplated that an end-user application may be created where the method call may be changed at runtime by the end user using the command line. For example, the method call may be changed from the default value inputs 5102 in the application to values provided through the command line as described below. It is contemplated that the method call could further be associated with one or more events so that a simulation is run several times using several sets of method call inputs.

By way of example, a command to make a modeling and simulation system, named comsol, run an end-user application, busbarapp.mph, using a methodcall with methodinputs length (12), width (4), and voltage (30) may read as follows:

comsol -run busbarapp.mph -methodcall maxtemp -methodinputnames length, width, voltage -methodinputvalues 12,4,30

Similarly, a command to make a modeling and simulation system, named comsol, run an end-user application, busbarapp.mph, using a methodcall with methodinputs defined in the file methodinputs.txt and adding the name of the end user and company of the end user as application inputs may read as follows:

comsol -run busbarapp.mph -methodcall maxtemp -methodinputs methodinputs.txt -appargs -name john -company mycompany Example of methodinputs.txt:
    % length
    12%
    width
    4%
    voltage
    30

If an input is an array, one value can be given on each line in the section for the values corresponding to that input. If an input is a two-dimensional array, the column values in each column may be given and separated by a comma and each row input on a separate line. It is contemplated that not all inputs need to be specified. The inputs that are not specified will keep the current value that it already has in the method call as defined within the application.

It is contemplated that method calls providing an output may provide such outputs in various formats. To facilitate communication between an end-user application created with an application builder and other applications, it is further contemplated that a Representational State Transfer (REST) API may be used and the method call may return results from running the one or more methods as, for example, JSON or XML strings.

In some aspects, an application builder may include operations for allowing one or more methods in an application to be stopped or halted by an application user at runtime. One example of providing such an operation is by providing a check box associated with a corresponding method in, for instance, the settings window of an application. If the application creator clicks such a checkbox, a button, icon or other indicator of stopping the method may automatically be created in response and be included within the end-user application and instructions for stopping the corresponding method is included in the end-user application. Then, when an end user clicks or otherwise provides an input indicating a selection of said button, icon or other indicator of stopping the method, the instructions for stopping the method is run at runtime.

Another advantageous aspect of a physics or multiphysics modeling system application builder is an application builder capable of packaging an end-user application as a stand-alone application. A stand-alone application may be distributed and executed by any end-user with a compatible computing system or electronic device. Examples of compatible computing system may be computer systems running an operating system such as a Microsoft Windows® operating system, a Linux® operating system or a MacOS® operating system. Examples of a compatible electronic device may be a terminal, electronic tablet, or mobile phone with a iOS® operating system or an Android® operating system. A stand-alone application may include a customized application data structure included in one or more files and a runtime engine containing a GUI module, a modeling and simulation module, a data-storage and retrieval module, and an optional licensing module. The runtime engine may also include instructions corresponding to various features which may be used by an application. An application data structure being executed by an application runtime engine may sometimes be referred to as an application model data structure.

It is contemplated that it may be desirable to limit the ability for end-users to easily modify, add, or remove features to models included in stand-alone applications. A stand-alone application may have an application data structure included in one or more files and an application runtime engine. In some aspects, the application runtime engine includes a modified GUI module, a modified modeling and simulation module, and a modified data storage and retrieval module. In addition, in some aspects the application runtime engine may also include a license module. Modification to modules (e.g., modified GUI modules, modeling and simulation modules, and data storage and retrieval modules made during the creation of an end-user application by an application creator) that are included in an application runtime engine are such that, in comparison to what is described elsewhere herein for the creation of end-user applications, the modified modules allow interpretation of the application model data structure and user data input, including steps for solving the model. However, the modified modules are configured to not allow end-users to add additional application features not already provided for in the customized application data structure as received from an application creator or to remove existing application features included in the application data structure.

In some aspects, use of one or more application features included in the application data structure may be activated or deactivated features, if such activation and deactivation operations where included in the end-user application by the application creator. It is contemplated that an end-user may also be allowed to select one or more application features or methods to implement from a selection of features included in the application model data structure. Thus, it is contemplated that an application runtime engine created by an application builder system is operational upon execution to perform modeling in accordance with the end-user application created by the application builder. However, such application runtime engine is not operational to create new applications, nor modify existing application data structures to include application features outside of the scope of what an application creator originally included in the customized application data structure.

In some aspects, it may be advantageous for a standalone application runtime engine to include systems for verifying that an end-user application that is executed by an end-user was originally created using an application builder system licensed to create standalone applications in general and stand-alone applications including features that may require the application creator to be licensed to create such stand-alone applications. Verification allows distributing one type of standalone application runtime engines including instructions for many available application features that can be created using an application builder system while restricting the running of unlicensed features. This is particularly advantageous because it minimizes having to distribute many different types of application runtime engines depending on what features are licensed by an application creator. Furthermore, a verification process is contemplated to allow users to modify model data, select from existing model features, and obtain simulation solutions, thereby changing various aspects of the application model data structure without failing the verification step.

It is contemplated that in some aspects, verification does not have to rely on unique identifiers nor is it performed prior to executing a file, and thus, the verification step is not suitable for verifying the integrity of the code or instructions for the end-user application or modules. Rather, the verification process that is contemplated is a check to determine that the end-user application was originally created by an application builder licensed to create such stand-alone end-user applications.

Figure 52:
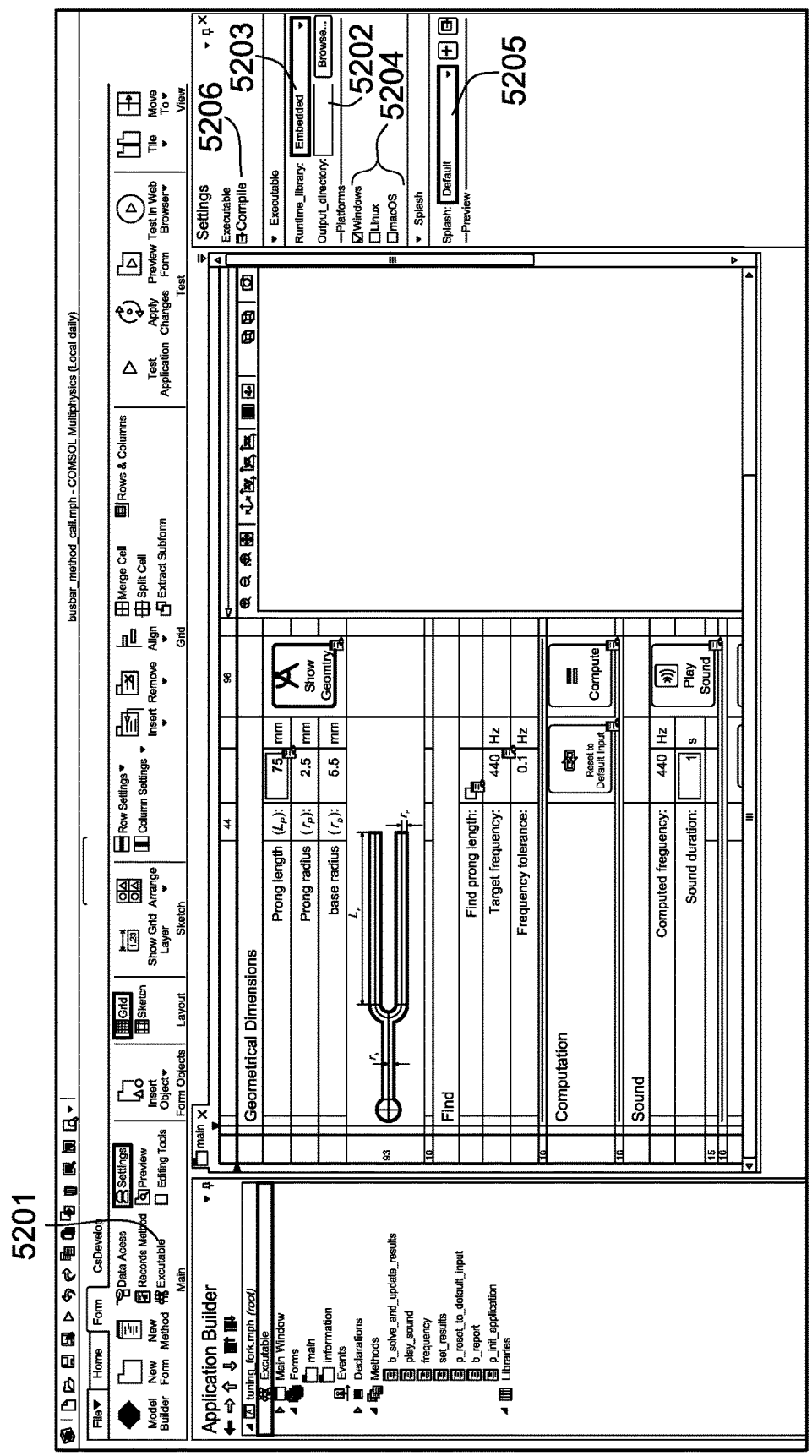

Turning now to FIG. 52, an exemplary graphical user interface is illustrated for an application builder system that allows an application creator to construct a stand-alone end-user application. The illustrated GUI includes a selectable GUI element represented by icon or indicia 5201 including display of the exemplary term "executable. The application creator may interact with the icon by, for example, clicking or otherwise selecting it. In response to selecting the icon 5201, an application builder GUI module may display a settings window for creating a standalone application. The displayed settings window may include, among of the things, an input field 5202 or other GUI element for receiving an application creator instruction of where to create the standalone application where a file path, for example, may be received from a user to define an output directory or other location for the created standalone application.

It is contemplated that the settings window in the exemplary GUI of FIG. 52 may include an option for that allows a selection input to be received associated with packaging a created customized application data structure together with an application runtime engine. Packaging of a created application data structure refers to including the files including the customized application data structure and the files including the application runtime engine together in a self-extracting archive. The application runtime engine packaged with the customized application data structure may be operating system dependent. In addition to the application runtime engine, operating system runtime libraries may also be packaged with the stand end-user application. The application builder system may include or be configured to have access to operating system runtime libraries that are known to be compatible with the application. If an end user receives a standalone application but their operating system runtime libraries are incompatible with the standalone end-user application, the runtime libraries included with the application may be installed on the end user computing system or electronic device and used instead of the incompatible operating runtime system libraries, thereby making the computing system or electronic device compatible with the application. In some aspects, inclusion of compatible operating system runtime libraries may be optional and be performed in response to a user instruction transmitted through the application builder GUI. In other aspects, inclusion of operating system runtime libraries may be automatic in response to an application creator selecting embedded or a similar option from a selectable GUI element 5203, such as a drop down menu or a combo box.

In some aspects, it is contemplated that the settings window may also include a selectable GUI element 5205 for including a splash screen that may in further aspects be constructed by the application creator. For example, in the aspect of a drop down menu, responsive to receiving an indication of the application creator clicking the selectable GUI element 5205, the drop down menu may display indicia of splash screens, splash screen files, or file names. In response to creating this splash screen feature, the end user application may show the splash screen automatically during the launch of the end-user application, thereby allowing application creators to brand the created end-user application and display various types of notice information on the simulation computing system of the end user.

Figure 53:
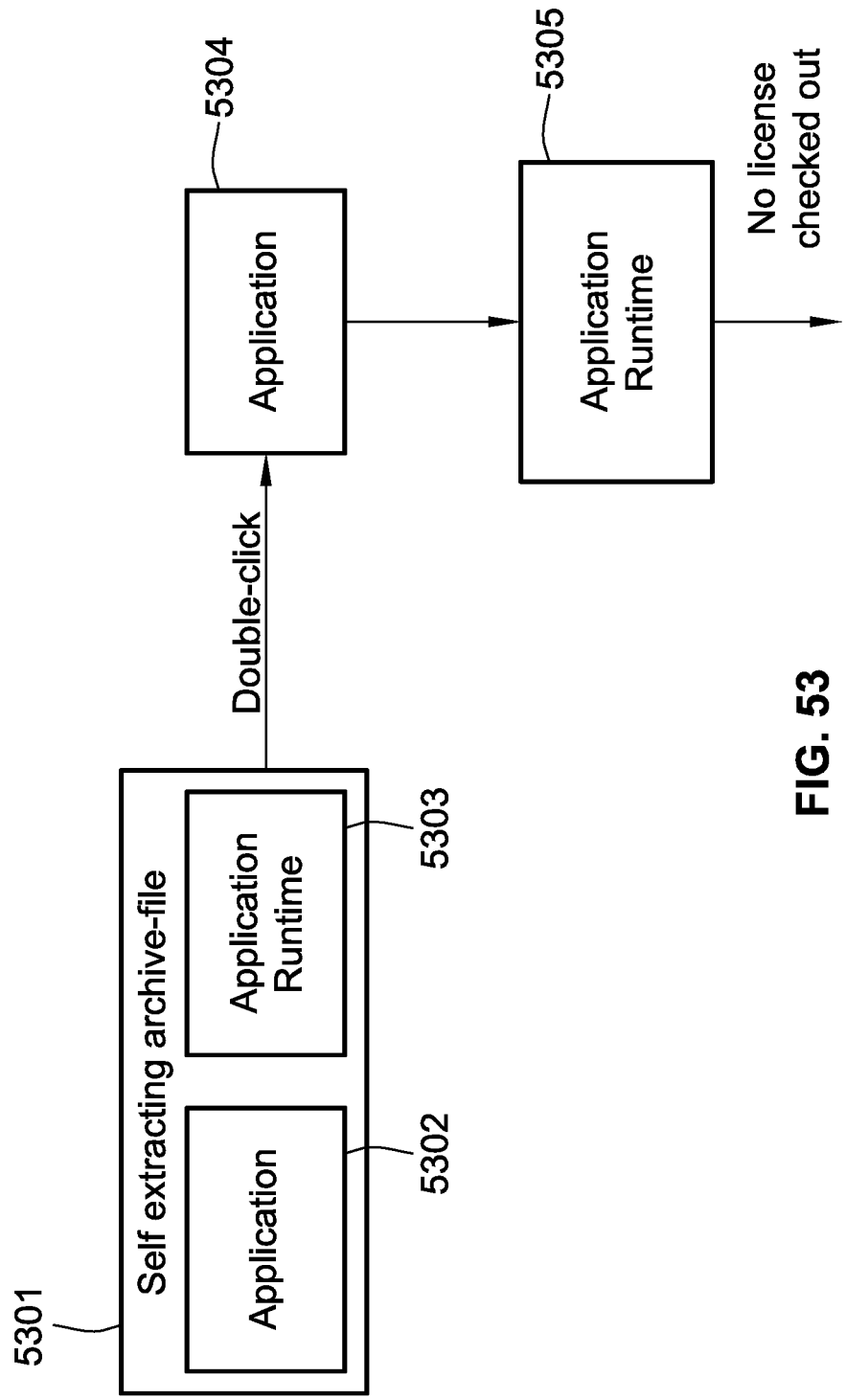
FIG. 53 illustrates an exemplary process implemented on a computer system for creating an archive file including a customized application data structure and an application runtime engine, according to aspects of the present disclosure.

As part of the creation of a standalone end-user application including a final customized application data structure packaged together with an application runtime engine and optionally operating system runtime libraries, the application creator may interact with a selectable GUI element, such as a drop down menu, combo box, check box, or similar. For example, a combo box 5203 may display a first selectable option that may be labeled, for example, "embedded" or "include runtime". If a selection is received from the application creator indicating the first option, the application may be packaged together with an application runtime engine and runtime libraries when the application creator chooses to complete the packaging of the standalone end-user application. The application creator may further specify for what operating systems that operating system runtime libraries should be embedded with the standalone end-user application, such as in this example by checking a selectable GUI checkbox 5204 corresponding to the desired operating system. If an application builder user selects two or more options (e.g., check-boxes), two or more stand-alone applications may be created, each being packaged with a runtime engine and optionally operating system runtime libraries corresponding respectively to the selected operating systems. Referring to FIG. 53, an exemplary process that is implemented on a computer system is illustrated for creating an archive file including a customized application data structure and an application runtime engine. The exemplary process includes creating the self-extracting archive file 5301 including the finalized custom application data structure 5302 and an application runtime engine 5303 that upon receiving an indication of a user selection (e.g., double-click), the end-user application 5304 is extracted along with the application runtime engine 5305. The end-user application 5304 is then executed by the application runtime engine 5305.

Figure 54:
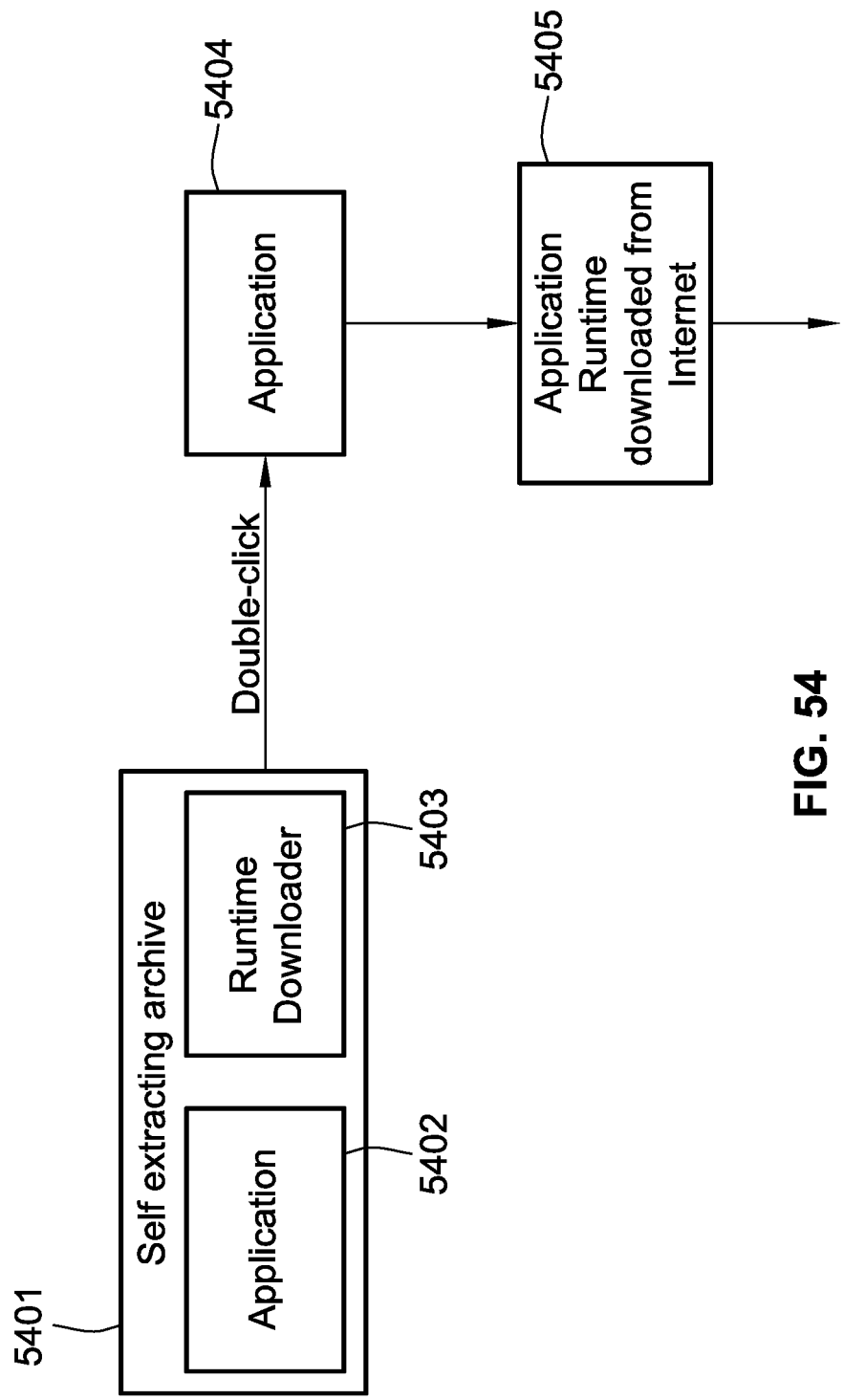
FIG. 54 illustrates an exemplary process implemented on a computer system for creating an archive including a customized application data structure and instructions for downloading an application runtime engine, according to aspects of the present disclosure.

In some aspects, it is contemplated that an application creator may prefer to create a standalone end-user application that is not packaged together with an application runtime engine and operating system runtime libraries. In such situations, the application creator may select a second option using the previously mentioned selectable GUI element 5203 labeled for example "do not embed" or "download". In response a self-extracting archive may be created including the final customized application data structure but not files including an application runtime engine or operating system libraries. The application builder system may instead include a downloader of an application runtime engine, and operating system libraries. The downloader may include instructions to perform a control with the end user system to verify that an application compatible application runtime engine is not already present on the end user computer system before downloading and installing an application runtime engine. Additionally, the self-extracting archive may include instructions for the downloaded application runtime engine to execute the customized application data structure once the application runtime engine has been downloaded to the end-user simulation computing system. Referring to FIG. 54, an exemplary process implemented on an application builder computer system is illustrated for creating an archive including a customized application data structure, along with instructions for downloading an application runtime engine. The exemplary process includes creating the self-extracting archive 5401 including the finalized custom application data structure 5402 and a runtime downloader 5403 that upon receiving an indication of a user selection (e.g., double-click), the end-user application 5404 is extracted and the application runtime is downloaded 5405 or received from the Internet from remote storage or a server location. The end-user application 5404 is then executed by the downloaded application runtime engine.

In some aspects, an application builder system may additionally automatically create an instruction which is sent to an application runtime engine in association with a self-extracting archive to extract the archived file(s). In the situation where the application run time engine is included in the self-extracting archive, the instruction may be received by the application runtime engine when the application runtime engine has been installed. The instruction may include a command for the application runtime engine to execute the file including the customized application runtime data structure which is included in the self-extracting archive.

Referring back to FIG. 52, it is further contemplated that the settings window associated with the exemplary node labeled Executable may additionally include another GUI element represented by, for example, icon 5206. An application creator may select or otherwise interact with (e.g., clicking on it) icon 5206 which finalizes the steps for creating the stand-alone end-user application based on, among other things, the inputs/outputs received from the application creator. When an indication is received that the application creator selected said icon 5206, the files containing the customized application data structure may be packaged in a self-extracting archive in accordance with the choices made in the settings window, including, for example, the inclusion of a specific splash screen, operating system compatibility and whether or not an application runtime engine should be packaged with it in the self-extracting archive.

Figure 55:
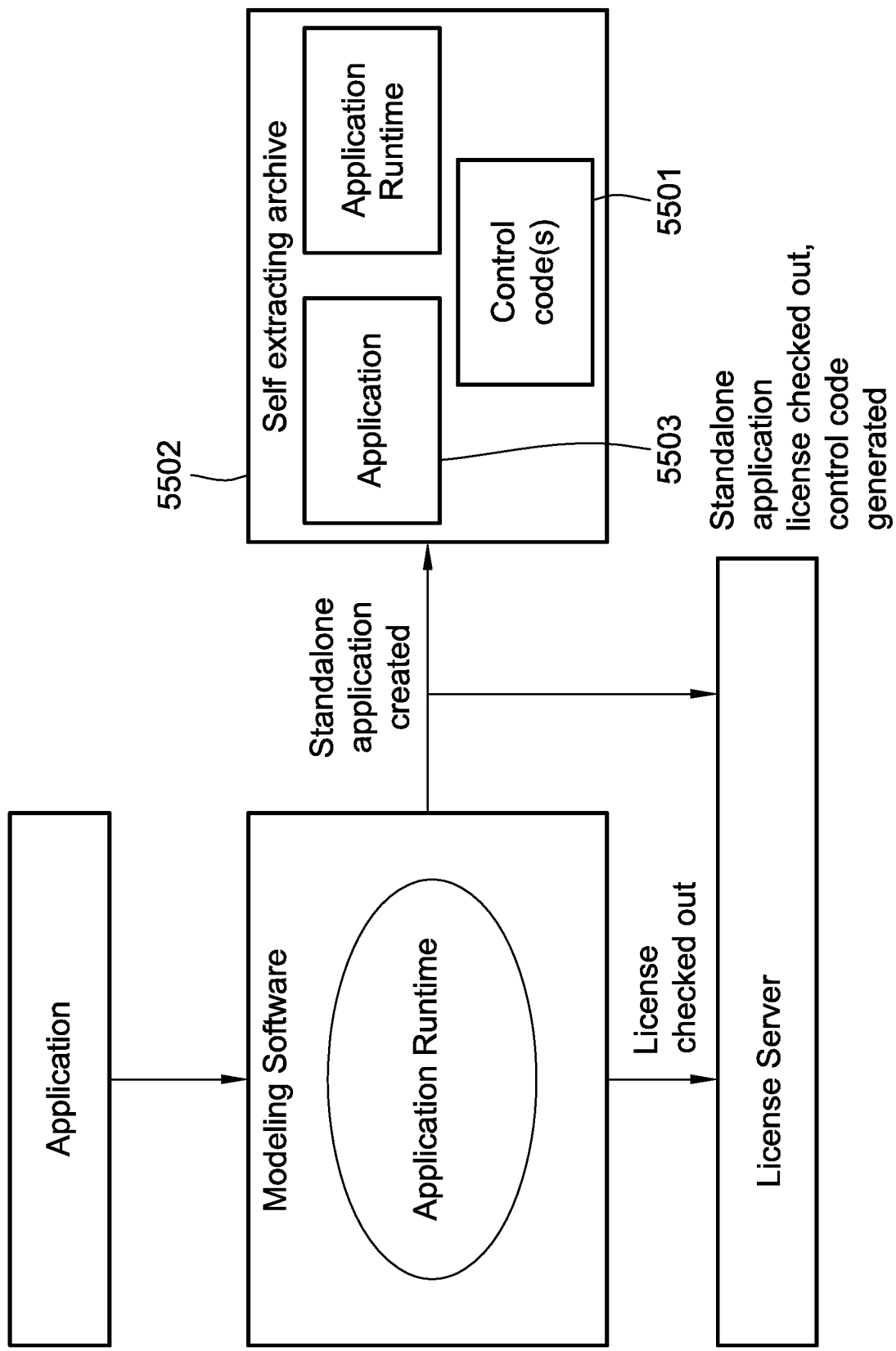
FIG. 55 illustrates an exemplary process implemented on a computer system for creating an archive including a customized application data structure, an application runtime engine, and one or more control codes, according to aspects of the present disclosure.

An application creator may instruct a modeling application builder system to create a standalone end-user application using the customized application data structures discussed herein. It is further contemplated that in some aspects, the application builder system may at any point in the end-user application creation process perform a control with a license server that the application builder system is licensed to create applications and to create applications including any license restricted features that the application creator may desire to include in the end-user application being created. In addition, the application builder system may perform a control with the license server that the application builder system is licensed to create standalone applications. It is further contemplated that an application builder system may limit operational aspects for creating standalone applications if the license control for standalone application creation is not passed. If all license controls are passed, then the modeling application builder system may, in response to an instruction from an application creator, create a standalone application and construct an archive, which may be self-extracting, the archive including at least a file containing the application data structure, and an application runtime engine or a software component for downloading an application runtime engine capable of executing the application data structure in the archive. In some aspects, one or more control codes as described elsewhere herein may be included in the archive. An exemplary aspect of the above described control process is also illustrated in FIG. 55. For illustrative purposes, the control codes 5501 are shown as a separate entity within the self-extracting archive 5502 though the control code may also be included in the application data structure 5503.

Exemplary aspects of a license manager and a control server for a modeling system that may in some aspects be applicable to the systems described in the present disclosure can be found, for example, in U.S. Pat. No. 9,372,673, issued Jun. 21, 2016, entitled, "Systems and Methods for Creating User Interfaces for Guiding the Creation of Modeling Applications for Forming and Solving Problems in a Multiphysics Modeling System", and U.S. patent application Ser. No. 15/282,469, filed Sep. 30, 2016, entitled, "Systems and Methods for Reducing Application Startup Times for Physics Modeling Applications", the disclosures of which are hereby incorporated by reference herein in their entireties.

In some aspects, it is contemplated that when a standalone application data structure is finalized and packaged as a standalone end-user application by an application builder, one or more control codes are created based on the output of a license control algorithm using as input one or more data associated with the application data structure. The one or more control codes that are generated are then saved with the standalone customized application data structure. The generation of said control code(s) may be performed automatically in response to a command to package the application data structure as a standalone end-user application.

For an application builder system to be allowed to create control codes can be dependent on the application builder system being licensed to create standalone end-user applications. Thus the generation of the one or more control codes may be related to the application builder system passing a license check that provides verification that the application builder system includes a valid license to create standalone end-user applications (e.g., at the build time of the standalone application). Whether an application runtime engine may run modeling and simulation using an application data structure packaged as a standalone end-user application may be dependent on the presence of such one or more control codes and verification of control code correspondence to application data.

Figure 56:
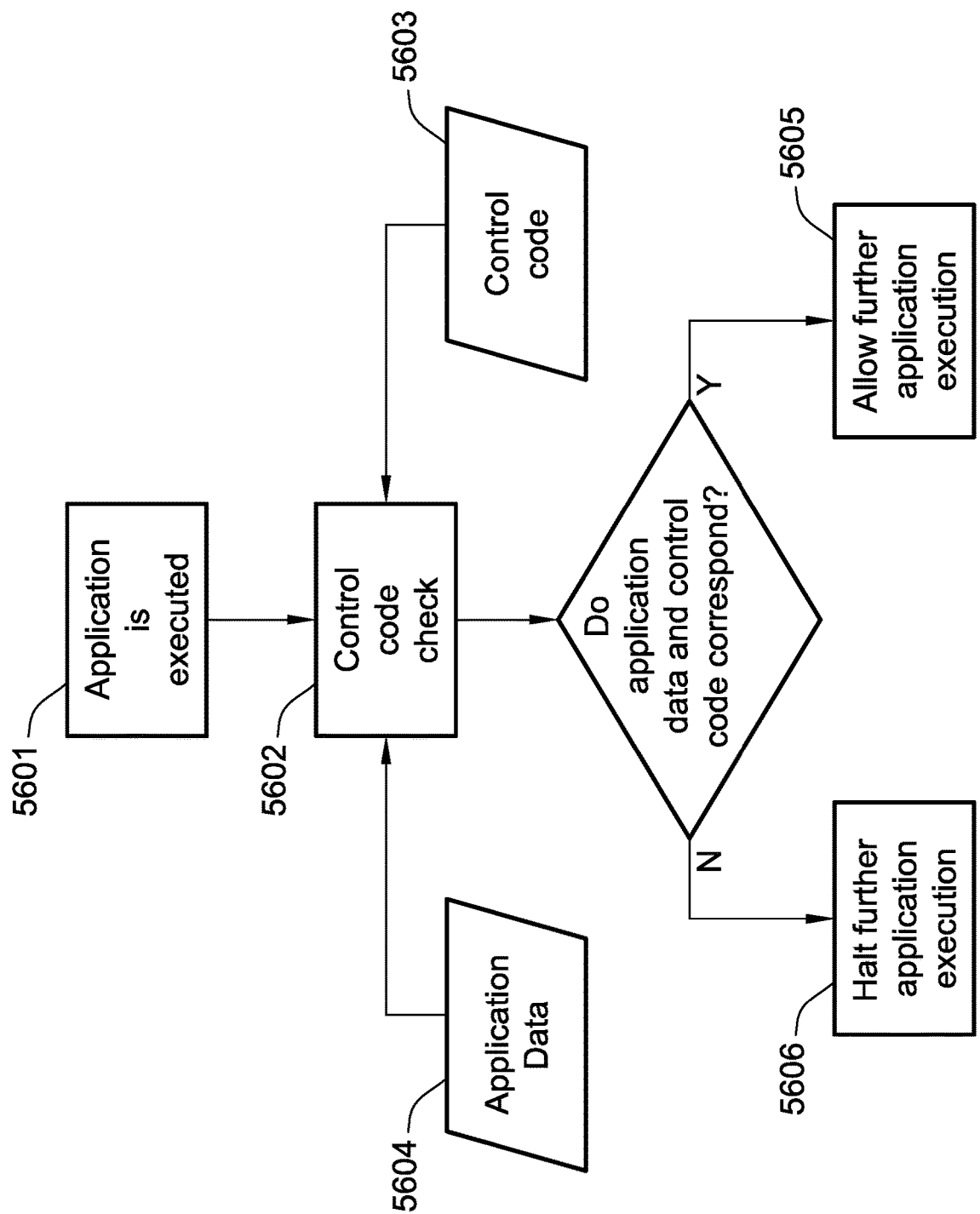
FIG. 56 illustrates an exemplary method implemented on a computer system for a license control system to verify control code(s) associated with the customized application data structure, according to aspects of the present disclosure.

Turning now to FIG. 56, an exemplary method implemented on a computer system is illustrated for a license control system to verify control code(s) associated with a customized application data structure. Beginning at step 5601, an application runtime engine executes at least parts of a customized application data structure created with the application builder system to include one or more controls codes. The execution in step 5601 may further include verifying one or more control codes associated with the customized application data structure. Next, at step 5602, a control code check is implemented to determine that the control code(s) 5603 correspond to the application data 5604 associated with the application data structure by applying the license control algorithm to at least parts of the application data structure prior to allowing changes to be made to any model data (e.g., as part of the normal use of the standalone end-user application). If the control code(s) 5603 correspond to the application data 5604, the method has verified that the standalone end-user application was originally created using an application builder licensed to create standalone applications where further execution of the standalone end-user application is allowed at step 5605. If the control code 5603 does not correspond to the application data 5604 in the application model data structure, then further execution of the standalone end-user application is halted at step 5606.

In some aspects, it is contemplated that license control algorithm input data may be stored in a non-transient memory. An application runtime engine may execute part of an application model data structure and subsequently use the stored license control algorithm input data at a later stage with the verification of application model data structure being performed, for instance in response to, but prior to performing a build (geometry) command, a solve command or a plot command.

It is further contemplated that in some aspects verification of correspondence between the control code(s) and the application data based on at least part of the application data structure may be performed in response to, but prior to, implementing a save of an application model data structure, and thus, creating a modified application data structure that includes control code(s) corresponding to the modified application data structure.

Figure 57:
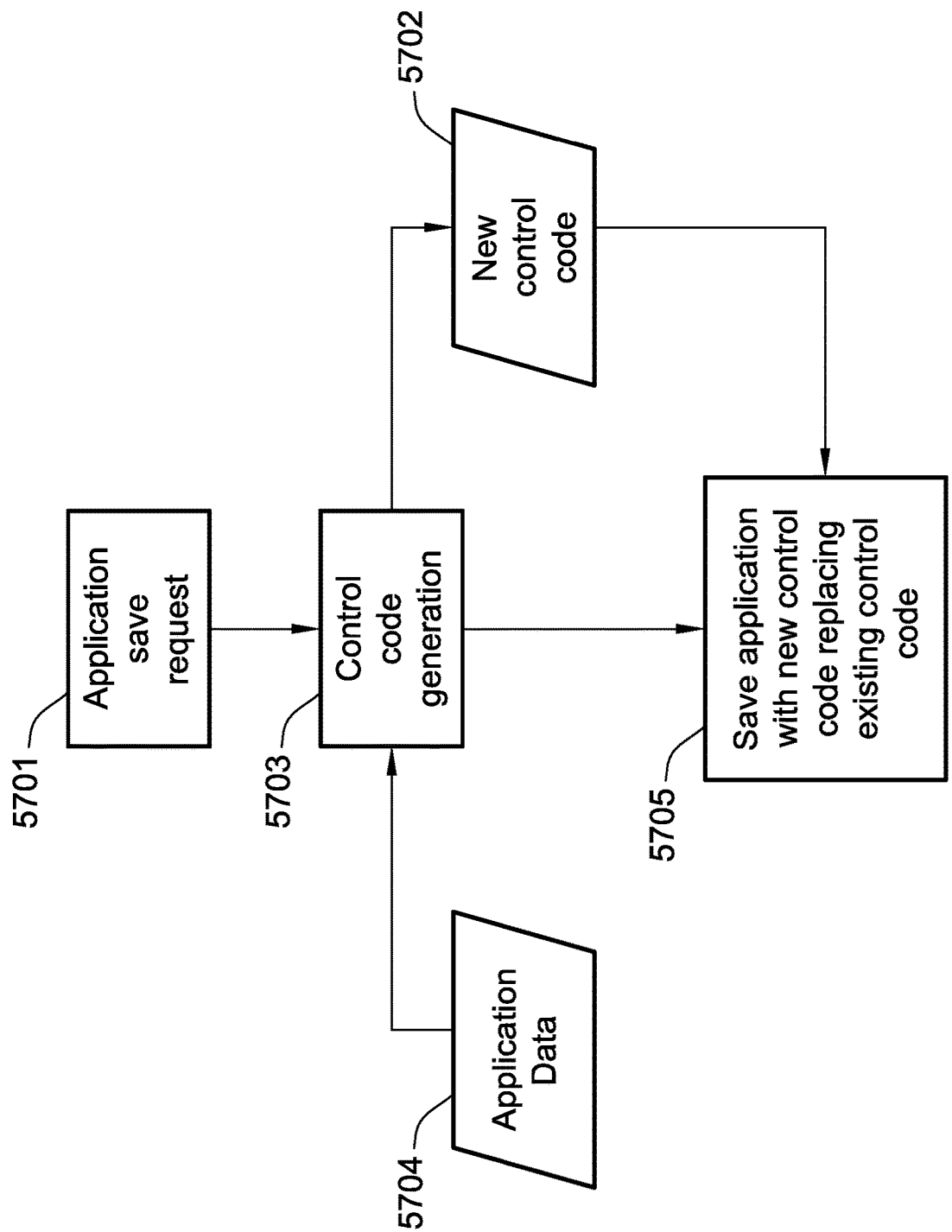
FIG. 57 illustrates an exemplary method implemented on a computer system for maintaining a license control mechanism of a saved application, according to aspects of the present disclosure.

Turning now to FIG. 57, an exemplary method implemented on a computer system is illustrated for maintaining a license control mechanism of a saved end-user application. The method is particularly advantageous because it allows for maintaining license control even if the application data structure being controlled has been modified due to saved changes of an application data structure as compared to said application data structure at build time of a standalone application. The license control method may be implemented using a computer system including an application builder. The computer system receives a request from a user to save a modified application model data structure at step 5701. If positive verification using the existing application control code has been received for a present run of the standalone end-user application, a new control code 5702 is generated at step 5703 by the application runtime engine using the license control algorithm mentioned previously in this disclosure and using at least parts of the modified application model data 5704 at save time as input for said license control algorithm to generate the new control code 5702. At step 5705, the new control code 5702 corresponding to the modified application data structure may replace said existing application control code that was previously saved with the application.

When an application model data structure is modified and saved, the application runtime engine may package the modified application model data structure as a self-extracting archive with the application model data structure including the modifications made by the end user. The modifications may be received by the pre-modified end-user application through, for example, the application graphical user interface(s), command line input(s), or interaction with another application through a web socket or a named pipe as described previously. Such operational flexibility is advantageous because a modeling application for a physical system can be developed over time and further allow an efficient way for several end users to introduce changes to the model. Furthermore, the flexibility for end users to save the end-user application as a self-extracting archive is advantageous, and so is the ability of an application runtime engine to generate a new control code based on a modified application data structure, as this maintains the ability to save applications with user modified model data while requiring that applications are originally created using a system that is licensed to create such applications.

An application data structure and an application runtime engine may be packaged together in an archive. The archive may optionally be self-extracting. The packaged application may be executed or launched in response to an end-user initiated instruction to run the standalone end-user application. An example of such a user instruction may include double clicking on an icon or other indicator displayed in a graphical user interface that is representative of the self-extracting archive. In response to the exemplary end-user initiated instruction of double clicking on the icon, the archive may optionally extract the included files and/or content in the archive to a temporary or permanent non-transient memory or storage on the end-users electronic computing device. Furthermore, in response to said end-user initiated instruction, a command may be issued to the application runtime engine to run the application data structure packed or previously packaged in the standalone end-user application. The command may be packaged with the application data structure, for example, in the form of one or more scripts that are executed by a compatible script interpreter, typically available with an operating system, such as Microsoft Windows 10, Microsoft Windows 7, Linux, macOS, OS X, or similar operating systems.

In some aspects, an application data structure and the application runtime engine may be distributed separately. The application data structure may optionally be packaged in a self-extracting archive. The application runtime engine may be distributed from the creator of the application data structure, from a third party, or it may already be present on an end-users computer or electronic device. The packaged application data structure may be run in response to a user-initiated instruction to run the standalone end-user application. An example of such a user-initiated instruction may include double clicking on an icon or similar indicator representative of the self-extracting archive. In response to the exemplary user-initiated instruction, the archive may optionally extract the included files and/or content in the archive to a temporary or permanent non-transient memory or storage on the end-users electronic computing device. Furthermore, in response to said user-initiated instruction, a command may be issued to the application runtime engine to run the application data structure. The command may be packaged with the application data structure, for example, in the form of one or more scripts. A general example of such a script may be "comsolruntime -run application", where comsolruntime is the name of the runtime engine, -run is the instruction to run the file which follows and application is the name of the application.

When an end-user application is constructed by an application creator using an application builder system, the application builder system may communicate with a license server to control whether the creator of the end-user application has the required licenses to include the application features added to the customized application data structure. If the creator has the required licenses, the application feature or the instructions that could be used to construct the application feature at runtime may be included in the customized application data structure. In some aspects the instruction used to construct the application feature may include instructions contained in an application runtime engine.

It is contemplated that an end-user should be able to use any application feature which the application creator has included in the end-user application and which the application creator was licensed to include. Along those lines, it would be desirable to limit or minimize the creation of end-user applications that can use unlicensed features. However, in some aspects, an application data structure code may be modified to include requests to an application runtime engine for application features for which the application creator does not have the required license, since it is possible that an application runtime engine includes computer code corresponding to a larger number of application features requiring a license than what at least some standalone application creators are licensed to include in the standalone applications they create. Moreover, in some aspects, a stand-alone application may not include a dedicated license server that is able to control what licenses were available to the creator of the end-user application. For this reason, methods for license verification not requiring a license server active at runtime when an end user uses a stand-alone application is advantageous.

In some aspects, computer code for some of the application features for the end-user application being created may be constructed at runtime from other code which may encompass source code or byte code or machine code, where the application feature code or other code may be a part of, or packaged with an application runtime engine. One or more application features may require that the creator of the standalone end-user application was in possession of one or more licenses for said application features when the stand-alone end-user application was created for the features to be executed by the application runtime engine at runtime or to be constructed from other code at runtime. When instructions in an application model data structure for executing such an application feature is executed, the application runtime engine may perform a license check before execution and/or construction of the application feature code at runtime. It is contemplated that the licenses referred to in this paragraph may refer to feature-specific licenses, which in some aspects may be different from a general license to create standalone end-user applications with an application builder system. In other aspects elsewhere in this disclosure, it is contemplated applications features that require the creator of a standalone end-user application to have been in possession of corresponding one or more feature specific licenses at the time the standalone end-user application was created may be referred to as license restricted features.

Figure 58:
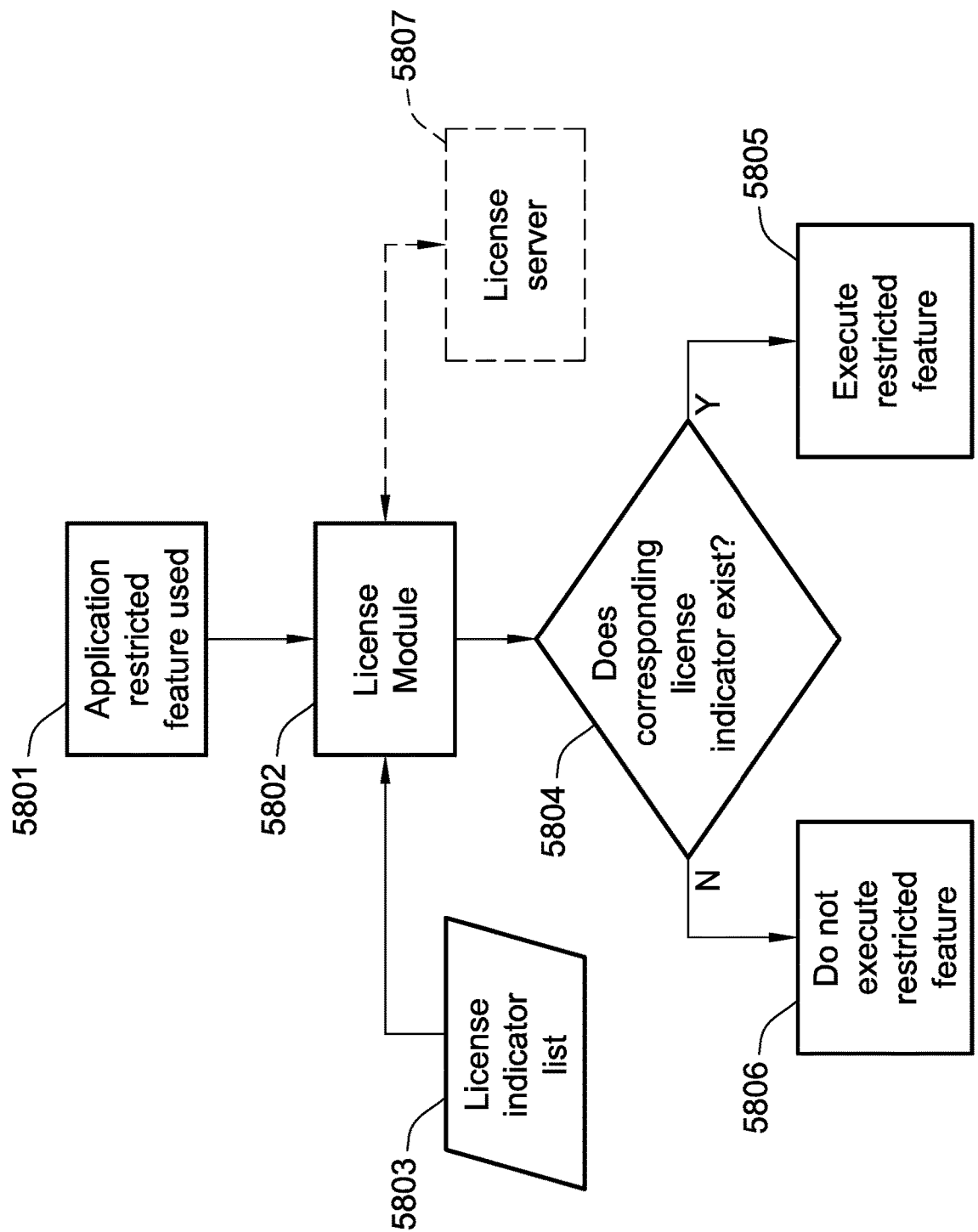
FIG. 58 illustrates an exemplary method implemented on a computer system for allowing runtime use of only select features licensed to an application creator, according to aspects of the present disclosure.

Turning now to FIG. 58, an exemplary method implemented on a computer system is illustrated for allowing runtime use of only select features licensed to an application creator. The method allows runtime use of only those restricted features licensed to an application creator. A list of indicators of license keys available to the application creator at the time the standalone application was created may be included in the application data structure. It is contemplated that the list of license specific indicators shows that such a license key was available to the application creator at the application build time but the list does not include actual license keys. At step 5801, a processor for a computing system executing the end-user application begins execution of a license restricted application feature. Next, at step 5802, the processor may perform a control of whether a corresponding license indicator exists or is needed, by using an application license-module. At step 5804, the license-module may perform a control of the list containing license type indicators 5803. If a license type indicator corresponding to the license type required by the license restricted feature is present in the list, at step 5805 the license-module returns data indicating that the feature code may be executed or alternatively allow the creation of license restricted application feature computer code from other code present in an application runtime engine. If a license type indicator corresponding to the license type required by the license restricted feature is not present in the list, at step 5806 the license-module will then return data indicating that the license restricted feature may not be executed or alternatively not allow the creation of feature restricted computer code from other code. In some aspects, if a license type indicator is not present in the list the license-module may additionally perform a control at step 5807 with an optional license server if a license corresponding to the license restricted feature is available. If such a license is available, said license or an instance of such a license may then optionally be checked out, the license-module may return data indicating that the license restricted feature code may be executed or alternatively allow the creation of license restricted feature computer code from other code. If a license is not available the license-module may then return data indicating that the feature may not be executed or alternatively not allow the creation of the application feature computer code from other code. If no license server exists, in some aspects an error code may be shown, and the license-module may then return data indicating that the feature may not be executed or alternatively not allow the creation of application feature computer code from other code. The use of a license module together with a license type indicator list together with an optional license server simplifies license handling for application features that the application creator may be licensed to include in standalone end-user applications. The addition of an optional license server allows use of additional license restricted functionality from, for instance, third parties.

Figure 59:
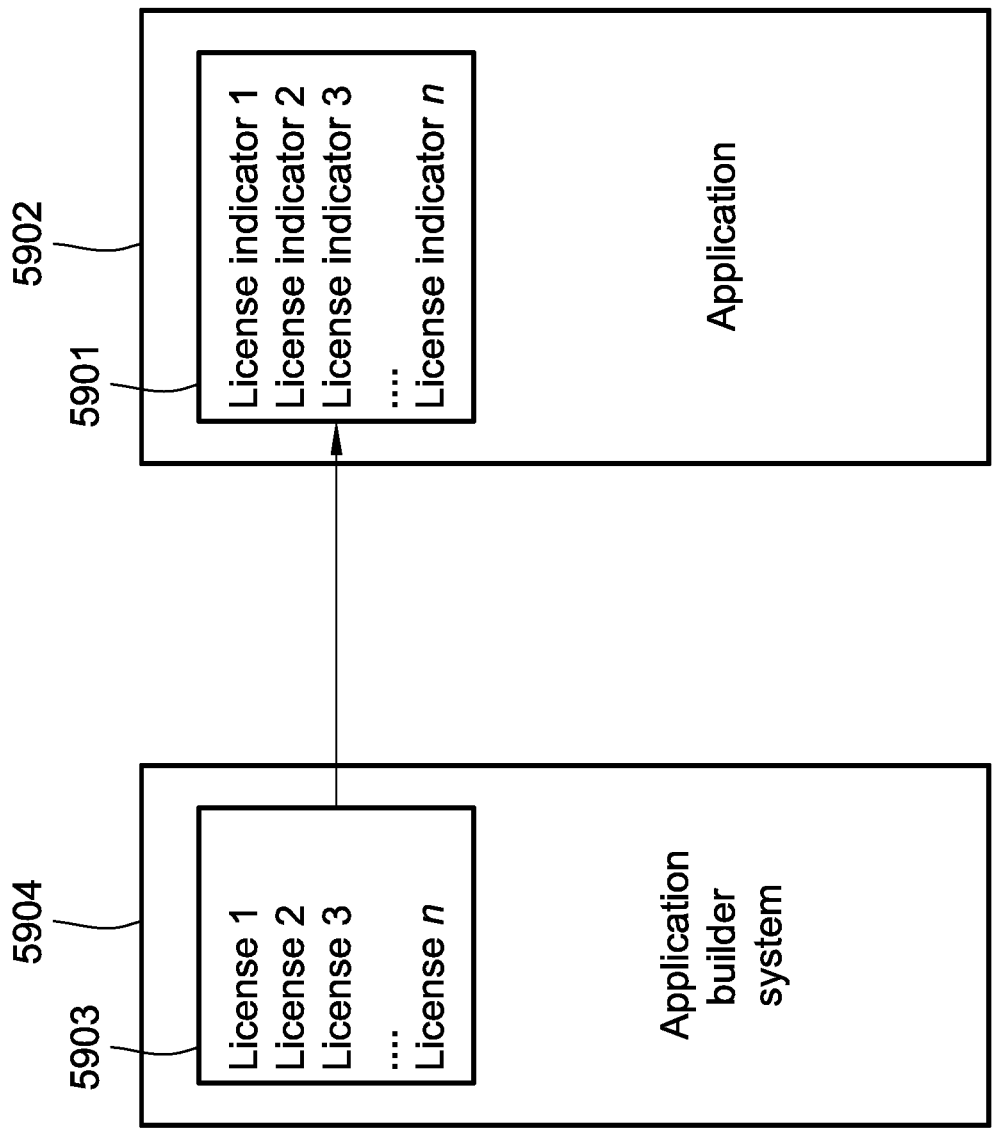
FIG. 59 illustrates an exemplary license indicator list being created and included in an end-user application based on licenses available to an application builder system, according to aspects of the present disclosure.

Referring now to FIG. 59, an illustration is provided of an exemplary license indicator list 5901 being created and included in an end-user application 5902 based on licenses 5903 available to an application builder system 5904. A list of indicators of license keys available to the application creator at the time a standalone end-user application was created may be included in the application data structure. Again, such a list does not include actual license keys, but rather a license type specific indicator that such a license key was available to the application creator.

An issue using a list of license type indicators for controlling whether execution is allowed for license restricted features is that someone with access to the list could easily add additional license type indicators, thereby allowing users of such a modified standalone end-user application to gain access to at least some license restricted features that they should not be permitted to use. This issue would be limited or minimized if the data for the restricted features were not available to the standalone end-user application. However, in some aspects, the application runtime engine may include data for restricted features that may be used by the application if it is allowed by the application license module. For example, an application creator may be licensed to create applications including license restricted features requiring a license L1 but does not have a license to create applications containing license restricted features requiring license L2. The application creator adds one or more features requiring a license L1 to an application being created. However, the application creator also adds code to the same application for requesting from a runtime engine features requiring a license L2. If the application creator then added an L2 license type indicator to the license type list, then the application creator would be able to create standalone end-user applications that at runtime are able to use features requiring a license L2, despite not being licensed to include such license restricted features that may be executed at runtime.

It would be advantageous to minimize execution of unlicensed license restricted features at runtime through the use of control codes. It is contemplated that this can be accomplished by basing, at least in part, one or more of the previously described control codes on license type data corresponding to license restricted features. Such a control code may be referred to as a restricted feature control code. Through the use of control codes, the accuracy of the license indicator list can be verified against the one or more control codes based at least in part on the what restricted features are licensed to the application creator.

Figure 60:
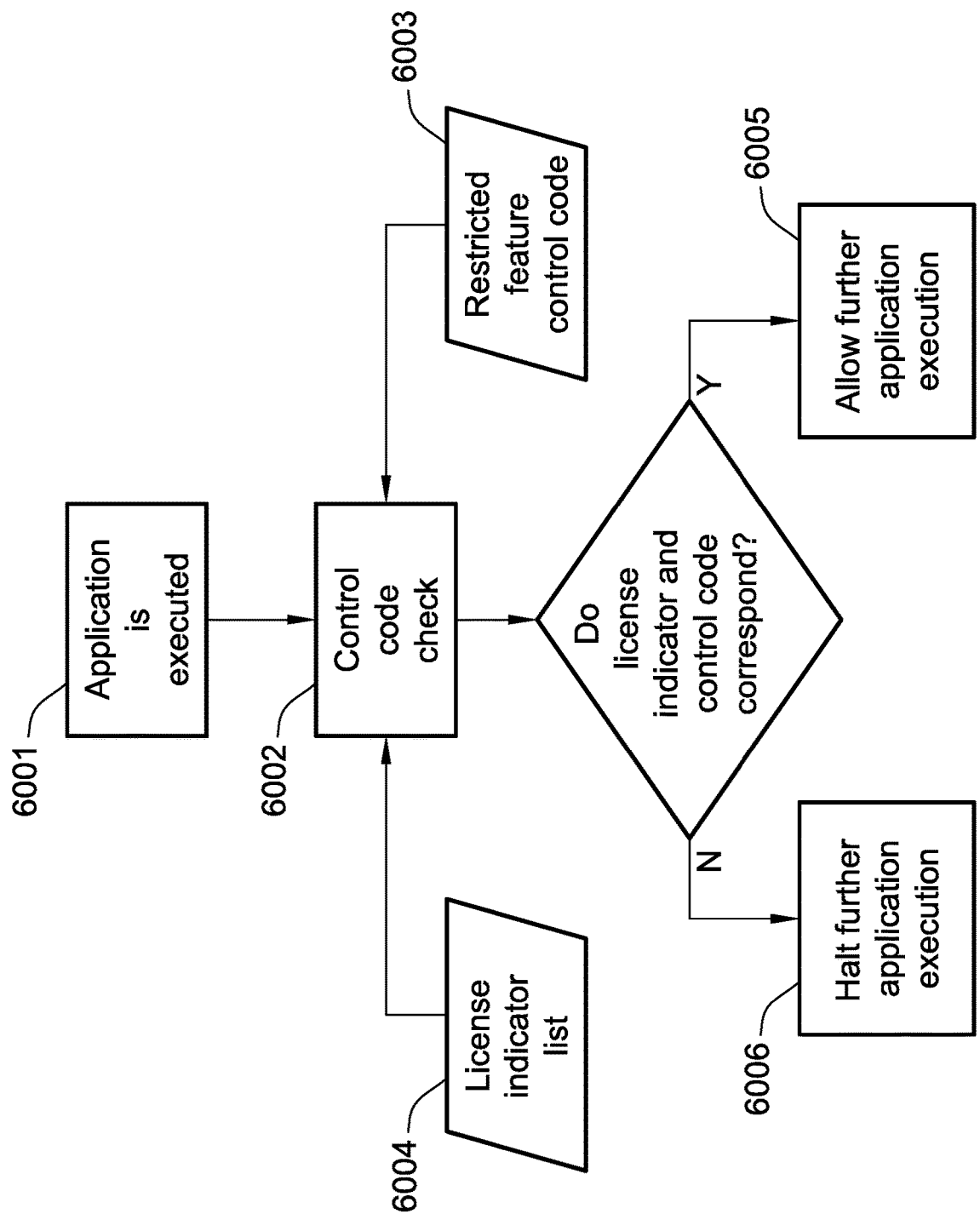
FIG. 60 illustrates an exemplary method of verifying the accuracy of a license indicator list, according to aspects of the present disclosure.

Turning now to FIG. 60, an exemplary method is illustrated for verifying the accuracy of a license indicator list. At step 6001, a standalone end-user application is executed that includes at least one control code based on license type data corresponding to license restricted features. At step 6002, a control is made checking if the restricted feature control code 6003 corresponds to the list of license type indictors 6004. If the result of the control is positive, at step 6005 the standalone end-user application gains access to the application feature from the runtime engine and/or the application feature is executed. If the result of the control is negative, at step 6006, the end-user application is halted from further execution and the application may not gain access to and/or execute the application feature.

In some aspects, the continued execution of the application may be disrupted or halted at step 6006 as the result of a negative control result 6006, but allowed at step 6005 as the result of a positive control result. A control of whether the license type indicator list corresponds to a restricted feature control code can be implemented at any time during execution of the standalone end-user application, and need not be limited to where it only occurs when a license restricted feature is used. In some aspects, the control that the restricted feature control code and the license indicator list correspond to one another occurs some-time after execution of an end-user application has commenced and the presence of a license type indicator list has been recognized. In some aspects, a control is performed the first time an application feature requiring a license is requested by the end-user application from the application runtime engine libraries, or the control could be performed during one or more modeling actions such as building geometries, solving the model, or plotting results.

It is contemplated that the license indicator list is created at build time of the application and the restricted feature control code is likewise created at build time of the application. The license indicator list may be a part of the application data structure. It is further contemplated that in some aspects the restricted feature control code does not have to rely on data that may be modified by an end user and thus is not replaced when a modified application model data structure is saved.

Each of the aspects described above and obvious variations thereof are contemplated as falling within the spirit and scope of the claimed invention, which is set forth in the following claims.

In the claims, any reference signs placed between parentheses shall not be constructed as limiting the claim. The word "comprising" does not exclude the presence of elements or steps other than those listed in a claim. The word "a" or "an" preceding an element does not exclude the presence of a plurality of such elements.

The mere fact that certain measures are recited in mutually different dependent claims does not indicate that a combination of these measures cannot be used to advantage.

What is claimed is:

1. A system adapted to generate a customized application data structure for modeling physical systems, the system comprising:
    one or more processors, one or more user input devices, optionally a display device, and one or more memory devices, wherein the one or more processors are adapted, during use, to
        embed a pre-determined or selected multiphysics model data structure in an application data structure, wherein the multiphysics model data structure comprises a representation of one or more models of physical systems, each model of a physical system representing physical phenomena and/or physical processes, wherein the multiphysics model data structure comprises data representing at least one modeling operation determining how to model or simulate the one or more models of physical systems,
        add geometry data, representing one or more geometry subroutines, to the embedded multiphysics model data structure, the added geometry data comprising parameter definitions for the one or more models of physical systems,
        add call data to the embedded multiphysics model data structure, the call data representing one or more geometry subroutine calls for implementing at least one of the one or more geometry subroutines, and
        add application data representing one or more application features to the application data structure, wherein each application feature comprises one or more of (i) first data representing at least one form feature, and/or (ii) second data representing at least one action feature,
        wherein a form feature comprises data specifying input data and/or output data and/or presentation format of input and/or output data, and wherein an action feature comprises data specifying a sequence of operations to be carried out, when executing the application data structure, and
        wherein at least one of the sequence of operations to be carried out comprises the at least one modeling operation, and wherein at least one of the sequence of operations to be carried out comprises an operation providing data for generating at least one geometry of at least a part of the one or more models of physical systems,
    wherein a customized application data structure is generated providing, when executed, a customized modeling of the physical systems using the at least one modeling operation, the at least one geometry of at least a part of the one or more models of physical systems, at least one of the one or more application features, and at least one of the one or more geometry subroutines, and
    wherein the generated customized application data structure is configured as an end-user application executable by an application runtime engine.

2. The system of claim 1, wherein the end-user application is configured as a standalone application including one or more control codes.

3. The system of claim 2, wherein during execution of the end-user application by the application runtime engine, determining if the one or more control codes correspond to the generated customized application data structure such that continued execution of the customized modeling is dependent on correspondence between the one or more control codes and the customized application data structure.

4. The system of claim 3, wherein the generated customized application data structure is configured as an end-user application executable by an application runtime engine, the end-user application including a control code, and
    wherein the application runtime engine is configured to replace the control code with a new control code subsequent to determining correspondence between the control code and the customized application data structure, the new control code being generated in response to an end-user input causing the end-user application to be saved, the new control code being based on the customized application model data structure at the time the end-user application is saved.

5. The system of claim 4, wherein the saved end-user application is configured by the application runtime engine as a self-extracting archive in response to the customized application data structure being modified to include data associated with one or more end-user inputs and/or in response to the end-user application receiving an end-user instruction to save the application.

6. The system of claim 1, wherein the end-user application includes one or more restricted modeling system features and a license indicator list corresponding to restricted modeling system feature licenses associated with an application creator.

7. The system of claim 6, wherein during execution of a restricted modeling system feature, determining if the restricted modeling system feature corresponds to one or more license indicators in the license indicator list such that execution of the restricted modeling system feature is dependent on correspondence with a license indicator in the license indicator list.

8. The system of claim 7, wherein during execution of the end-user application by the application runtime engine, determining if the license indicator list corresponds to a restricted modeling system feature control code.

9. The system of claim 1, wherein the generated customized application data structure is configured as a standalone application for distribution to end users in a self-extracting archive.

10. The system of claim 9, wherein the self-extracting archive extracts the customized application data structure in response to receiving a command originating from an end user to extract the self-extracting archive.

11. The system of claim 10, wherein the command is in the form an input associated a computer mouse or a touchscreen.

12. The system of claim 10, wherein the self-extracting archive further includes an instruction for a runtime engine to execute the customized application data structure, the instructions being sent to the runtime engine in association with extracting the customized application data structure, and
in response to the runtime engine receiving the instructions, the runtime engine executing the customized application data structure.

13. The system of claim 1, wherein the system includes a graphical user interface configured to receive inputs from an application creator to generate the customized application data structure such that the end-user application is executable on a specific operating system associated with a received input.

14. The system of claim 13, wherein the graphical user interface is configured to include operating system runtime libraries in the generated customized application data structure that are compatible with the customized application data structure.

15. The system of claim 1, wherein the system includes a graphical user interface configured to receive inputs from an application creator to generate the customized application data structure such that the end-user application allows a splash screen to be displayed in response to execution of the end-user application by an application runtime engine and/or in response to installation of the end-user application on an end-user computing device.

16. The system of claim 1, wherein in response to passing a license control verification, the system displays a graphical user interface configured to receive inputs from an application creator to generate the customized application data structure executable by an application runtime engine.

17. The system of claim 1, wherein the customized application data structure is configured as a standalone application in response to one or more inputs by an application creator received by a graphical user interface, the one of more input being associated with settings for generating the standalone application.

18. A system adapted to generate a customized application data structure for modeling physical systems, the system comprising:
one or more processors, one or more user input devices, optionally a display device, and one or more memory devices, wherein the one or more processors are adapted, during use, to
embed a pre-determined or selected multiphysics model data structure in an application data structure, wherein the multiphysics model data structure comprises a representation of one or more models of physical systems, each model of a physical system representing physical phenomena and/or physical processes, wherein the multiphysics model data structure comprises data representing at least one modeling operation determining how to model or simulate the one or more models of physical systems,
add application data representing one or more application features to the application data structure, wherein each application feature comprises one or more of (i) first data representing at least one form feature, and/or (ii) second data representing at least one action feature, and
add application data via one or more graphical user interfaces, the added application data allowing an end-user application executed on an application runtime engine to perform at least one of receiving standard input data, outputting standard output data, receiving application input data, generating a web socket, generating a named pipe, and/or generating a custom file scheme,
wherein a form feature comprises data specifying input data and/or output data and/or presentation format of input and/or output data, and wherein an action feature comprises data specifying a sequence of operations to be carried out, when executing the application data structure, and
wherein at least one of the sequence of operations to be carried out comprises the at least one modeling operation,
whereby a customized application data structure is generated providing, when executed, a customized modeling of the physical systems using the at least one modeling operation and at least one of the one or more application features.

19. The system of claim 18, wherein the one or more graphical user interfaces are configured to receive inputs from an application creator for defining one or more of a declaration, a name, a method, a class, a server name, a server port, a user name and/or a password, the received inputs associated with the one or more standard input data, standard output data, application input data, web socket, named pipe, and/or custom file scheme.

20. The system of claim 18, wherein the one or more graphical user interfaces are further configured to allow specifying that a method be made available for method calls sent to the method at runtime by an end user.

21. The system of claim 20, wherein the method calls include method input data.

* * * * *